(12) United States Patent
Morton

(10) Patent No.: US 8,521,486 B2
(45) Date of Patent: Aug. 27, 2013

(54) METHODS FOR SEARCHING FOR ARRANGEMENTS OF SHAPES SUBJECT TO BOUNDARY DISTANCE CONSTRAINTS AMONG THOSE SHAPES

(76) Inventor: Paul B. Morton, Leander, TX (US)

( * ) Notice: Subject to any disclaimer, the term of this patent is extended or adjusted under 35 U.S.C. 154(b) by 198 days.

(21) Appl. No.: 12/844,585

(22) Filed: Jul. 27, 2010

(65) Prior Publication Data

US 2011/0035194 A1  Feb. 10, 2011

Related U.S. Application Data

(60) Provisional application No. 61/231,825, filed on Aug. 6, 2009, provisional application No. 61/246,648, filed on Sep. 29, 2009, provisional application No. 61/248,234, filed on Oct. 2, 2009.

(51) Int. Cl.
  *G06F 17/10*  (2006.01)
(52) U.S. Cl.
  USPC ............................................................ 703/2
(58) Field of Classification Search
  USPC ............................................................ 703/2
  See application file for complete search history.

(56) References Cited

U.S. PATENT DOCUMENTS

| | | | |
|---|---|---|---|
| 6,671,867 B2 | 12/2003 | Alpert et al. | |
| 2003/0196183 A1 | 10/2003 | Alpert et al. | |
| 2011/0035196 A1 | 2/2011 | Morton | |

OTHER PUBLICATIONS

Leung, An Efficient Collision Detection Algorithm for Polytopes in Virtual Environment, M. Phil Thesis; The University of Hong Kong, 1996; pp. 1-87.*
Moustakas et al.; A Geometry Education Haptic VR Application Based on a New Virtual Hand Representation; IEEE Virtual Reality 2005; Mar. 12-16, Bonn, Germany; pp. 249-252.*
Eschenauer, H. A., et al., "Bubble Method for Topology and Shape Optimization of Structures", Structural and Multidisciplinary Optimization, vol. 8, No. 1, Aug. 1994 , pp. 42-51, abstract only.
Herrigel, A., et al., "An Analytic Optimization Technique for Placement of Macro-Cells", 26th ACM/IEEE Design Automation Conference, 1989 , pp. 376-381.
Mallet, Jean-Laurent, "Geomodeling", Available at: http://books.google.com/books?id=haihCir0vVcC& dq=boundary+distance+constraints&source=gbs_navlinks_s, title page only.
Mir, M., "Analytical Technique for Macrocell Placement Optimization with Multiple Constraints", IEEE International Conference on Electronics, Circuits and Systems, 2003, pp. 503-506.
Sharma, Abhinandan, et al., "Packing with Boundary Constraints for a Reconfigurable Operating System", Lecture Notes in Computer Science, vol. 2823, 2003 , pp. 236-245, abstract only.

* cited by examiner

*Primary Examiner* — Hugh Jones
(74) *Attorney, Agent, or Firm* — Matthew J. Booth & Associates, PLLC; Matthew J. Booth

(57) ABSTRACT

This disclosure describes methods for searching for arrangements of shapes subject to boundary distance constraints among those shapes. The first embodiment includes constructing 110 functions that are exact or approximate analytical representations of those constraints. Next is constructing 120 an analytical optimization problem which incorporates the constraint functions of 110. Further is selecting 130 the initial values of one or more optimization variables. And then solving 140 the optimization problem constructed in 120 using one or more analytical optimization methods and one or more of the initial values of 130. Further included is a sequencing structure 150.
The second embodiment includes constructing 210 functions that are exact or approximate analytical representations of those constraints. Next is constructing 215 one or more constraint functions. And next is constructing 220 an analytical optimization problem that incorporates the constraint functions of 210 and 215. Further is selecting 230 the initial values of one or more optimization variables. And then solving 240 the optimization problem constructed in 220 using one or more analytical optimization methods and one or more of the initial values of 230. Further included is a sequencing structure 250.

6 Claims, 15 Drawing Sheets

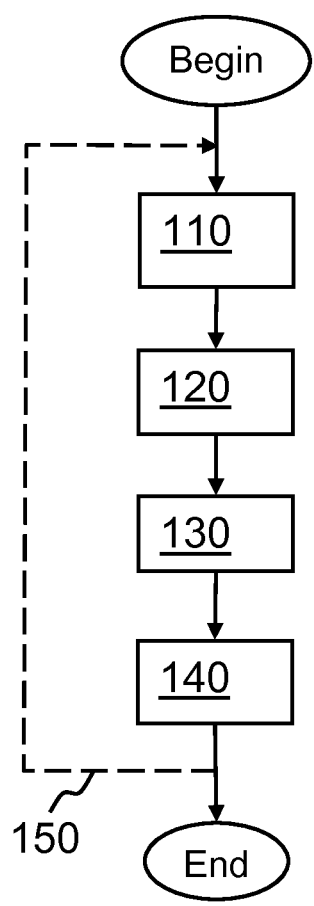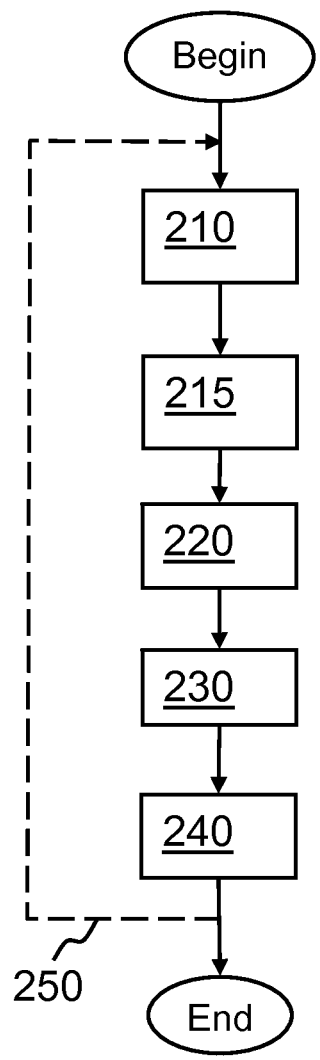
FIG. 13A
FIG. 13B

METHODS FOR SEARCHING FOR ARRANGEMENTS OF SHAPES SUBJECT TO BOUNDARY DISTANCE CONSTRAINTS AMONG THOSE SHAPES

CROSS REFERENCE TO RELATED APPLICATIONS

This application claims the benefits of the earlier filed U.S. Provisional Application Ser. No. 61/231,825, filed 6 Aug. 2009, which is incorporated by reference for all purposes into this specification.

Additionally, this application claims the benefits of the earlier filed U.S. Provisional Application Ser. No. 61/246,648, filed 29 Sep. 2009, which is incorporated by reference for all purposes into this specification.

Further, this application claims the benefits of the earlier filed U.S. Provisional Application Ser. No. 61/248,234, filed 2 Oct. 2009, which is incorporated by reference for all purposes into this specification.

TECHNICAL FIELD

This disclosure relates satisfying boundary distance constraints. More specifically, this disclosure relates to searching for arrangements of shapes that satisfy exact or approximate analytical function representations of boundary distance constraints using analytical optimization.

BACKGROUND ART

Searching for an arrangement of shapes that exactly or approximately satisfy one or more boundary distance (BD) constraints between those shapes make up a class of problems with many valuable commercial applications. For brevity we will refer to this as the boundary distance constrained arrangement (BDCA) problem. Instances of the BDCA problem include searching for arrangement of two or three dimensional components on or in a manufactured product such that no components overlap and all components are contained within the product's boundaries. Examples include, components inside the body of a car, components inside the case of a printer, rooms in a building, components on a circuit board or components on VLSI chip. Other instances include searching for an arrangement of one or more products or product components in or on a piece of material from which they are to be extracted such that there is sufficient space between them to allow for the kerf of the cutting tool while minimizing wasted material. Examples include the components of a pair of pants on a bolt of fabric or the components of a ship on a sheet of steel. Other instances outside of manufacturing and design include searching for an arrangement of packages inside a shipping container such that no packages occupy the same space and all packages fit inside the container. Some of these instances can further be extended into 4-dimensional problems where, for example, time constraints, or time dependant motion requirements are present.

In general, however, the BDCA problem is considered to be "computationally intractable". That is, it may require an unreasonable amount of computing resources for the search to either find an arrangement that satisfies the BD constraints, or determine that no arrangement can satisfy the BD constraints. As such, for various classes of this problem, a great deal of effort has gone into developing an arsenal of methods which consume reasonable amounts of computing resources to search for arrangements that satisfy the BD constraints but which may not be able to find an arrangement that satisfies the BD constraints even if such an arrangement exists. For example, over the past 25 years, the electronics and VLSI circuit design industry have expended considerable effort on research and development for search methods that work on a limited subset of the two-dimensional version of the BDCA problem. In particular, they have been interested in the case where the shapes consist of axis-aligned (AA) rectangles. This is due to the fact that integrated circuit design at many levels of the physical design hierarchy are composed of collections of AA rectangles which must maintain specific physical relationships between the boundaries of the rectangles in the collection. Examples in this area include: the arrangement of AA rectangular mask shapes in the design of basic electronic components such as, for example, transistors, capacitors, and resistors; the arrangement of AA rectangular electronic components in the design of higher function circuits such as, for example, AND gates, OR gates, and Flip Flops (sometimes referred to as library cell design); the arrangement of AA rectangular circuits and AA rectangular electronic components in the design of macro blocks such as, for example, adders, multipliers, phase locked loops, and analog to digital converters (sometimes referred to as macro cell design); the arrangement of AA rectangular macros and AA rectangular circuits on a semiconductor substrates to design integrated circuit "chips"; the arrangement of AA rectangular IC "chips" to design multichip modules; and the arrangement of AA rectangular IC packages to design circuit boards.

Some of the oldest methods for dealing with BDCA problems approximate them as discrete combinatorial problems and then solve the approximations using either stochastic search methods, or problem specific deterministic heuristic search methods. This approach tends to require complex data structures to represent the search space of the BDCA problem and can only search a subset of the total search space of the original problem. Additionally, these data structures have limited ability to represent spatial relationships among the shapes. Demand for better coverage of the design space as well as an increase in the complexity of the spatial relationships has produced a steady stream of ever more complex data structures and methods for coping with these demands.

Analytical optimization provides another powerful tool that can be used to deal with BDCA problems. In particular, analytical optimization has the potential to provide a more general and flexible framework which is capable of representing the entire search space without the need for complex data structures, as well as the potential to handle complex special relationship among shapes. To date, however, there has been little progress in developing effective methods which make good use of the potential power and flexibility of analytical optimization methods when dealing with BDCA problems.

There are three interrelated obstacles that have limited the effective use of analytical optimization on BDCA problems: first, the need for an analytic representation of a BD constraint, or its approximation, between a pair of shapes; second, the need for an analytical representation of a BD constraint, or its approximation, that promotes efficient operation of an analytical optimizer on a BDCA problem; and third, the need for a method which can both improve the probability of an analytical optimizer finding an arrangement that satisfies the BD constraints and, when the BDCA problem contains an objective to be optimized, improving the probability of finding a high quality solution.

DEFINITIONS

For the purposes of this disclosure we define the following terms:

Analytical function—A function that is treatable by or using the methods of algebra and calculus.

Analytical optimization—Optimization methods based on the use of algebra and calculus.

The following is an example of an analytical optimization problem: find the largest area enclosed by a rectangle whose height is greater than or equal to 1 but less than or equal to 5 and whose width is greater than or equal to 3 and less than or equal to 9. The following is an example of an optimization problem that is not analytical but is instead combinatorial: find the largest area enclosed by a rectangle whose height is in the set {1, 2, 3, 4, 5} and whose width is in the set {3, 5, 7, 9}.

Axis-aligned orthotopes—A set, O, of n-dimensional orthotopes is axis-aligned if each of the underlying Cartesian coordinate system axis is parallel to one of the faces of every orthotope in O.

Axis-aligned orthotopic boundary distance constraint—A boundary distance constraint applied between two n-dimensional shapes that produces a boundary surface of closest approach between those shapes that is an n-dimensional axis-aligned orthotope.

Boundary distance constraint—A constraint between two n-dimensional objects that limits the distance between the surfaces, or boundaries, of the two objects.

Closed shape—A shape for which all paths starting from a point on one side of its surface and ending on that same point on the other side of its surface must pierce the surface of the shape.

Convex constraint—A constraint on an optimization problem where the set of points satisfying the constraint form a convex set.

Convex set—A set of points where all the points on a line segment connecting any two points in the set are also in the set.

Convex shape—A shape for which the straight line segment connecting any two points on the surface of the shape must remain in the interior of the shape or on its surface.

Fixed-orientation shape—A shape which is not allowed to rotate.

Function—A function takes a set of one or more input values and produces an output value.

N-sphere—An n-dimensional generalization of a sphere where, for example, a circle is a 2-sphere and an ordinary, or 3-dimensional, sphere is a 3-sphere.

N-spheric boundary distance constraint—A boundary distance constraint which when applied between two n-dimensional shapes leads to a boundary surface of closest approach between those two shapes that is an n-sphere.

Normal vector—A vector, v, is normal to a surface, S, if it is perpendicular to all vectors lying in the plane tangent to the surface at the point of intersection between v and S.

Orthogonal—Intersecting or lying at right angles.

Orthotope—An n-dimensional, convex, faceted, closed shape where intersecting facets, or faces, are mutually orthogonal. In layman's terms an orthotope is an n-dimensional generalization of a rectangle.

Orthotopic boundary distance constraint—A boundary distance constraint which when applied between two n-dimensional shapes leads to a boundary surface of closest approach between those two shapes that is an n-dimensional orthotope.

Polytope—An n-dimensional, convex, faceted, closed shape. In layman's terms an polytope is an n-dimensional generalization of a polygon.

Subderivative—A generalization of the notion of a derivative for use on nonsmooth curves. For smooth curves there is a single tangent line associated with each point on the curve. The slope of this line is the derivative at that point on the curve. For non smooth curves there can be a set of tangent lines associated with each point on the curve. The slope of each line in the set is a subderivative.

Superellipsoid—The set of n-dimensional objects that can be analytically represented by an equation of the form:

$$\sum_{i=1}^{n} \left| 2\frac{x_i}{l_i} \right|^{z_i} = 1 \qquad (1)$$

Two-dimensional examples, illustrated in FIG. 1A through FIG. 1F, include circles, ellipses, squares, and rectangles, as well as "squares with rounded corners" and "rectangles with rounded corners". Three-dimensional examples include spheres, ellipsoids, as well as cubes and boxes, illustrated in FIG. 1G and FIG. 1H, as well as "cubes with rounded corners" and "boxes with rounded corners".

SUMMARY OF INVENTION

This disclosure describes methods for searching for arrangements of shapes subject to boundary distance constraints among those shapes. The first embodiment searches for arrangements of shapes with boundary distance constraints among those shapes. This embodiment includes constructing 110, for one or more boundary distance constraints, functions which are exact or approximate analytical representations of those constraints using zero or more gradient shaping transformations and one or more of the following: (1) one or more external boundary surface of closest approach where each external boundary surface of closest approach is formed from two shapes and, optionally, additional boundary distance constraints between the shapes and is determined using the addition of two or three functions where one of the three functions represents the first shape and another function represents the second shape and, optionally, a third function represents the additional boundary distance constraints between the shapes; (2) one or more analytical compositions; or (3) one or more superellipsoid shape function approximations for the interior or exterior boundary surface of closest approach between a pair of axis aligned orthotopes with axis-aligned orthotopic boundary distance constraints. In addition this embodiment includes constructing 120 an analytical optimization problem which incorporates the constraint functions of 110 and which is an exact or approximate representation of a boundary distance constrained arrangement problem. Additionally, this embodiment includes selecting 130 the initial values of one or more optimization variables. Further, this embodiment includes solving 140 the optimization problem constructed in 120 using one or more analytical optimization methods and one or more of the initial values of 130. Further, this embodiment includes a sequencing structure 150 that, when used, causes the enclosed elements to be executed two or more times where the multiple executions of the enclosed steps can be accomplished using enumerated sequences or iterative looping structures, or any combination of both where each execution of 110 through 140 may use any information generated in or used by previous executions of 110 through 140.

This disclosure also describes a second embodiment of a method to search for arrangements of shapes with boundary distance constraints among those shapes. This second embodiment includes constructing 210, for one or more boundary distance constraints, functions which are exact or approximate analytical representations of those constraints using zero or more gradient shaping transformations and one or more of the following: (1) one or more external boundary surface of closest approach where each external boundary surface of closest approach is formed from two shapes and, optionally, additional boundary distance constraints between the shapes and is determined using the addition of two or three functions where one of the three functions represents the first shape and another function represents the second shape and, optionally, a third function represents the additional boundary distance constraints between the shapes; (2) one or more analytical compositions; or (3) one or more superellipsoid shape function approximations for the interior or exterior boundary surface of closest approach between a pair of axis aligned orthotopes with axis-aligned orthotopic boundary distance constraints. Further, this embodiment includes constructing 215 one or more constraint functions which relate one or more boundary distance constraint parameters and/or optimization variables in terms of other parameters, optimization variables and/or constants. In addition this embodiment includes constructing 220 an analytical optimization problem which incorporates the constraint functions of 210 and 215 which is an exact or approximate representation of a boundary distance constrained arrangement problem. Additionally, this embodiment includes selecting 230 the initial values of one or more optimization variables. Further, this embodiment includes solving 240 the optimization problem constructed in 220 using one or more analytical optimization methods and one or more of the initial values of 230. Further, this embodiment includes a sequencing structure 250 that, when used, causes the enclosed elements to be executed two or more times where the multiple executions of the enclosed steps can be accomplished using enumerated sequences or iterative looping structures, or any combination of both where each execution of 210 through 240 may use any information generated in or used by previous executions of 210 through 240.

BRIEF DESCRIPTION OF DRAWINGS

To aid in the understanding this invention, the attached drawings help illustrate specific features of the invention and the following is a brief description of the attached drawings:

FIG. 13A-13B illustrate two embodiments of a method to search for arrangements of shapes with boundary distance constraints among those shapes.

DISCLOSURE OF EMBODIMENTS

Figure 1A:
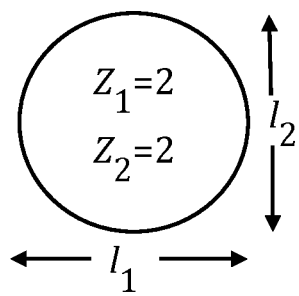
FIG. 1A-1H illustrate various two and three dimensional superellipsoids.
Figure 1E:
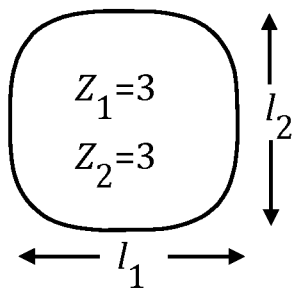
Figure 1B:
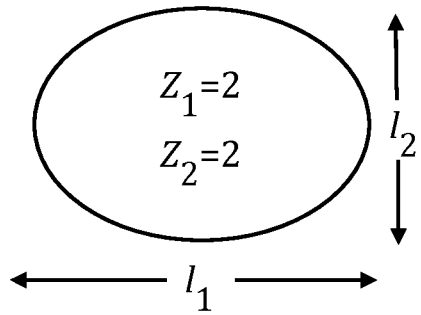
Figure 1F:
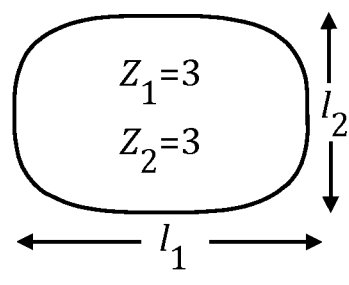
Figure 1C:
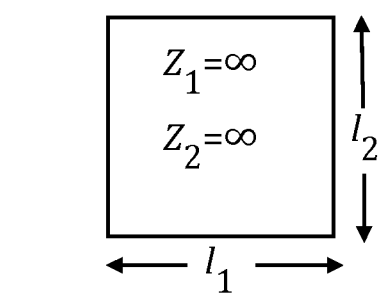
Figure 1G:
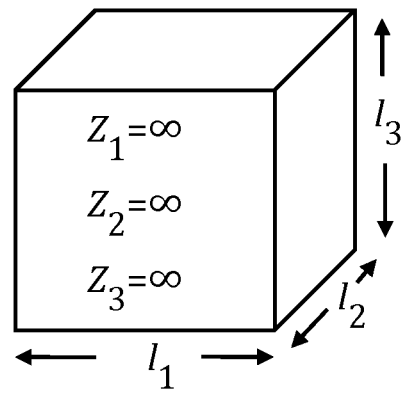
Figure 1D:
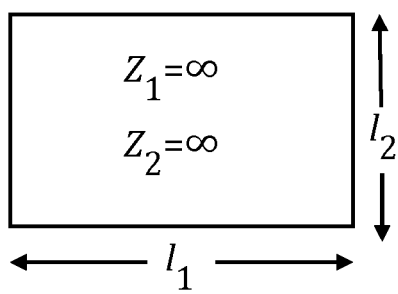
Figure 1H:
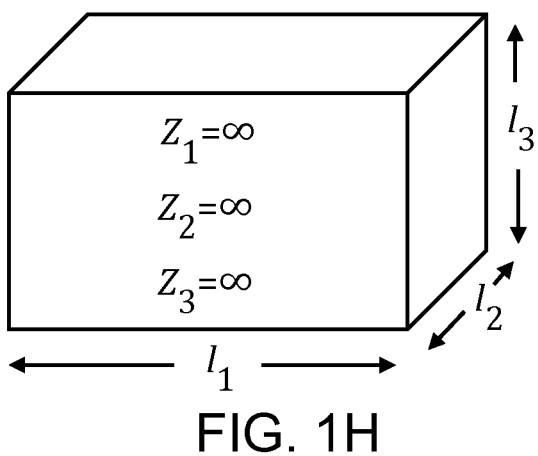

This disclosure describes methods for searching for arrangements of shapes subject to boundary distance constraints among those shapes. This disclosure describes numerous specific details in order to provide a thorough understanding of the present invention. One skilled in the art will appreciate that one may practice the present invention without these specific details. Additionally, this disclosure does not describe some well known items in detail in order not to obscure the present invention.

Theoretical Motivation

As previously discussed, there are three interrelated obstacles that have limited the effective use of analytical optimization on BDCA problems. To overcome the first obstacle we will develop methods to generate analytic representation of a BD constraint, or their approximations, between a pair of shapes. These methods will be based on the use of the boundary surface of closest approach (BSCA) between the pair of shapes and, when necessary, the use of analytical composition techniques. To overcome the second obstacle, we will develop gradient shaping methods which can, when necessary, be applied to these analytical representations of the BD constraints, or their approximations, which will convert them into a form that will promote efficient operation of an analytical optimizer on a BDCA problem. Finally, to overcome the third obstacle, we will develop iterative methods that can both improve the probability of an analytical optimizer finding an arrangement that satisfies the BD constraints and, when the BDCA problem contains an objective to be optimized, improve the probability of finding a high quality solution.

For the remainder of this disclosure when a specific coordinate system is required to illustrate a concept we will assume, for the sake of brevity and clarity and without loss of generality, that the Cartesian coordinate system will be used unless stated otherwise. One skilled in the art will immediately see that the concepts could be demonstrated using alternate coordinate systems. Further, for the sake of clarity and brevity, this disclosure makes use of indexed notation in the representation of sums, unions, intersections, list, sets, etc. It will be assumed that the indexed entities, such as lists or sets, will contain no elements when the upper bound for an index is less than the lower bound for the index. For example, $\{x_1, x_2, \ldots x_n\} = \emptyset$ when $n<1$ and where $\emptyset$ represents the empty set. Similarly an indexed mathematical operation will contain no terms when the upper bound for an index is less than the lower bound for the index. For example, $\Sigma_{i=1}^n x_i = x_1 + x_2 + \ldots x_n = 0$ when $n<1$. Finally, for the sake of brevity and clarity, this disclosure will make extensive use of vector notation to represent n-dimensional quantities such as, for example, n-dimensional Cartesian coordinates. These n-dimensional quantities will be represented as column vectors or, equivalently, transposed row vectors. As an example, the 3-dimensional Cartesian coordinate where x=1, y=2, and z=3 would be represented as either the column vector $$\vec{x} = \begin{bmatrix} 1 \\ 2 \\ 3 \end{bmatrix}$$

or the transposed row vector $\vec{x} = [1, 2, 3]^T$.

Analytic Representation of BD Constraints

There are two types of BSCA that exist between a pair of shapes, the exterior boundary surface of closest approach (EBSCA) and the interior boundary surface of closest approach (IBSCA). We can further divide these two types into unconstrained BSCAs, UEBSCA and UIBSCA, and constrained BSCAs, CEBSCA and CIBSCA. Roughly speaking, the UEBSCA, UIBSCA, CEBSCA, and CIBSCA between two shapes, $S_1$ and $S_2$, can be thought of as follows: the UEBSCA is the shape whose surface is traced out by the origin of $S_1$ as its exterior surface is "slid" along the exterior surface of $S_2$; the UIBSCA is the shape whose surface is traced out by the origin of $S_1$ as its exterior surface is "slid" along the interior surface of $S_2$; the CEBSCA is the shape whose surface is traced out by the origin of $S_1$ as its exterior surface is "slid" along the exterior surface of a shape whose exterior surface is derived from the exterior surface of $S_2$ and any additional boundary distance constraints between $S_1$ and $S_2$, and the CIBSCA is the shape whose surface is traced out by the origin of $S_1$ as its exterior surface is "slid" along the interior surface of a shape whose interior surface is derived from the interior surface of $S_2$ and any additional boundary distance constraints between $S_1$ and $S_2$. As will become clear shortly, one way to determine the CEBSCA, UIBSCA or CIBSCA between two shapes is to transform these problems into one or more UEBSCA problems. As a consequence we will first concentrate on developing methods for determining UEBSCA.

Shapes

Before we can determine a BSCA between two shapes, we first need to define what we mean by a shape. We also need to determine how to represent a shape, and how we can combine two or more of these shapes to form a new shape.

Definition 1:

An n-dimensional shape, S, consists of an equivalence relation and a point. The point is referred to as the origin of S, or Origin(S), and defines the position of S in the n-dimensional space. Based on the geometry of S and Origin(S) the equivalence relation subdivides the n-dimensional space into three disjoint sets referred to as the interior, exterior, and boundary sets. The exterior set, Exterior(S), consists of all points that are exterior to the shape. Those points not in Exterior(S), $\overline{\text{Exterior}(S)}$, are further subdivided into the boundary set, Boundary(S), and interior set, Interior(S). Boundary(S) contains all points in $\overline{\text{Exterior}(S)}$ that are immediately adjacent to a point in Exterior(S) and Interior(S) contains all points in $\overline{\text{Exterior}(S)}$ that are not in Boundary(S).

For brevity and convenience we will refer to the equivalence relation imposed by a shape S as Subdivision(S) and define it as the set containing the sets Interior(S), Exterior(S), and Boundary(S), or more precisely:

$$\text{Subdivision}(S) = \{\text{Interior}(S), \text{Exterior}(S), \text{Boundary}(S)\} \quad (2)$$

As will become apparent shortly, a useful subset of shapes is the set of convex shapes.

Definition 2:

A convex shape S is a shape where all points on a line segment joining any pair of points in Boundary(S) must be in Boundary(S)∪Interior(S).

Based on Definition 1 we can define the union and intersection operations on shapes.

Definition 3:

The union between shapes A and B, A∪B, produces a new shape, C. The origin of C is selected to be any finite point, possibly, but not necessarily, related to the origins of A and B. The Subdivision(C) is selected such that Interior(C)=Interior(A)∪Interior(B)

Exterior(C)=Exterior(A)∩Exterior(B)

Boundary(C)=(Boundary(A)∩$\overline{\text{Interior}(B)}$)∪(Boundary(B)∩$\overline{\text{Interior}(A)}$)  (3)

Definition 4:

The intersection between two shapes A and B, A∩B, produces a new shape, C. The origin of C is selected to be any finite point, possibly, but not necessarily, related to the origins of A and B. The Subdivision(C) is selected such that Interior(C)=Interior(A)∩Interior(B)

Exterior(C)=Exterior(A)∪Exterior(B)

Boundary(C)=(Boundary(A)∩$\overline{\text{Exterior}(B)}$)∪(Boundary(B)∩Exterior(A))  (4)

Based on Definitions 1 through 4, a large class of shapes can be defined as a union of convex shapes. We will refer to this as the class of all shapes of engineering interest, or for brevity, all shapes. Further, the intersection of any number of convex shapes is itself a convex shape. This implies that all shapes, S, can be represented as $$S = \cup_{i=1,n} (\cap_{j=1,m_n} S_{i,j}) \quad (5)$$

where $S_{i,j}$ are convex shapes. As such, any convex shape can be represented as the intersection of a possibly infinite number of "planar half spaces".

Definition 5:

In general, a planar half space (PHS) associated with a shape S is a shape H where Origin(H)=Origin(S) and the Subdivision(H) is selected such that: Boundary(H) consists of all points on a plane dividing the space in half, where this plane is tangent to the surface of S at a point $\vec{p}$ in Boundary(S); Interior(H) consists of the half space on the side of Boundary(H) that contains those points in Interior(S) that are immediately adjacent to $\vec{p}$; Exterior(H) consists of the half space on the side of Boundary(H) that contains those points in Exterior(S) that are immediately adjacent to $\vec{p}$. More specifically, a planar half space (PHS) associated with a convex shape S is a shape H where Origin(H)=Origin(S) and the Subdivision(H) is selected such that: Boundary(H) consists of all points on a plane dividing the space in half, where this plane is tangent to Boundary(S); Interior(S) ⊂ Interior(H) and Interior(H) also contains all points on the boundary of S except for the tangent points.

Shape Spectrums

We can represent a convex shape in terms of a set of PHSs. This set of PHSs can be represented using the origin of the shape along with the shape's shape spectrum.

Definition 6:

The tangent planar half space spectrum, or for brevity, shape spectrum, of a shape is a function which represents some or all of the form of the shape relative to its origin. A shape spectrum is a function that relates a direction to a distance. The direction represents the direction of a vector passing through the origin of the shape. The magnitude of the distance returned by a shape function for a given direction is the magnitude of the distance, measured along the vector, between the origin and the boundary plane of a PHS, H, to which the vector is normal. The sign of the distance returned by a shape function for a given direction is negative when the origin of the shape is contained in Exterior(H) and positive when the origin of the shape is contained in Interior(H). We will refer to the distance returned by a shape function for a given direction as the normal distance for that direction.

To determine a shape spectrum from its underlying shape we define the transformation $$\mathcal{T}(S) \to s(\vec{\theta}) \quad (6)$$

which takes a shape S, in the shape domain, and transforms it to a shape spectrum, $s(\vec{\theta})$, in the tangent PHS domain where $\vec{\theta} = [\theta_1, \ldots \theta_{n-1}]^T$ defines the direction of a vector through the origin of the n-dimensional shape S. For the sake of clarity and brevity and without loss of generality we will assume that $\vec{\theta}$ is defined in terms of hyperspherical coordinates and all angles are measured in degrees. Note that when n=2, $\vec{\theta}$ reduces to a scalar, $\theta$, whose value is $\theta_1$, the value of the single element of $\vec{\theta} = [\theta_1]^T$.

Figure 2:
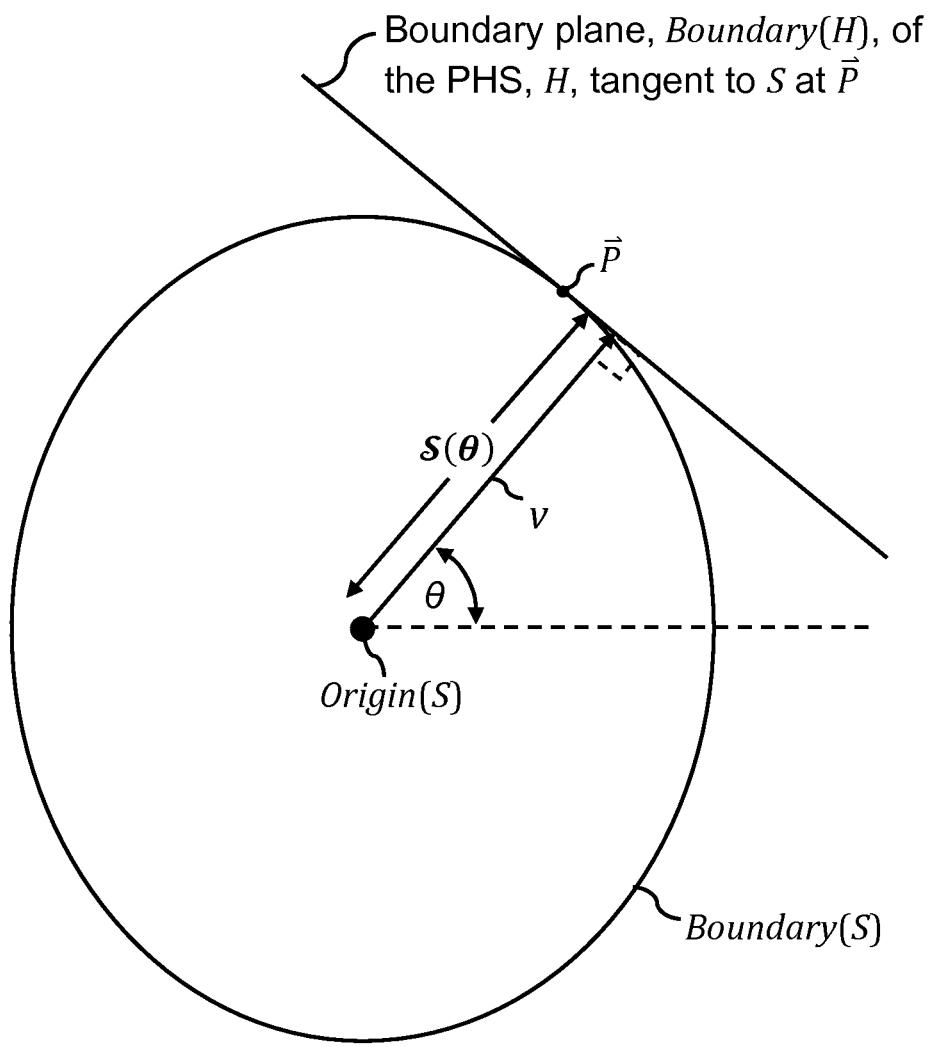
FIG. 2 illustrates the basic concepts of a shape spectrum on a two-dimensional shape.

To illustrate the basic concepts consider the two-dimensional example in FIG. 2 where we show the boundary of a convex shape S with a vector v passing through Origin(S) pointing in direction θ. Vector v is normal to the boundary plane, Boundary(H), of the PHS, H, that is tangent to Boundary(S) at point $\vec{P}$. The normal distance between Origin(S) and the boundary plane B along v is $s(\theta)$ where $s(\theta)$ is always positive since Origin(S)∈Interior(H) for all values of θ.

As a simple example of a shape spectrum for a two-dimensional shape, consider a circle of radius one with its origin at the center of the circle. This shape would have the following shape spectrum: $s(\theta)=1$. As a simple three-dimensional example, consider the shape defined by a sphere of radius one with it origin at the center of the sphere. This shape would have the following shape spectrum:

$$s\left(\begin{bmatrix} \theta_1 \\ \theta_2 \end{bmatrix}\right) = 1.$$

In these examples, for ease of understanding, we assumed that the origin of the shapes were in the shapes interior set, specifically, in the center of the set. This is not required. In fact, the origin may be anywhere. As a consequence, if the origin is in the exterior set of the shape, one or more of the values of its shape spectrum will be negative.

We define the inverse transformation $$\mathcal{T}^{-1}(\mathcal{T}(S(\vec{\theta})), \text{Origin}(S)) \to S \quad (7)$$

where $\mathcal{T}^{-1}$ is a transformation that takes a shape spectrum $s(\vec{\theta})$, in the tangent PHS domain, and a point of origin and transforms them into a shape S, in the shape domain when $s(\vec{\theta})$ represents a convex shape.

Additionally we define the following parameterized version of the transformation whose use will become clear shortly:

$$\mathcal{T}(S, \alpha) \to s(\vec{\theta} + \vec{\alpha}) \quad (8)$$

For shapes of finite volume, the distance between the origin of the shape and every tangent PHS must be finite. Conversely, for shapes with infinite volume the distance between the origin and a PHS tangent to the infinite portion of the boundary is infinite. Further, every point on a smooth section of the boundary of the shape is associated with exactly one tangent PHS and we assume that the infinite portion of a shapes boundary is smooth. Conversely, non-smooth shapes have points on the finite boundary which are associated with multiple tangent PHSs, specifically, the "focal" points of a "corner" in the finite boundary.

We now define the notions of dominant and non-dominant PHSs, infinite and finite dominant PHSs, as well as various characterizations of shape spectrums.

Definition 7:

For a convex shape, a dominant PHS is a PHS that is tangent to the boundary of the shape and is necessary in order to define at least one point on the boundary of the shape. Conversely, a non-dominant PHS is any tangent PHS that is not necessary to define any point on the boundary of the shape. Further, dominant PHSs can be classified as finite or infinite. A finite dominant PHS is a PHS that is a finite distance from the origin of the shape. Conversely an infinite dominant PHS is a PHS that is an infinite distance from the origin of the shape.

Definition 8:

For a convex shape with a finite number dimensions, a shape spectrum can be characterized as continuous, discrete or mixed. If a shape spectrum has only dominant PHSs then the spectrum can be characterized as continuous. If the shape spectrum consists of a finite number of finite dominant PHSs then the spectrum can be characterized as discrete. Finally, if the shape spectrum has an infinite number of finite dominant PHSs as well as one or more non-dominate PHSs, then the spectrum can be characterized as mixed.

Definitions 7 and 8 give us a compact approach for representing a convex shape when the shape's finite boundary is composed of a finite number of facets. In particular, since there are a finite number of facets on a convex polytope and each of the facets of a convex polytope corresponds to a dominant PHS, convex polytopes have discrete spectrums. Since the infinite PHSs, if any, and the distance to the non-dominant PHSs can be determined from the finite dominant PHSs we need only keep track of the position of the finite dominant PHSs. These finite dominant PHSs make up the discrete representation of its shape spectrum. For brevity we will refer to this discrete representation as a DR shape spectrum.

As a two-dimensional example, consider a fixed-orientation Cartesian coordinate system axis-aligned square of height one and width one with its origin at the center of the square. A DR shape spectrum would be:

$$\mathcal{S}(\theta) = \begin{cases} 0.5 & \theta = 0° \\ 0.5 & \theta = 90° \\ 0.5 & \theta = 180° \\ 0.5 & \theta = 270° \end{cases} \quad (9)$$

As a three-dimensional example, consider a fixed-orientation Cartesian coordinate system axis-aligned cube with width, height and depth equal to one and an origin located at its center. A DR shape spectrum would be:

$$\mathcal{S}(\vec{\theta}) = \begin{cases} 0.5 & \theta_1 = 0°, \theta_2 = 0° \\ 0.5 & \theta_1 = 90°, \theta_2 = 0° \\ 0.5 & \theta_1 = 180°, \theta_2 = 0° \\ 0.5 & \theta_1 = 270°, \theta_2 = 0° \\ 0.5 & \theta_1 = 0°, \theta_2 = 90° \\ 0.5 & \theta_1 = 0°, \theta_2 = 270° \end{cases} \quad (10)$$

Assuming a spherical coordinate system in which $\theta_1$ represents the angle of rotation about the Z axis measured from the positive X axis, and $\theta_2$ represents the angle of inclination measured from the XY plane.

Since, in a hyperspherical coordinate system, each direction can be represented by an infinite number of values for the vector of angles, $\vec{\theta}$, it will be assumed, for ease of understanding and without loss of generality, that all angles will be represented in their canonical form and all mathematical operations on these angles that produce an angle vector will produce them in canonical form. In the two dimensional case this would mean, for example, that all angles, θ, are restricted to the range 0°≦θ<360°, and that, for example, 310°+180° would result in a value of 130° instead of 490°.

Boundary Surface Shapes

We will now look at how to determine the UEBSCA between two fixed orientation convex shapes. To do this we first need to clearly define the UEBSCA between two fixed orientation shapes.

Definition 9:

The unconstrained exterior boundary surface of closest approach (UEBSCA) between two fixed orientation shapes A and B, A⊙B, is a new shape, C, where Origin(C)=Origin(A) and Subdivision(C) is selected such that:

Interior(C) contains all points defined by the location of Origin(B) for all positionings of B, while maintaining the position of A and the orientations of both A and B, such that Interior(A)∩Interior(B)≠∅, where ∅ represents the empty set. That is, the set of locations of the origin of B as B is moved around in a fixed orientation such that the interiors of A and B overlap.

Exterior(C) contains all points defined by the location of Origin(B) for all positionings of B, while maintaining the position of A and the orientations of both A and B, such that Boundary(A)∩Boundary(B)=∅ and Interior(A)∩Interior(B)=∅. That is, the set of locations of the origin of B as B is moved around in a fixed orientation such that A and B do not "touch" and their interiors do not overlap.

Boundary(C) contains all points defined by the location of Origin(B) for all positionings of B, while maintaining the position of A and the orientations of both A and B, such that Boundary(A)∩Boundary(B)≠∅ and Interior(A)∩Interior(B)=∅. That is, the set of locations of the origin of B as B is moved around in a fixed orientation such that A and B "touch" and their interiors do not overlap.

From Definition 9 it can also be observed that the UEBSCA operation is not commutative, that is, in general $$A \odot B \neq B \odot A \quad (11)$$

Figure 3:
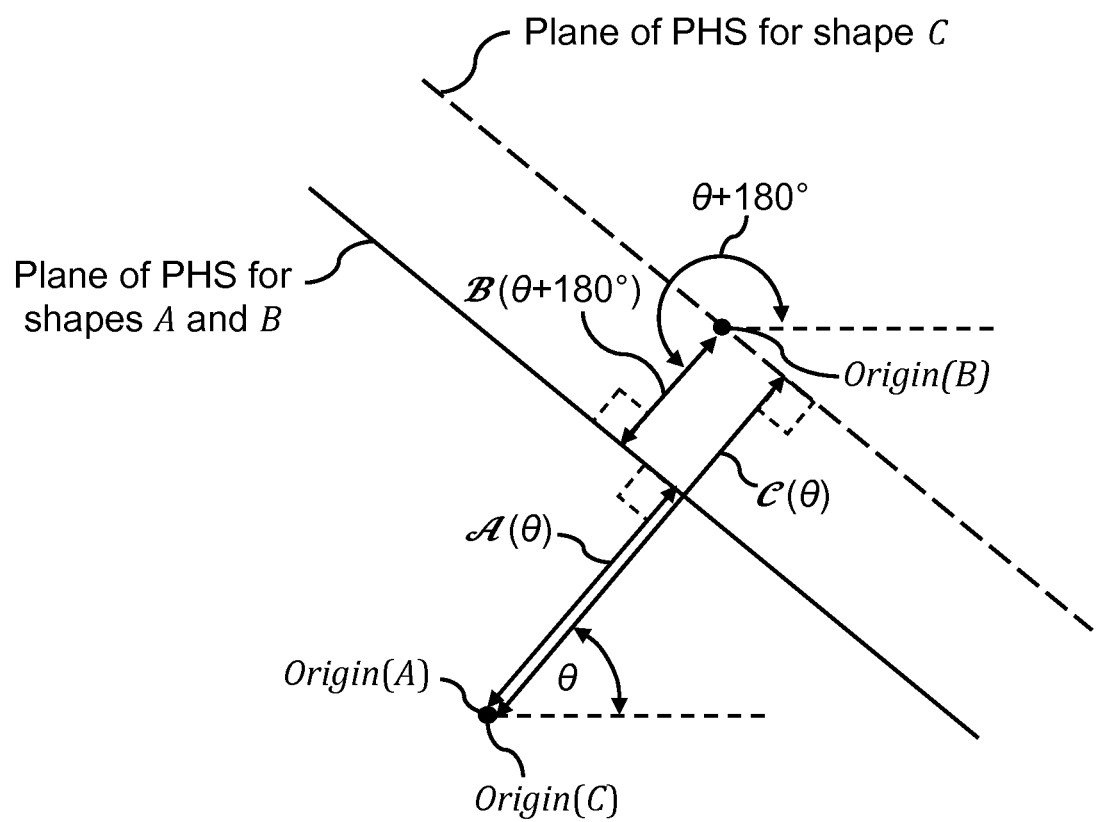
FIG. 3 illustrates the construction of the unconstrained exterior boundary surface of closest approach between two parallel planar half spaces.

Now let us consider the interaction between two shapes, A and B, that are PHSs. The shape spectrum of a PHS is a continuous spectrum with exactly one dominant PHS a finite distance from its origin. Further, the conditions for which the UEBSCA between these shapes, A⊙B, is "well defined" are when the two PHSs are parallel and facing in opposite directions. Under these conditions a shape C, produced by C=A⊙B, is itself a PHS. The normal distance from the origin of C to its defining plane is the sum of the distances between the origin of each shape, A and B, and their corresponding defining plane, as illustrated in FIG. 3 for the two-dimensional case.

For those cases where the defining planes of A and B are not parallel, or are parallel but face in the same direction, the resulting shape, C=A⊙B, has an empty exterior set. That is, B would have to be placed an infinite distance from A to avoid overlapping. This circumstance is represented by a shape spectrum for C where all values of the spectrum are infinite.

Figure 4:
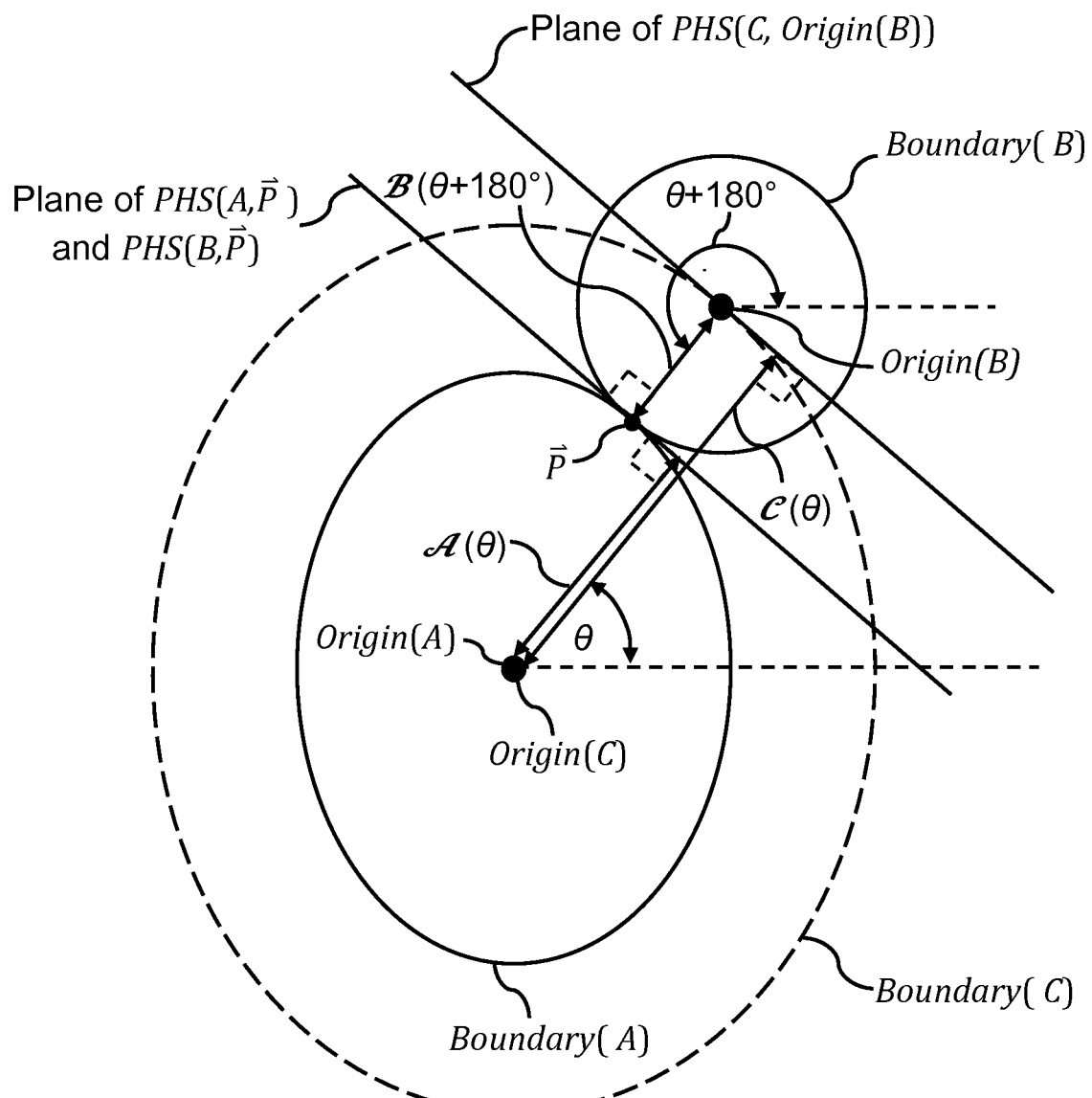
FIG. 4 illustrates the determination of one of the planar half spaces that makes up the unconstrained exterior boundary surface of closest approach formed by two two-dimensional convex shapes.
Figure 5A:
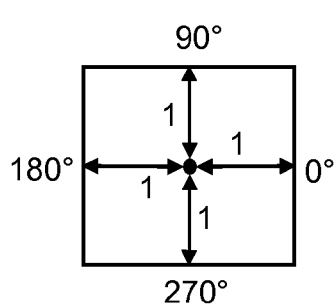
FIG. 5A-5D illustrate the construction of the shape and a discrete representation of its shape spectrum for the unconstrained exterior boundary surface of closest approach formed by a square and an equilateral triangle.
Figure 5A:
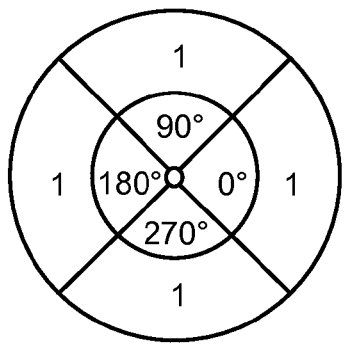
Figure 5B:
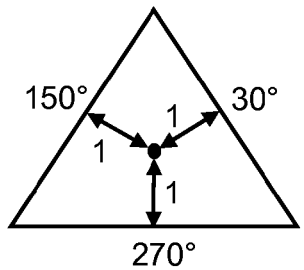
Figure 5B:
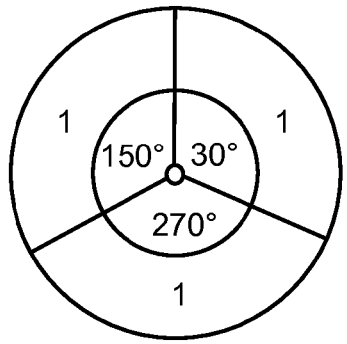
Figure 5C:
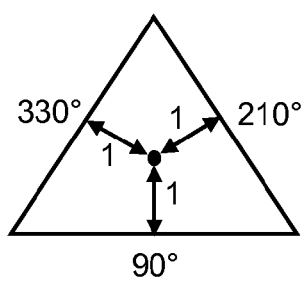
Figure 5C:
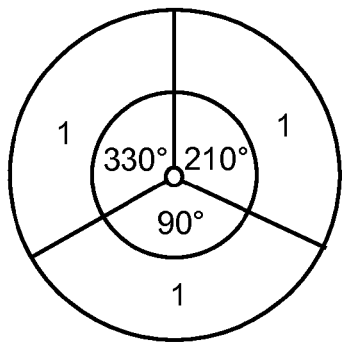
Figure 5D:
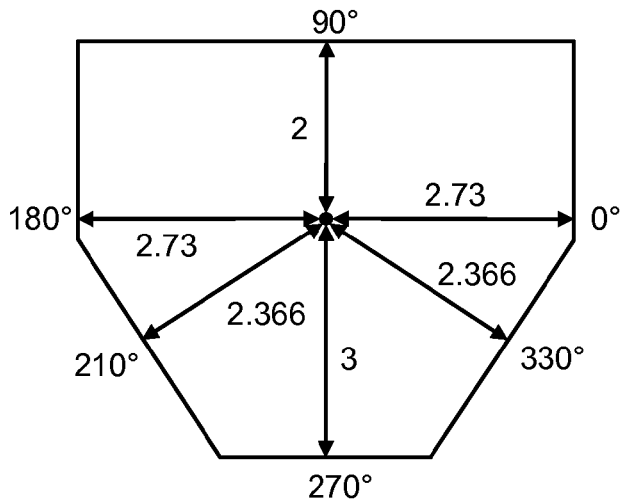
Figure 5D:
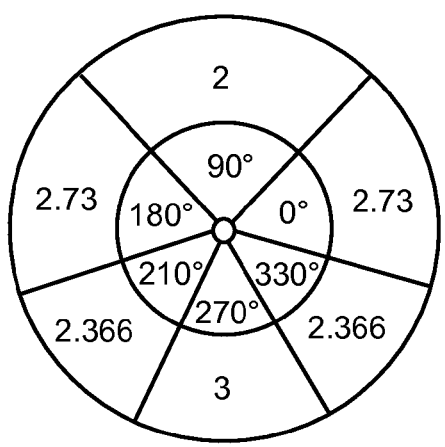

Going one step further and considering any two convex shapes, A and B, as illustrated by the 2-dimensional example in FIG. 4, C=A⊙B is also a convex shape. Further, at any tangent point, $\vec{p}$, of A and B the tangent PHSs of A and B associated with this point, PHS(A, $\vec{p}$) and PHS(B, $\vec{p}$), must be parallel and face in opposite directions. The boundary point defined by the position of the origin of B, Origin(B), when B is tangent to A at $\vec{p}$, is one of the points in the boundary set of C and must lie on a plane parallel to PHS(A, $\vec{p}$) and PHS(B, $\vec{p}$). Since A, B, and C are convex, this plane does not intersect the interior of C and therefore defines a tangent PHS of C, PHS(C,Origin(B)). The normal distance, $\mathcal{C}(\vec{\theta})$, of PHS(C,Origin(B)) from Origin(C) is the sum of the normal distance from the Origin(A) to PHS(A, $\vec{p}$), $\mathcal{A}(\vec{\theta})$, and the normal distance from the Origin (B) to PHS(B,$\vec{p}$), $B((\vec{\theta} + \overrightarrow{180}))$. Finally, PHS(C,Origin(B)) faces in the same direction as PHS(A, $\vec{p}$). Note that for notational convenience we use $\overrightarrow{180}$ to mean a constant vector all of whose elements equal 180.

From the reasoning outlined above the shape spectrum of C=A⊙B can be determined as $$\mathcal{C}(\vec{\theta}) = \mathcal{T}(A \odot B) = \mathcal{T}(A) + \mathcal{T}(B, \overrightarrow{180}) \quad (12)$$

and the shape C=A⊙B can be determined as $$C = A \odot B = \mathcal{T}^{-1}(\mathcal{T}(A) + \mathcal{T}(B, \overrightarrow{180}), \text{Origin}(A)) \quad (13)$$

We will now look at the behavior of C=A⊙B when both A and B are convex polytopes. First, C is its self a convex polytope. Since convex polytopes have discrete shape spectrums, the finite dominant PHSs of C can be determined directly from the finite dominant PHSs of both A and B. In general, for n-dimensional polytopes, the finite dominant PHSs of C are determined by the interaction of the n−1,n−2, . . . 0 dimensional features of shapes A and B. These features are, in turn, determined through the interaction of the finite dominant PHSs. For two dimensional polytopes (polygons) these features include one dimensional edges and zero dimensional points, or corners, where each edge is defined by the "plane" of a dominant PHS, and each corner is defined by the intersection of two dominant PHS "planes". Further, if A has m finite dominant PHSs (one corresponding to each of A's facets), and B has n finite dominant PHSs then C has as few a zero finite dominant PHSs and at most m+n finite dominant PHSs. The finite dominant PHSs of C are determined from the interaction of an edge of A and an edge of B, or an edge of A and a corner of B, or an edge of B and a corner of A.

For the two dimensional case, one approach to determining the dominant PHSs of shape C is as follows:

Procedure 1: Represent the DR shape spectrums of A, B, and C as "circular" lists. These lists are organized in increasing order of angle between $0° \leq \theta < 360°$, of PHS angle and corresponding PHS normal distance from the origin of the shape. Next, rotate each element of list B by 180°. This can be accomplished by adding 180° to each elements angle and then map any angle greater than or equal to 360° to its equivalent angle between $0° \leq \theta < 360°$. For each element in list A see if there is an element in list B with the same angle, $\phi$. If there is, mark the element in B, then add a PHS element to list C whose normal distance is the sum of the normal distances of the corresponding elements of list A and B and whose angle is $\phi$. If there is no element in list B with the angle $\phi$, then we will need to generate the PHS of B associated with $\phi$ using the dominant PHS information in list B. To do this, we first need to determine if the missing PHS is finite non-dominant or infinite dominant. If it is infinite dominant, then any new element for list C would also be infinite dominant and would not need to be included in list C. If it is finite non-dominant, then any new element would be finite dominant and would need to be added to list C. To determine which case we are working with, we find the two elements of list B that would be the predecessor and successor elements of the element from list A if it were in list B. We then check to see if these two elements have an angle between them that is less than 180°. If so, then the missing PHS is finite non-dominant and we need to generate a new element in list C for the angle $\phi$. Using linear algebra and trigonometry we can determine $\mathcal{B}(\phi+180°)$, the normal distance from the origin of B to the plane parallel to the PHS from A that intersects the planes of the two adjacent elements from B. With this distance, we can now generate the new element in C as outlined above. After all elements of list A have been processed, we need to process any of the elements of list B that have not been marked. For each of these elements from list B, we need to generate the missing PHS information in list A and, if necessary, generate new elements in list C as outlined above.

As an example, consider the case illustrated in FIG. 5. In this case, we are interested in determining the dominant PHSs for the UEBSCA between a square and an equilateral triangle as it is moved around the square. FIG. 5A illustrates the square, its DR shape spectrum and circular list representation of that DR shape spectrum. FIG. 5B illustrates the equilateral triangle, its DR shape spectrum and the circular list representation of that DR shape spectrum. FIG. 5C illustrates the triangle, its DR shape spectrum and its circular list representation, after its DR shape spectrum has been rotated 180°. From the DR shape spectrums of FIG. 5A and FIG. 5C, we can see that the dominant PHS's of the UEBSCA will be at 0°, 90°, 180°, 210°, 270°, and 330°. FIG. 5D illustrates the shape of the UEBSCA, its DR shape spectrum, and circular list representation.

We will now look at the most general case for determining the UEBSCA between two shapes, A and B. In particular, we are interested in how to determine A⊙B when A can be either convex or non-convex and B can be either convex or non-convex. To do this we will need to first look at the behavior of UEBSCA when it is applied between the unions of shapes.

Recall that non-convex shapes can be represented as the union of a possible infinite number of convex shapes. Because of this either, or both, of A and B can be converted into a union of convex shapes. However, in order for this conversion to be useful we will need to look at the behavior of UEBSCA when it is applied between the unions of shapes.

From Definitions 3 and 9 we have that $$\text{Interior}((A_1 \cup A_2) \odot B) = \text{Interior}((A_1 \odot B) \cup (A_2 \odot B)) \quad (14)$$

and by extension $$\text{Interior}((\cup_{i=1,n} A_i) \odot B) = \text{Interior}(\cup_{i=1,n}(A_i \odot B)) \quad (15)$$

However, in general $$\text{Interior}(A \odot (B_1 \cup B_2)) \neq \text{Interior}((A \odot B_1) \cup (A \odot B_2)) \quad (16)$$

This is due to the fact that $B_1$ and $B_2$ may not share a common origin. However, if $B_1$ and $B_2$ share a common origin, Origin$(B_1)$=Origin$(B_2)$, then $$\text{Interior}(A \odot (B_1 \cup B_2)) = \text{Interior}((A \odot B_1) \cup (A \odot B_2)) \quad (17)$$

and by extension $$\text{Interior}(A \odot (\cup_{j=1,m} B_j)) = \text{Interior}(\cup_{j=1,m}(A \odot B_j)) \quad (18)$$

Substituting $A = \cup_{i=1,n} A_i$ into Equation (18) we have $$\text{Interior}((\cup_{i=1,n} A_i) \odot (\cup_{j=1,m} B_j)) = \text{Interior}(\cup_{j=1,m}((\cup_{i=1,n} A_i) \odot B_j)) \quad (19)$$

Based on Equation (15) and Equation (19) we have $$\text{Interior}((\cup_{i=1,n} A_i) \odot (\cup_{j=1,m} B_j)) = \text{Interior}(\cup_{j=1,m}(\cup_{i=1,n}(A_i \odot B_j))) \quad (20)$$

or, more concisely, $$\text{Interior}\left(\left(\bigcup_{i=1,n} A_i\right) \odot \left(\bigcup_{j=1,m} B_j\right)\right) = \text{Interior}\left(\bigcup_{\substack{i=1,n \\ j=1,m}} (A_i \odot B_j)\right) \quad (21)$$

when Origin$(\cup_{j=1,m} B_j)$=Origin$(B_1)$= ... =Origin$(B_m)$.

With this result and the fact that non-convex shapes can be represented as the union of a possible infinite number of convex shapes we have the necessary tools to determine the UEBSCA between two shapes, A and B, regardless of their convexity.

Procedure 2:

Decompose A into a set of convex shapes, $\{A_1, \ldots A_n\}$, such that $A = \cup_{i=1,n} A_i$. Decompose B into a set of convex shapes, $\{B_1, \ldots B_m\}$, where Origin$(B_1)$= ... =Origin$(B_m)$=Origin$(B)$ and $B = \cup_{j=1,m} B_j$. From these two sets of shapes the UEBSCA between A and B can be determined as $$A \odot B = \bigcup_{\substack{i=1,n \\ j=1,m}} (A_i \odot B_j) \quad (22)$$

For completeness, it should also be noted that in general ⊙ is not distributive over ∩. That is, in general $$\text{Interior}\left(\left(\bigcap_{i=1,n} A_i\right) \odot \left(\bigcap_{j=1,m} B_j\right)\right) \neq \text{Interior}\left(\bigcap_{\substack{i=1,n \\ j=1,m}} (A_i \odot B_j)\right) \quad (23)$$

One notable and important specific case where ⊙ is distributive over ∩ is for the case where all $A_i$ and $B_j$ are axis aligned orthotopes such that all $B_j$ share a common origin.

We will now look at how to determine the UIBSCA between two fixed orientation shapes. To do this, we first need to clearly define the UIBSCA between two fixed orientation shapes, as well as the inversion operation on a shape.

Definition 10:

The unconstrained interior boundary surface of closest approach (UIBSCA) between two fixed orientation shapes A and B, A⊘B, is a new shape, C, where Origin(C)=Origin(A) and Subdivision(C) is selected such that:

Interior(C) contains all points defined by the location of Origin(B) for all positionings of B, while maintaining the position of A and the orientations of both A and B, such that Interior(B)∩Exterior(A)=⊙ and Boundary(A)∩Boundary(B)=⊙. That is, the set of locations of the origin of B as B is moved around in a fixed orientation such that A and B don't "touch" and the interior of B does not overlap the exterior of A.

Exterior(C) contains all points defined by the location of Origin(B) for all positionings of B, while maintaining the position of A and the orientations of both A and B, such that Interior(B)∩Exterior(A)≠⊙. That is, the set of locations of the origin of B as B is moved around in a fixed orientation such that the interior of B overlaps the exterior of A.

Boundary(C) contains all points defined by the location of Origin(B) for all positionings of B, while maintaining the position of A and the orientations of both A and B, such that Boundary(A)∩Boundary(B)≠⊙ and Interior(B)∩Exterior(A)=⊙. That is, the set of locations of the origin of B as B is moved around in a fixed orientation such that A and B "touch" and the interior of B does not overlap the exterior of A.

From Definition 10 it can also be observed that the UIBSCA operation is not commutative, that is, in general $$A \oslash B \neq B \oslash A \quad (24)$$

Definition 11:

The inversion of a shape A, $\overline{A}$, produces a new shape, C, where Origin(C)=Origin(A) and Subdivision(C) is selected such that Interior(C)=Exterior(A)

Exterior(C)=Interior(A)

$$\text{Boundary}(C) = \text{Boundary}(A) \quad (25)$$

Using this in combination with the Definitions 9 and 10 we have that $$A \oslash B = \overline{A} \odot B \quad (26)$$

From this we see that A⊘B can be solved using all the machinery developed to solve A⊙B.

Analytical Shape Functions

Now that we have a way to determine the shape of UEBSCA or UIBSCA between a pair of shapes, we need an analytical representation for these boundary shapes.

Definition 12:

The analytical shape function or, for brevity, shape function, $\mathbb{S}(\vec{x}, \vec{o})$, for a shape S is a mapping which can be used to determine if a point $\vec{x}$ is in the Interior(S), Exterior(S), or Boundary(S) when Origin(S)=$\vec{o}$.

One approach to this mapping is to define $\mathbb{S}(\vec{x}, \vec{o})$ for a shape S such that:

$$\text{Interior}(S) = \{ \vec{X} \mid 0 \leq \mathbb{S}(\vec{X}, \vec{O}) < 1 \} \quad (27)$$

$$\text{Boundary}(S) = \{ \vec{X} \mid \mathbb{S}(\vec{X}, \vec{O}) = 1 \} \quad (28)$$

$$\text{Exterior}(S) = \{ \vec{X} \mid \mathbb{S}(\vec{X}, \vec{O}) > 1 \} \quad (29)$$

As an example, consider the two-dimensional shape which is a circle of radius one with its origin, $$\begin{bmatrix} o_1 \\ o_2 \end{bmatrix},$$

located at the center of the circle. An analytical shape function defined on the Cartesian coordinate system that represents this shape and satisfies Equations (27), (28), and (29) is $$\mathbb{S}\left( \begin{bmatrix} x_1 \\ x_2 \end{bmatrix}, \begin{bmatrix} o_1 \\ o_2 \end{bmatrix} \right) = (x_1 - o_1)^2 + (x_2 - o_2)^2 \quad (30)$$

One skilled in the art will immediately see that there are many equally valid alternate mappings that can define a shape function, as for example the mapping $$\text{Interior}(S) = \{ \vec{X} \mid \mathbb{S}(\vec{X}, \vec{O}) > 1 \} \quad (31)$$

$$\text{Boundary}(S) = \{ \vec{X} \mid \mathbb{S}(\vec{X}, \vec{O}) = 1 \} \quad (32)$$

$$\text{Exterior}(S) = \{ \vec{X} \mid 0 \leq \mathbb{S}(\vec{X}, \vec{O}) < 1 \} \quad (33)$$

or $$\text{Interior}(S) = \{ \vec{X} \mid \mathbb{S}(\vec{X}, \vec{O}) < 0 \} \quad (34)$$

$$\text{Boundary}(S) = \{ \vec{X} \mid \mathbb{S}(\vec{X}, \vec{O}) = 0 \} \quad (35)$$

$$\text{Exterior}(S) = \{ \vec{X} \mid \mathbb{S}(\vec{X}, \vec{O}) > 0 \} \quad (36)$$

For the remainder of this disclosure when a specific mapping is required to illustrate a concept we will assume, for the sake of brevity and clarity and without loss of generality, that the shape functions are defined by the mapping of Equations (27), (28), and (29) unless stated otherwise. One skilled in the art will immediately see that these concepts could be demonstrated with many other alternate mappings or, where applicable, combinations of alternate mappings.

Analytical Composition of Shapes

Since UEBSCAs and UIBSCAs can be composed of multiple shapes using intersections, unions and inversions, we also need analytical methods for composing analytical shape functions using analytical intersections, inversions and unions. We will refer to the process of constructing analytical shape functions using analytical intersections and/or analytical unions as analytical composition.

Definition 13:

An analytical intersection for a set of analytical shape functions, $\{ \mathbb{S}_1(\vec{X}, \vec{O}_1), \ldots \mathbb{S}_n(\vec{X}, \vec{O}_n) \}$, for the set of shapes $\{ S_1, \ldots S_n \}$, Intersect($\mathbb{S}_1(\vec{X}, \vec{O}_1) \ldots \mathbb{S}_n(\vec{X}, \vec{O}_n)$), is a function that can be used to determine if a point is in Interior($\cap_{i=1,n} S_i$), Exterior($\cap_{i=1,n} S_i$), or Boundary($\cap_{i=1,n} S_i$) when Origin($S_1$)=$\vec{o}_1, \ldots$ Origin($S_n$)=$\vec{o}_n$.

One function that captures the spirit of Definition 13 that can perform an approximate analytical intersection for a set of shape functions is $$\text{Intersect}(\mathbb{S}_1(\vec{X}, \vec{O}_1), \ldots \mathbb{S}_n(\vec{X}, \vec{O}_m)) \approx \quad (37)$$
$$\lim_{U_1, \ldots U_m \to \infty} (\mathbb{S}_1(\vec{X}, \vec{O}_1)^{U_1} + \ldots + \mathbb{S}_m(\vec{X}, \vec{O}_m)^{U_m})$$

The characteristics that cause this to be an approximation stem from the fact that for any point, $\vec{X}$ on the boundary of more than one shape of the intersection, we would expect that point to be on the boundary of the shape formed by the intersection, however, from Equation (37) we see that $\vec{X}$ will be mapped to a point in the exterior of the intersection. However, in practice, for large finite values of $\{U_1, \ldots U_m\}$, the resulting sets will be sufficiently close to the desired sets for engineering purposes.

Definition 14:

An analytical inversion of an analytical shape function, $\mathbb{S}(\vec{X}, \vec{O})$, for the shape S is a function, Invert($\mathbb{S}(\vec{X}, \vec{O})$) that can be used to determine if a point is in the Interior($\overline{S}$), Exterior($\overline{S}$), or Boundary($\overline{S}$) when Origin(S)=$\vec{o}$.

One function that satisfies Definition 14 is $$\text{Invert}(\mathbb{S}(\vec{X}, \vec{O})) = \frac{1}{\mathbb{S}(\vec{X}, \vec{O})} \quad (38)$$

Definition 15:

An analytical union of a set of analytical shape functions, $\{S_1(\vec{X}, \vec{O}_1), \ldots S_n(\vec{X}, \vec{O}_n)\}$, for the set of shapes $\{S_1, \ldots S_n\}$, Union($S_1(\vec{X}, \vec{O}_1), \ldots S_n(\vec{X}, \vec{O}_n)$), is a function that can be used to determine if a point is in Interior($\cup_{i=1,n} S_i$), Exterior($\cup_{i=1,n} S_i$), or Boundary($\cup_{i=1,n} S_i$) when Origin($S_1$)=$\vec{o}_1, \ldots$ Origin($S_n$)=$\vec{o}_n$.

Using DeMorgan's law and assuming Definitions 13 and 14 are satisfied using Equations (37) and (38), one function that captures the spirit of Definition 15 and can perform an approximate analytical union for a set of shape functions is $$\text{Union}(\mathbb{S}_1(\vec{X}, \vec{O}_1), \ldots \mathbb{S}_n(\vec{X}, \vec{O}_n)) = \quad (39)$$

$$\text{Invert}(\text{Intersect}(\text{Invert}(\mathbb{S}_1(\vec{X}, \vec{O}_1)), \ldots \text{Invert}(\mathbb{S}_n(\vec{X}, \vec{O}_n)))) \approx$$

$$\frac{1}{\lim_{R_1, \ldots R_n \to \infty} \left( \frac{1}{\mathbb{S}_1(\vec{X}, \vec{O}_1)^{R_1}} + \ldots + \frac{1}{\mathbb{S}_n(\vec{X}, \vec{O}_n)^{R_n}} \right)}$$

Again we note the approximate nature of Equation (39) and observe that, in practice, for large finite values of $\{R_1, \ldots, R_n\}$ the resulting sets will be sufficiently close to the desired sets for engineering purposes.

There are shape functions whose form makes its associated exponent, in Equations (37) or (39), unnecessary. For example, if the shape function $$S_1\left(\begin{bmatrix} x_1 \\ x_2 \end{bmatrix}, \begin{bmatrix} o_1 \\ o_2 \end{bmatrix}\right) = \lim_{Q \to \infty} (|x_1 - o_1|^Q + |x_2 - o_2|^Q) \quad (40)$$

were one of the shapes to be intersected in Equation (37) or the union in Equation (38), the behavior of exponent Q would make the associated exponent in Equations (37) or (39), unnecessary and the exponent could either be eliminated or set to a constant. Conversely, if the shape function $$\mathbb{S}_1\left(\begin{bmatrix} x_1 \\ x_2 \end{bmatrix}, \begin{bmatrix} o_1 \\ o_2 \end{bmatrix}\right) = |x_1 - o_2|^2 + |x_2 - o_2|^2 \quad (41)$$

were one of the shapes to be intersected in Equation (37) or the union in Equation (38), its associated exponent in Equations (37) or (39), would be required. We will refer to shapes, such as the one in Equation (40), as self-composing shapes. From this we can see that shapes produced by an analytic union or analytic intersection are themselves self-composing.

Constructing Analytical Shape Functions

Since shapes can be composed of set of convex shapes we now need methods for constructing analytical shape functions for convex shapes.

One method for constructing analytical shape functions for convex shapes relies on the fact that convex shapes are composed of the intersection of a possibly infinite number of PHSs. Further, the finite dominant PHSs of a shape's shape spectrum identify the minimum set of PHSs that will need to be intersected to form the shape. From this we can see that an analytical shape function of a convex shape can be composed from the analytical shape functions of its finite dominant PHSs.

One approach to determining an analytical shape function of a PHS that satisfies Equations (27), (28), and (29) is through the use of affine functions. In particular, for the PHS, PHS1, associated with direction $\vec{\theta}$ of an n-dimensional convex shape, S, with origin $\vec{o}$ we can construct a function $P_{\vec{\theta}}(\vec{x}, \vec{o})$ which is affine in $\vec{x}$, such that $P_{\vec{\theta}}(\vec{x}, \vec{o})=1$ for all $\vec{x}$ on the boundary of PHS1 and $P_{\vec{\theta}}(\vec{x}, \vec{o})>1$ for all $\vec{x}$ exterior to PHS1. To do this we need to determine a vector of n coefficients, $\vec{K}_{\vec{\theta}}$, and a scalar $K_{\vec{\theta}}$ which satisfy $$P_{\vec{\theta}}(\vec{x}, \vec{o}) = \vec{K}_{\vec{\theta}}{}^T \vec{x} + K_{\vec{\theta}} = 1 \forall \vec{x} \in \text{Boundary}(PHS1) \quad (42)$$

$$P_{\vec{\theta}}(\vec{x}, \vec{o}) = \vec{K}_{\vec{\theta}}{}^T \vec{x} + K_{\vec{\theta}} > 1 \forall \vec{x} \in \text{Exterior}(PHS1) \quad (43)$$

Using basic linear algebra and trigonometry it is possible to determine any number of $\vec{K}_{\vec{\theta}}$ and $K_{\vec{\theta}}$ that satisfy Equation (42) and (43).

For example, in the 2-dimensional case it is not hard to show that $$\vec{K}_{\vec{\theta}} = \begin{bmatrix} \cos\theta \\ \sin\theta \end{bmatrix} \quad (44)$$

$$K_{\vec{\theta}} = -\vec{K}_{\vec{\theta}}{}^T \begin{bmatrix} o_1 \\ o_2 \end{bmatrix} - \mathcal{S}(\theta) + 1 \quad (45)$$

satisfy Equations (42) and (43) when $\mathcal{S}(\theta)$ is the normal distance from $$\vec{O} = \begin{bmatrix} o_1 \\ o_2 \end{bmatrix}$$

to the plane of PHS1 of S.

However, while $\mathbb{P}_{\vec{\theta}}(\vec{X},\vec{O})$ will correctly identify the boundary and exterior sets, it will not correctly identify the interior set since it maps all points, $\vec{X}$, in the interior of PHS1 to values in the range $-\infty < P_{\vec{\theta}}(\vec{X},\vec{O}) < 1$ instead of the desired range $0 \leq P_{\vec{\theta}}(\vec{X},\vec{O}) < 1$. One way to rectify this is to define the analytical shape function for PHS1 to be $$\mathbb{P}_{\vec{\theta}}(\vec{X},\vec{O}) = \max\{0, P_{\vec{\theta}}(\vec{X},\vec{O})\} \qquad (46)$$

Using Equations (37) and (46), we can construct an analytical shape function for a convex shape, S, with a discrete shape spectrum having q finite dominant PHS's with directions $\vec{\theta}_1, \cdots \vec{\theta}_q$ as $$S(\vec{X},\vec{O}) = \lim_{z_1,\ldots z_q \to \infty} \left( \sum_{i=1}^{q} \mathbb{P}_{\vec{\theta}_i}(\vec{X},\vec{O})^{z_i} \right) \qquad (47)$$

Equation (47) can produce a shape function which maps more than one point in the interior of the shape to a value of zero due to the use of the max function in Equation (46). In some applications it may be desirable for the shape function to have only a single point in the interior of a shape which maps to a value of zero. One way to produce a shape function with a unique minimum point, possibly zero, for a convex shape, S, having finite volume, is to first determine a point in the interior of the shape. One such point, the analytical center, can be readily determined using convex optimization methods. We can then compute the vector of coefficients and scalar in Equations (42) and (43) such that the shape function for each PHS of S passes through this point with a value greater than or equal to zero. If the shape function of each PHS of S passes through this point with a value of zero, then the corresponding shape function of S will have a unique minimum at this point whose value is zero.

A more compact representation exists for any n-dimensional convex shape, S, that has symmetric pairs of finite dominate PHSs. A symmetric pair of finite dominant PHSs for a shape S exists when there is a finite dominant PHS, call it PHS1, for some direction $\vec{\theta}$ and another finite dominant PHS, call it PHS2, for direction $\vec{\theta} + \overline{180}$. Under these circumstances we can construct a single affine function, $Q_{\vec{\theta}}(\vec{X},\vec{O})$, which can be used to capture the interior, boundary, and exterior sets of PHS1∩PHS2. In particular, we can determine a vector of n coefficients, $\vec{K}_{\vec{\theta}}$, and a scalar $K_{\vec{\theta}}$ that satisfy $$Q_{\vec{\theta}}(\vec{X},\vec{O}) = \vec{K}_{\vec{\theta}}^T \vec{X} + K_{\vec{\theta}} = 1 \forall \vec{X} \in \text{Boundary}(PHS1) \qquad (48)$$

$$Q_{\vec{\theta}}(\vec{X},\vec{O}) = \vec{K}_{\vec{\theta}}^T \vec{X} + K_{\vec{\theta}}^T \vec{X} = 1 \forall \vec{X} \in \text{Exterior} (PHS1) \qquad (49)$$

$$Q_{\vec{\theta}}(\vec{X},\vec{O}) = \vec{K}_{\vec{\theta}}^T \vec{X} + K_{\vec{\theta}}^T \vec{X} = -1 \forall \vec{X} \in \text{Boundary} (PHS2) \qquad (50)$$

$$Q_{\vec{\theta}}(\vec{X},\vec{O}) = \vec{K}_{\vec{\theta}}^T \vec{X} + K_{\vec{\theta}}^T \vec{X} < -1 \forall \vec{X} \in \text{Exterior} (PHS2) \qquad (51)$$

$$-1 < Q_{\vec{\theta}}(\vec{X},\vec{O}) = \vec{K}_{\vec{\theta}}^T \vec{X} + K_{\vec{\theta}}^T \vec{X} < 1 \forall \vec{X} \in (\text{Interior} (PHS1) \cap \text{Interior}(PHS2)) \qquad (52)$$

The analytical representation of the intersection of PHS1 and PHS2 can then be compactly represented as $$\mathbb{Q}_{\vec{\theta}}(\vec{X},\vec{O}) = |Q_{\vec{\theta}}(\vec{X},\vec{O})| \qquad (53)$$

For example, in the 2-dimensional case it is not hard to show that $$\vec{K}_{\vec{\theta}} = \frac{2}{S(\theta+180°)+S(\theta)} \begin{bmatrix} \cos\theta \\ \sin\theta \end{bmatrix} \qquad (54)$$

$$K_{\vec{\theta}} = -\vec{K}_{\vec{\theta}}^T \begin{bmatrix} o_1 \\ o_2 \end{bmatrix} = \frac{S(\theta+180°)-S(\theta)}{S(\theta+180°)+S(\theta)} \qquad (55)$$

where $$\begin{bmatrix} o_1 \\ o_2 \end{bmatrix}$$

is the origin of S, and by extension the origins of both PHS1 and PHS2 θ is the direction of the normal vector from $$\begin{bmatrix} o_1 \\ o_2 \end{bmatrix}$$

to the plane of PHS1 of S; $S(\theta)$ is the normal distance from $$\begin{bmatrix} o_1 \\ o_2 \end{bmatrix}$$

to the plane of PHS1 of S; and $S(\theta+180°)$ is the normal distance from $$\begin{bmatrix} o_1 \\ o_2 \end{bmatrix}$$

to the plane of PHS2 of S.

One way to use Equations (46) and (53) to construct an analytical representation for a convex shape, S, with a discrete shape spectrum having r finite dominant PHSs is as $$S(\vec{X},\vec{O}) = \lim_{\substack{z_1,\ldots z_q \to \infty \\ z_{q+1},\ldots z_{q+p} \to \infty}} \left( \sum_{i=1}^{q} \mathbb{Q}_{\vec{\theta}_i}(\vec{X},\vec{O})^{z_i} + \sum_{j=1}^{p} \mathbb{P}_{\vec{\theta}_j}(\vec{X},\vec{O})^{z_{q+j}} \right) \qquad (56)$$

where p and g are integers;

$$0 \leq q \leq \frac{r}{2};$$

at least q PHS's, with directions $\vec{\theta}_1, \cdots \vec{\theta}_q$, have corresponding symmetric PHSs with directions $\vec{\theta}_1 + \overline{180}, \cdots \vec{\theta}_q + \overline{180}$; the remaining p=r−2q finite dominant PHS's have directions $\vec{\vartheta}_1, \cdots \vec{\vartheta}_p$.

For a convex shape, S, with a continuous shape spectrum the summation in Equation (56) can be converted to an integration. As an example of this, consider the two dimensional case where the shape spectrum, $S(\theta)$, is symmetric. One way to determine this shape function is as $$S\left(\begin{bmatrix} x_1 \\ x_2 \end{bmatrix}, \begin{bmatrix} o_1 \\ o_2 \end{bmatrix}\right) = \lim_{Z \to \infty} \left(\int_{0°}^{180°} Q_\theta \left(\begin{bmatrix} x_1 \\ x_2 \end{bmatrix}, \begin{bmatrix} o_1 \\ o_2 \end{bmatrix}\right)^Z d\theta\right) = \tag{57}$$

$$\lim_{Z \to \infty} \left(\int_{0°}^{180°} \left| K_\theta^T \begin{bmatrix} x_1 \\ x_2 \end{bmatrix} + K_\theta \right|^Z d\theta\right) =$$

$$\lim_{Z \to \infty} \left(\int_{0°}^{180°} \left| \frac{2\cos(\theta)}{S(\theta) + S(\theta + 180°)} x_1 + \frac{2\sin(\theta)}{S(\theta) + S(\theta + 180°)} x_2 + \frac{-2\cos(\theta)o_1 - 2\sin(\theta)o_2 + S(\theta + 180°) - S(\theta)}{S(\theta) + S(\theta + 180°)} \right|^Z d\theta\right)$$

Figure 6:
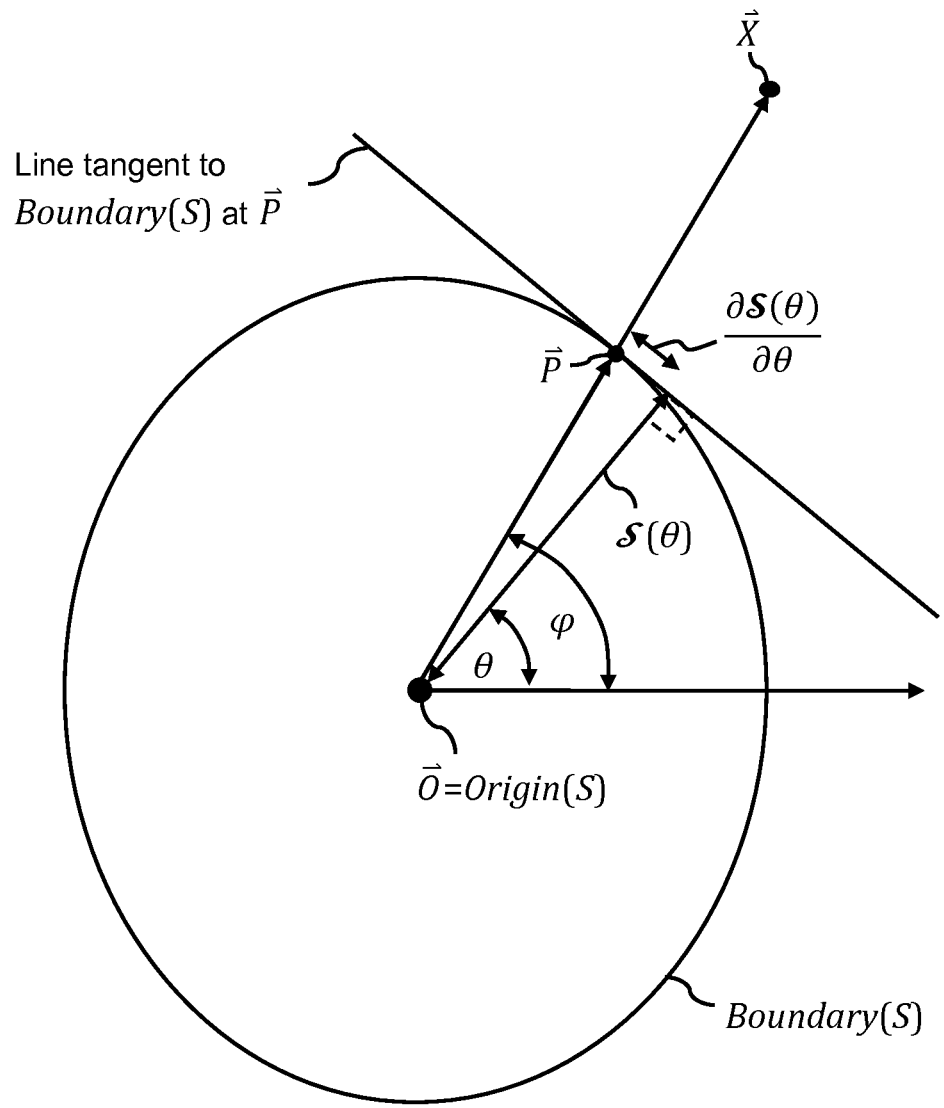
FIG. 6 illustrates the relationship of the various elements of one approach used to construct a shape function from a shape spectrum for a two-dimensional shape.

We will now consider a more direct approach to constructing analytical shape functions for convex shapes. In this approach, an analytical shape function is generated directly from a shape spectrum without the use of PHSs. We will illustrate this approach using the two-dimensional case. Specifically, it can be shown that for a two-dimensional shape S with origin $$\vec{O} = \begin{bmatrix} o_1 \\ o_2 \end{bmatrix}$$

and shape spectrum $S(\theta) = \mathcal{T}(S)$, the boundary of S can be determined as $$\text{Boundary}(S) = \cup_{0° \le \theta < 360°} L(\theta, \vec{O}) \tag{58}$$

where $L(\theta, \vec{O})$ is the set of points defined by the line segment between the points $$\vec{A} = \begin{bmatrix} a_1(\theta, o_1) \\ a_2(\theta, o_2) \end{bmatrix} \text{ and } \vec{B} = \begin{bmatrix} b_1(\theta, o_1) \\ b_2(\theta, o_2) \end{bmatrix}$$

where $a_1(\theta, o_1), a_2(\theta, o_2), b_1(\theta, o_1),$ and $b_2(\theta, o_2)$ are defined by the following subdifferential equations:

$$a_1(\theta, o_1) = S(\theta)\cos(\theta) - \sin(\theta)\max\left\{\frac{\delta S(\theta)}{\delta \theta}\right\} + o_1 \tag{59}$$

$$a_2(\theta, o_2) = S(\theta)\sin(\theta) + \cos(\theta)\max\left\{\frac{\delta S(\theta)}{\delta \theta}\right\} + o_2 \tag{60}$$

$$b_1(\theta, o_1) = S(\theta)\cos(\theta) - \sin(\theta)\min\left\{\frac{\delta S(\theta)}{\delta \theta}\right\} + o_1 \tag{61}$$

$$b_2(\theta, o_2) = S(\theta)\sin(\theta) + \cos(\theta)\min\left\{\frac{\delta S(\theta)}{\delta \theta}\right\} + o_2 \tag{62}$$

where $$\frac{\delta S(\theta)}{\delta \theta}$$

is the set of subderivatives of $S(\theta)$ at $\theta$. Further, as illustrated in FIG. 6, for each point $$\vec{P} = \begin{bmatrix} p_1 \\ p_2 \end{bmatrix}$$

in Boundary(S) there are two associated angles. The first, $\theta$, has already been defined according to Equation (58). The second, $\phi$, is defined as the angle formed between a vector from $\vec{O}$ to $\vec{P}$ and a vector parallel to the X-axis originating at $\vec{O}$. The relationship between $\theta$ and $\phi$ satisfies the following subdifferential inequality:

$$\theta + \tan^{-1}\left(\frac{\min\left\{\frac{\delta S(\theta)}{\delta \theta}\right\}}{S(\theta)}\right) \le \varphi \le \theta + \tan^{-1}\left(\frac{\max\left\{\frac{\delta S(\theta)}{\delta \theta}\right\}}{S(\theta)}\right) \tag{63}$$

For a shape S with a continuous shape spectrum, Origin(S)∈ Interior(S), and for which Boundary(S) contains no straight line segments, the set of subderivatives, $$\frac{\delta S(\theta)}{\delta \theta},$$

associated with each $\theta$ contains a single element $$\frac{\delta S(\theta)}{\delta \theta} = \left\{\frac{\partial S(\theta)}{\partial \theta}\right\} \tag{64}$$

and thus $$\theta = \varphi - \tan^{-1}\left(\frac{\frac{\partial S(\theta)}{\partial \theta}}{S(\theta)}\right) \tag{65}$$

$$a_1(\theta, o_1) = b_1(\theta, o_1) = S(\theta)\cos(\theta) - \sin(\theta)\frac{\partial S(\theta)}{\partial \theta} + o_1 \tag{66}$$

$$a_2(\theta, o_2) = b_2(\theta, o_2) = S(\theta)\sin(\theta) + \cos(\theta)\frac{\partial S(\theta)}{\partial \theta} + o_2 \tag{67}$$

In this case, as illustrated in FIG. 6, an analytical shape function for S, satisfying Equations (27) though (29), can be constructed as:

$$S(\vec{X}, \vec{O}) = \frac{\|\vec{X} - \vec{O}\|}{\|\vec{P} - \vec{O}\|} = \frac{\sqrt{(x_1 - o_1)^2 + (x_2 - o_2)^2}}{\sqrt{(p_1 - o_1)^2 + (p_2 - o_2)^2}} \tag{68}$$

$$= \sqrt{\frac{(x_1 - o_1)^2 + (x_2 - o_2)^2}{(p_1 - o_1)^2 + (p_2 - o_2)^2}}$$

where $$\vec{X} = \begin{bmatrix} x_1 \\ x_2 \end{bmatrix}; \quad \vec{O} = \begin{bmatrix} o_1 \\ o_2 \end{bmatrix}; \quad \vec{P} = \begin{bmatrix} p_1 \\ p_2 \end{bmatrix};$$

θ satisfies Equation (65) when $$\varphi = \tan^{-1}\left(\frac{x_2 - o_2}{x_1 - o_1}\right);$$

and, based on Equations (66) and (67), $p_1 = a_1(\theta, o_1)$ and $p_2 = a_2(\theta, o_2)$.

Analytical Representations of BD constraints

We will now consider an approach to generating analytical representations for a wide variety of BD constraints. To begin with, simple BD constraints between the exterior surfaces of two shapes, $S_1$ and $S_2$, can be constructed with the use of UEBSCA, or $EB = S_1 \odot S_2$, while simple BD constraints between the exterior surface of one shape and the interior surface of another can be constructed with the use of UIBSCA, or $IB = S_1 \otimes S_2$. Further, we can break these two categories into at least three sub types: non-overlap, abutment and overlap constraints between the boundary surfaces of $S_1$ and $S_2$. One way we can generate an analytical representation for a BD constraint that enforces the abutment of the exterior surfaces of $S_1$ and $S_2$, Boundary$(S_1) \cap$ Boundary$(S_2) \neq \odot$ and Interior$(S_1) \cap$ Interior$(S_2) = \odot$, is by generating a shape function for EB, $\mathbb{EB}(\vec{x}, \text{Origin}(S_1))$, and checking to see if Origin$(S_2)$ is in Boundary(EB) using the equality constraint $$\mathbb{EB}(\text{Origin}(S_2), \text{Origin}(S_1)) = 1 \quad (69)$$

or an equivalent such as $\mathbb{EB}(\text{Origin}(S_2) - \text{Origin}(S_1), \vec{0}) = 1$, where $\vec{0}$ is a vector where all components are zero. In a similar fashion, one way we can enforce the non-overlap constraint $\overline{\text{Exterior}(S_1) \cap \text{Exterior}(S_2)} = \odot$ between $S_1$ and $S_2$, is by checking to see if Origin$(S_2)$ is in Exterior(EB) using $$\mathbb{EB}(\text{Origin}(S_2), \text{Origin}(S_1)) > 1 \quad (70)$$

or an equivalent. Likewise, one way we can enforce the overlap constraint Interior$(S_1) \cap$ Interior$(S_2) \neq \odot$ between $S_1$ and $S_2$ is by checking to see if Origin$(S_2)$ is in Interior(EB) using $$\mathbb{EB}(\text{Origin}(S_2), \text{Origin}(S_1)) < 1 \quad (71)$$

or an equivalent.

Extending these ideas to containment constraints between $S_1$ and $S_2$ we have $$\mathbb{IB}(\text{Origin}(S_2), \text{Origin}(S_1)) = 1 \quad (72)$$

$$\mathbb{IB}(\text{Origin}(S_2), \text{Origin}(S_1)) > 1 \quad (73)$$

$$\mathbb{IB}(\text{Origin}(S_2), \text{Origin}(S_1)) < 1 \quad (74)$$

where Equations (72) enforces abutment between the interior surface of $S_1$ and the exterior surface of $S_2$, Boundary$(S_1) \cap$ Boundary$(S_2) \neq \odot$ and Interior$(S_2) \subset$ Interior$(S_1)$; Equations (73) enforce the overlap constraint $\overline{\text{Exterior}(S_1) \cap \text{Interior}(S_2)} \neq \odot$ between $S_1$ and $S_2$; and Equations (74) enforces the containment constraint $\overline{\text{Exterior}(S_2)} \subset$ Interior$(S_1)$ between $S_1$ in $S_2$.

Distance Spectrums

To broaden the range of BD constraints that can be enforced we need to be able to determine EBSCA and IBSCA which account for nonzero distance constraints between surfaces. That is, we need to be able to determine CEBSCA and CIBSCA. One way to do this is through the use of distance spectrums.

Definition 17:

A distance spectrum, $\mathcal{D}(\vec{\theta})$, is a function whose values represent the adjustments to be made in the distance values of a shape's shape spectrum. Associated with a shape spectrum and a distance spectrum are two operations, $\oplus$ and $\ominus$, where $\oplus$ "adds" a distance spectrum to a shape spectrum, and $\ominus$ "subtracts" a distance spectrum from a shape spectrum. Further, one or more values of direction $\vec{\theta}$ can have a value of $\mathcal{D}(\vec{\theta})$ which is undefined. We will refer to distance spectrums with no undefined values as explicit distance spectrums and those with one or more undefined values as implicit distance spectrums. For a shape spectrum $\mathcal{S}(\vec{\theta})$ and a distance spectrum $\mathcal{D}(\vec{\theta})$, the shape spectrums $\mathcal{S}(\vec{\alpha}) \oplus \mathcal{D}(\vec{\alpha})$ and $\mathcal{S}(\vec{\alpha}) \ominus \mathcal{D}(\vec{\alpha})$ can be determined as follows:

For all $\vec{\alpha}$ which have defined values for $\mathcal{D}(\vec{\alpha})$, $\mathcal{S}(\vec{\alpha}) \oplus \mathcal{D}(\vec{\alpha}) = \mathcal{S}(\vec{\alpha}) + \mathcal{D}(\vec{\alpha})$, and $\mathcal{S}(\vec{\alpha}) \oplus \mathcal{D}(\vec{\alpha}) = \mathcal{S}(\vec{\alpha}) - \mathcal{D}(\vec{\alpha})$.

If, for a given $\vec{\alpha}$, $\mathcal{D}(\vec{\alpha})$ is undefined and $\mathcal{S}(\vec{\alpha})$ is associated with a dominant PHS then $\mathcal{S}(\vec{\alpha}) \oplus \mathcal{D}(\vec{\alpha}) = \mathcal{S}(\vec{\alpha})$, and $\mathcal{S}(\vec{\alpha}) \ominus \mathcal{D}(\vec{\alpha}) = \mathcal{S}(\vec{\alpha})$.

If, for a given $\vec{\alpha}$, $\mathcal{D}(\vec{\alpha})$ is undefined and $\mathcal{S}(\vec{\alpha})$ is associated with a nondominant PHS then the values of $\mathcal{S}(\vec{\alpha}) \oplus \mathcal{D}(\vec{\alpha})$, and $\mathcal{S}(\vec{\alpha}) \ominus \mathcal{D}(\vec{\alpha})$ are selected such that the PHS associated with $\mathcal{S}_A(\vec{\alpha})$ is also non-dominant.

One way to determine CEBSCA of two shapes, $S_1$ and $S_2$, with additional distance constraints captured as distance spectrums, $\mathcal{D}_1(\vec{\theta})$ and $\mathcal{D}_2(\vec{\theta})$, would be as follows $$EB = \mathcal{T}^{-1}(\mathcal{T} \oplus \mathcal{D}_1(\vec{\theta}), \text{Origin}(S_1)) \odot \mathcal{T}^{-1}(\mathcal{T}(S_2) \oplus \mathcal{D}_2(\vec{\theta}), \text{Origin}(S_2)) \quad (75)$$

when both operands of the $\odot$ operation are convex shapes. From this we can determine the shape spectrum, $\epsilon(\vec{\theta})$, of EB as $$\epsilon(\vec{\theta}) = \mathcal{S}_1(\vec{\theta}) \oplus \mathcal{D}_1(\vec{\theta}) + \mathcal{S}_2(\vec{\theta} + \overline{180}) \oplus \mathcal{D}_2(\vec{\theta} + \overline{180}) \quad (76)$$

When $\mathcal{D}_1(\vec{\theta})$ and $\mathcal{D}_2(\vec{\theta})$ are both explicit distance spectrums Equation (76) reduces to $$\mathcal{EB}(\vec{\theta}) = \mathcal{S}_1(\vec{\theta}) + \mathcal{D}_1(\vec{\theta}) + \mathcal{S}_2(\vec{\theta} + \overline{180}) + \mathcal{D}_2(\vec{\theta} + \overline{180}) \quad (77)$$
$$= \mathcal{S}_1(\vec{\theta}) + \mathcal{S}_2(\vec{\theta} + \overline{180}) + \mathcal{D}_3(\vec{\theta})$$

where $\mathcal{D}_3(\vec{\theta}) = \mathcal{D}_1(\vec{\theta}) + \mathcal{D}_2(\vec{\theta} + \overline{180})$.

More generally, for the case where one or both of shapes $S_1$ and $S_2$ are non-convex we can represent the non-convex shape as the union of a set of convex shapes. Specifically, when both of shapes $S_1$ and $S_2$ are non-convex we assume that $S_1 = \cup_{i=1,m} S_{1,i}$ and $S_2 = \cup_{j=1,n} S_{2,j}$, where $S_{1,1}, \ldots S_{1,m}$ and $S_{2,1}, \ldots S_{2,n}$ are all convex shapes and Origin$(S_2) =$ Origin$(S_{2,1}) = \ldots =$ Origin$(S_{2,n})$. Applying Equations (21) and (75) we can incorporate distance spectrums $\mathcal{D}_{1,1}(\vec{\theta}), \ldots \mathcal{D}_{1,m}(\vec{\theta})$ and $\mathcal{D}_{2,1}(\vec{\theta}), \ldots \mathcal{D}_{2,n}(\vec{\theta})$ into the determination of the CEBSCA of $S_1$ and $S_2$ as $$EB = \bigcup_{\substack{i=1,m \\ j=1,n}} \begin{pmatrix} \mathcal{T}^{-1}(\mathcal{T}(S_{1,i}) \oplus \mathcal{D}_{1,i}(\vec{\theta}), \text{Origin}(S_{1,i})) \odot \\ \mathcal{T}^{-1}(\mathcal{T}(S_{2,j}) \oplus \mathcal{D}_{2,j}(\vec{\theta}), \text{Origin}(S_{2,j})) \end{pmatrix} \quad (78)$$

when both operands of each $\odot$ operation are convex shapes.

From this, it can be seen that BD constraints that impose complex distance restrictions between the exterior surfaces of two shapes can be constructed, in a form similar to one of Equations (69) through (71), with the use of UEBSCA in combination with one or more distance spectrums.

We will now look at one way to use distance spectrums in combination with UIBSCA to form CIBSCA. Specifically, given two shapes, $S_1 = \cup_{i=1,m} S_{1,i}$ and $S_2 = \cup_{j=1,n} S_{2,j}$, and two sets of distance spectrums, $\mathcal{D}_{1,1}(\vec{\theta}), \ldots \mathcal{D}_{1,m}(\vec{\theta})$ and $\mathcal{D}_{2,1}(\vec{\theta}), \ldots \mathcal{D}_{2,n}(\vec{\theta})$ where $S_{1,1}, \ldots S_{1,m}$ and $S_{2,1}, \ldots S_{2,n}$ are all convex shapes and $\text{Origin}(S_2) = \text{Origin}(S_{2,1}) = \ldots = \text{Origin}(S_{2,n})$, we would like to determine the CIBSCA between the interior surface of $S_1$ and the exterior surface of $S_2$. To do this we will again rely on Equation (26) to transform an IBSCA problem into an EBSCA problem. To do this we begin by applying $\mathcal{D}_{1,1}(\vec{\theta}), \ldots \mathcal{D}_{1,m}(\vec{\theta})$ to $S_1 = \cup_{i=1,m} S_{1,i}$ $$S_1' = \cup_{i=1,m} \mathcal{T}^{-1}(\mathcal{T}(S_{1,i}) \ominus \mathcal{D}_{1,i}(\vec{\theta}), \text{Origin}(S_{1,i})) \tag{79}$$

then we invert $S_1'$ and decompose the resulting shape into a union of convex shapes $$\overline{S_1'} = S_3 = \cup_{k=1,q} S_{3,k} \tag{80}$$

Using this new set of convex shapes, $S_{3,1}, \ldots S_{3,q}$ we can form the CIBSCA of $S_1$ and $S_2$ as $$IB = S_1 \odot S_2 = \bigcup_{\substack{k=1,q \\ j=1,n}} (S_{3,k} \odot \mathcal{T}^{-1}(\mathcal{T}(S_{2,j}) \oplus \mathcal{D}_{2,j}(\vec{\theta}), \text{Origin}(S_{2,j}))) \tag{81}$$

From this, BD constraints that impose complex distance restrictions between the interior surface of one shape and the exterior surface of another can be constructed, in a form similar to one of Equations (72) through (74), with the use of IBSCA in combination with one or more distance spectrums.

Parameterized and Trivial Spectrums

To this point, for the sake of simplicity and clarity, we have focused on "simple spectrums". That is, shape spectrums and distance spectrums where NO additional parameters are used in the determination of the value returned by the function representing the shape spectrum or distance spectrum for a given direction. We can significantly increase the range of BD constraints that can be represented through the use of shape and distance spectrums with additional parameters, or "parameterized spectrums". That is, spectrums where additional parameters are used in the determination of the value returned by the function for a given direction. The expanded range of constraints includes, for example, constraints that can also control the size, orientation, or geometry of a shape.

We will refer to any shape or distance spectrum that produces values that are independent of the direction of interest as a "trivial" spectrum. Example of trivial shape spectrums include the simple shape spectrum of the unit circle with its origin located at the center of the circle: $S(\theta) = 1$, and the parameterized shape spectrum of a sphere of radius r whose origin is located at the center of the sphere:

$$S\left(\begin{bmatrix} \theta_1 \\ \theta_2 \end{bmatrix}, r\right) = r.$$

Axis Aligned Orthotopes

The above development can be significantly simplified for the case where we want to generate an EBSCA or IBSCA for a pair of n-dimensional axis-aligned (AA) orthotopes, whose origins are at the center of their respective shapes, subject to AA orthotopic boundary distance constraints. To do this we take advantage of the following two observations: first, the EBSCA and IBSCA of a pair of AA orthotopes subject to AA orthotopic boundary distance constraints are themselves n-dimensional AA orthotopes; second, the shape of an n-dimensional AA orthotope can be analytically represented using an n-dimensional superellipsoid.

Figure 7A:
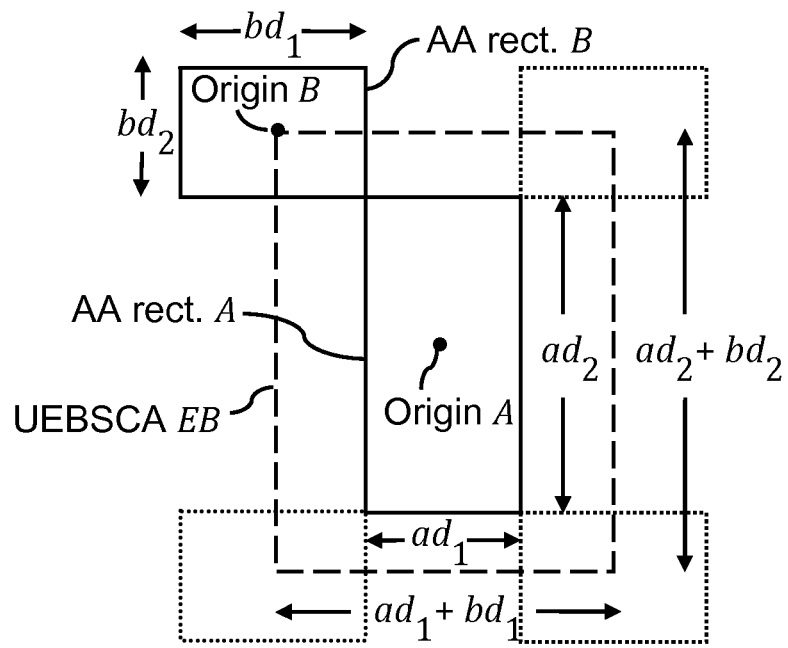
FIG. 7A-7B illustrate the geometric construction of the exterior boundary surface of closest approach between two axis aligned rectangles.

For the sake of clarity and brevity and without loss of generality, we will assume that for an n-dimensional AA orthotope, A, there is an n-dimensional vector, $\vec{AD} = [ad_1, \ldots ad_n]^T$, which contains the dimensions of A as measured along each of the coordinate axes between parallel pairs of faces. One skilled in the art will recognize that the dimensions of all AA orthotopes can be reduced to this form. Taking advantage of the first observation, we see that given two AA orthotopes, A and B, with origins $\vec{AO}$ and $\vec{BO}$ respectively, the dimensions of their UEBSCA, EB, are:

$$\vec{EBD} = \vec{AD} + \vec{BD} \tag{82}$$

as illustrated in FIG. 7A for the two-dimensional case.

Based on the second observation, consider the case of an n-dimensional AA orthotope, C, centered at the origin of the Cartesian coordinates system with dimensions $\vec{CD} = [cd_1, \ldots cd_n]^T$. The boundary of C can be analytically represented, using an n-dimensional superellipsoid, as $$\lim_{z_1, \ldots z_n \to \infty} \left( \sum_{i=1}^{n} \left| 2 \frac{x_i}{ad_i} \right|^{z_i} \right) = 1 \tag{83}$$

If we now offset C a distance $\vec{OD} = [od_1, \ldots od_n]^T$, its boundary can be analytically represented as $$\lim_{z_1, \ldots z_n \to \infty} \left( \sum_{i=1}^{n} \left| 2 \frac{x_i - od_i}{cd_i} \right|^{z_i} \right) = 1 \tag{84}$$

Combining Equations (82) and (84) with $\vec{OD} = \vec{AO}$, the boundary of the orthotope EB can be analytically represented as $$\lim_{z_1, \ldots z_n \to \infty} \left( \sum_{i=1}^{n} \left| 2 \frac{x_i - ao_i}{ad_i + bd_i} \right|^{z_i} \right) = 1 \tag{85}$$

or, in terms of a shape function for EB, $$EB(\vec{X}, \vec{O}) = \lim_{z_1, \ldots z_n \to \infty} \left( \sum_{i=1}^{n} \left| 2 \frac{x_i - o_i}{ad_i + bd_i} \right|^{z_i} \right) \tag{86}$$

Figure 7B:
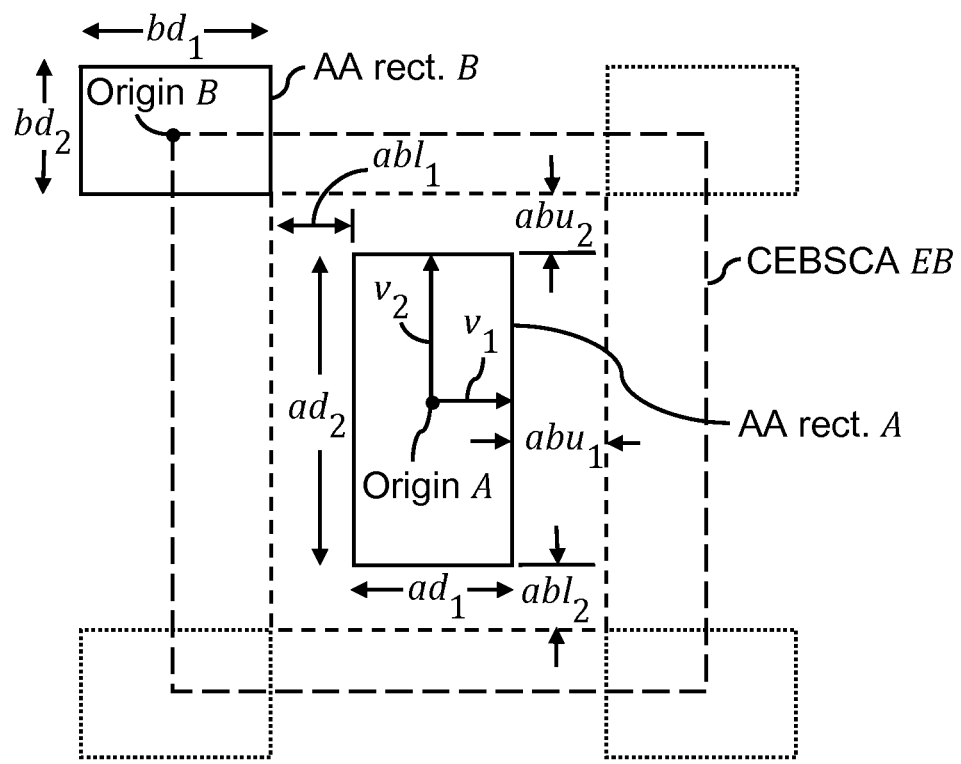

Again, for the sake of clarity and brevity and without loss of generality, we will assume that for a pair of n-dimensional AA orthotopes, A and B, there is a pair of n-dimensional vectors $\vec{ABU}$ and $\vec{ABL}$ where $\vec{ABU}$ contains the separation distances to be maintained between the "upper faces" of A and the adjacent faces of B and $\vec{ABL}$ contains the separation distances to be maintained between the "lower faces" of A and the adjacent faces of B. We define an upper face of A to be a face which intersects a vector, v, extending from $\vec{AO}$ parallel to one of the axes such that v points in the direction of increasing values along that axis, as illustrated in FIG. 7B for vectors $v_1$ and $v_2$. We define a lower face of A to be a face that is not an upper face. One skilled in the art will recognize that all AA orthotopic boundary distance constraints between AA orthotopes can be reduced to this form. We can generalize the analytical representation of the UEBSCA developed above to include upper and lower separation distances between A and B. This can be done by observing that the separation distances in effect adjust the origin and dimensions of A. That is, the origin of A is now effectively $$\vec{AO} + \frac{\vec{ABU} - \vec{ABL}}{2}$$

and the dimensions of A are now effectively $\vec{AD} + \vec{ABL} + \vec{ABU}$, as illustrated in FIG. 7B for the two-dimensional case. The resulting analytical representation of the CEBSCA, EB, which accounts for separation distances between A and B is $$\lim_{Z_1,\ldots Z_n \to \infty} \left( \sum_{i=1}^{n} \left| 2 \frac{x_i - \left( ao_i + \frac{abu_i - abl_i}{2} \right)}{ad_i + abu_i + abl_i + bd_i} \right|^{Z_i} \right) = 1 \quad (87)$$

or, in terms of a shape function for EB, $$\mathbb{EB}(\vec{X}, \vec{O}) = \lim_{Z_1,\ldots Z_n \to \infty} \left( \sum_{i=1}^{n} \left| 2 \frac{x_i - \left( o_i + \frac{abu_i - abl_i}{2} \right)}{ad_i + abu_i + abl_i + bd_i} \right|^{Z_i} \right) \quad (88)$$

Figure 8A:
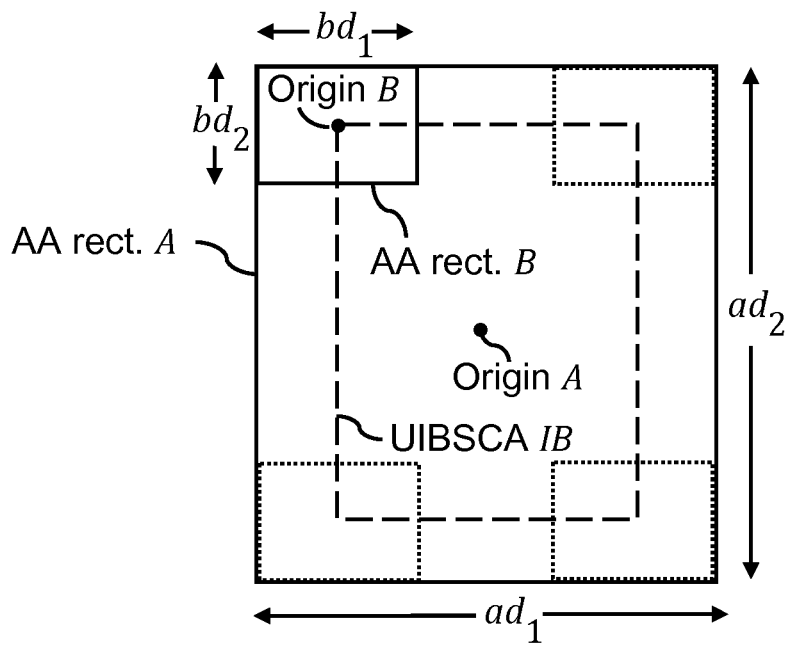
FIG. 8A-8B illustrate the geometric construction of the interior boundary surface of closest approach between two axis aligned rectangles.

In a similar manner, given two AA orthotopes, A and B, with origins $\vec{AO}$ and $\vec{BO}$ respectively, the dimensions of their UIBSCA, IB, are:

$$\vec{IBD} = \vec{AD} - \vec{BD} \quad (89)$$

as illustrated in FIG. 8A for the two-dimensional case.

Combining Equations (84) and (89) with $\vec{OD} = \vec{AO}$, the boundary of the orthotope IB can be analytically represented as $$\lim_{Z_1,\ldots Z_n \to \infty} \left( \sum_{i=1}^{n} \left| 2 \frac{x_i - ao_i}{ad_i - bd_i} \right|^{Z_i} \right) = 1 \quad (90)$$

or, in terms of a shape function for IB, $$\mathbb{IB}(\vec{X}, \vec{O}) = \lim_{Z_1,\ldots Z_n \to \infty} \left( \sum_{i=1}^{n} \left| 2 \frac{x_i - o_i}{ad_i - bd_i} \right|^{Z_i} \right) \quad (91)$$

Figure 8B:
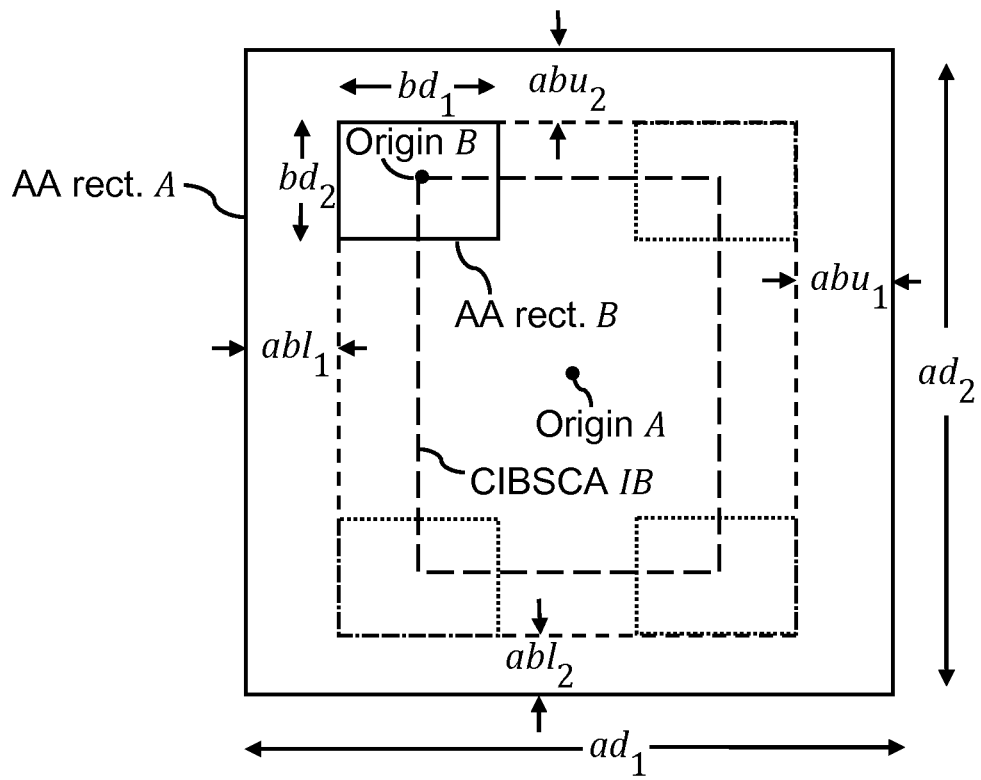

Again, we can generalize the analytical representation of the IBSCA developed above to include upper and lower separation distances between A and B by observing that the separation distances in effect adjust the origin and dimensions of A. That is, the origin of A is now effectively $$\vec{AO} + \frac{\vec{ABL} - \vec{ABU}}{2}$$

and its dimensions are now effectively $\vec{AD} - \vec{ABL} - \vec{ABU}$, as illustrated in FIG. 8B for the two-dimensional case. The resulting analytical representation of the CIBSCA, IB, which accounts for separation distances between A and B is $$\lim_{Z_1,\ldots Z_n \to \infty} \left( \sum_{i=1}^{n} \left| 2 \frac{x_i - \left( ao_i + \frac{abl_i - abu_i}{2} \right)}{ad_i - abu_i - abl_i - bd_i} \right|^{Z_i} \right) = 1 \quad (92)$$

or, in terms of a shape function for IB, $$\mathbb{IB}(\vec{X}, \vec{O}) = \lim_{Z_1,\ldots Z_n \to \infty} \left( \sum_{i=1}^{n} \left| 2 \frac{x_i - \left( o_i + \frac{abl_i - abu_i}{2} \right)}{ad_i - abu_i - abl_i - bd_i} \right|^{Z_i} \right) \quad (93)$$

Note that, as we would expect, Equations (86), (88), (91), and (93) are in the form of Equation (56) with q=n and p=0.

Direct Application of Analytical Composition

Figure 9A:
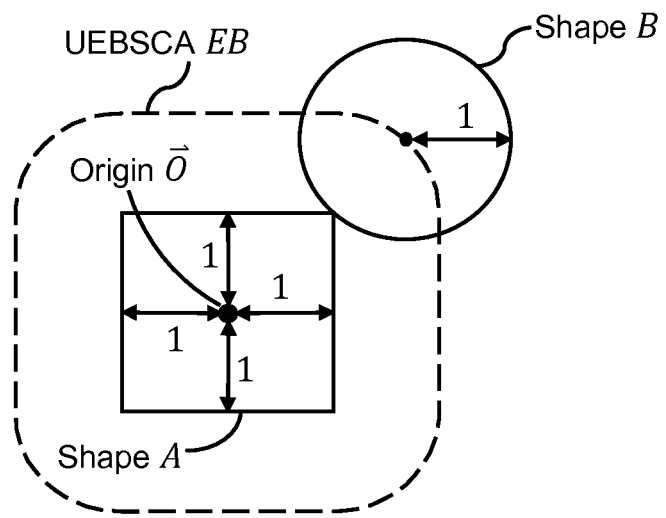
FIG. 9A-9B illustrate a method for determining an analytical shape function for the unconstrained exterior boundary surface of closest approach between a square and a circle using geometric construction and analytical union.
Figure 9B:
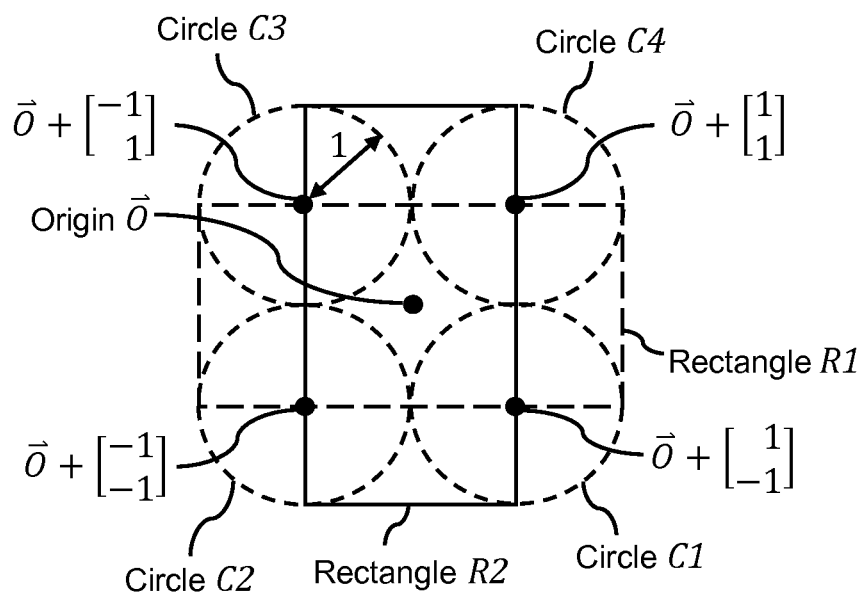

In cases where BSCAs can be deduced through inspection or simple geometric constructions and an analytical shape functions for the shapes involved are known, then analytical composition can be directly applied to construct an analytical shape function for the required BSCA. That is, we can apply analytical intersections, inversions and unions directly to the shape functions to construct an analytical shape function for the required BSCA. As an example of this approach consider the case illustrated in FIG. 9. In this case, as illustrated in FIG. 9A, we are interested in constructing the UEBSCA, EB, between a square, shape A, and a circle, shape B, where the square is two units wide by two units tall with its origin at its center and the circle has radius one with its origin at its center. From FIG. 9B we can see that EB=A⊙B can be determined as the union of six shapes: two overlapping rectangles, R1 and R2, and four circles, C1, C2, C3, and C4. The shape functions for the four circles can be represented as $$C1(\vec{X}, \vec{O}) = C1\left( \begin{bmatrix} x_1 \\ x_2 \end{bmatrix}, \begin{bmatrix} o_1 \\ o_2 \end{bmatrix} \right) = (x_1 - o_1 - 1)^2 + (x_2 - o_2 + 1)^2 \quad (94)$$

$$C2(\vec{X}, \vec{O}) = C2\left( \begin{bmatrix} x_1 \\ x_2 \end{bmatrix}, \begin{bmatrix} o_1 \\ o_2 \end{bmatrix} \right) = (x_1 - o_1 + 1)^2 + (x_2 - o_2 + 1)^2 \quad (95)$$

$$C3(\vec{X}, \vec{O}) = C3\left( \begin{bmatrix} x_1 \\ x_2 \end{bmatrix}, \begin{bmatrix} o_1 \\ o_2 \end{bmatrix} \right) = (x_1 - o_1 + 1)^2 + (x_2 - o_2 - 1)^2 \quad (96)$$

$$C4(\vec{X}, \vec{O}) = C4\left( \begin{bmatrix} x_1 \\ x_2 \end{bmatrix}, \begin{bmatrix} o_1 \\ o_2 \end{bmatrix} \right) = (x_1 - o_1 - 1)^2 + (x_2 - o_2 - 1)^2 \quad (97)$$

and, using superellipses, the two rectangles can be represented as $$R1(\vec{X}, \vec{O}) = R1\left( \begin{bmatrix} x_1 \\ x_2 \end{bmatrix}, \begin{bmatrix} o_1 \\ o_2 \end{bmatrix} \right) = \lim_{Z \to \infty} \left( \left| \frac{x_1 - o_1}{2} \right|^Z + |x_2 - o_2|^Z \right) \quad (98)$$

$$R2(\vec{X}, \vec{O}) = R2\left( \begin{bmatrix} x_1 \\ x_2 \end{bmatrix}, \begin{bmatrix} o_1 \\ o_2 \end{bmatrix} \right) = \lim_{Z \to \infty} \left( |x_1 - o_1|^Z + \left| \frac{x_2 - o_2}{2} \right|^Z \right) \quad (99)$$

Using an analytical union we can construct an analytical shape function for EB=A⊙B as $$EB(\vec{X}, \vec{O}) = \lim_{R\to\infty} \left( \begin{array}{c} \complement 1(\vec{X}, \vec{O})^{-R} + \complement 2(\vec{X}, \vec{O})^{-R} + \complement 3(\vec{X}, \vec{O})^{-R} + \\ \complement 4(\vec{X}, \vec{O})^{-R} + \Re 1(\vec{X}, \vec{O})^{-1} + \Re 2(\vec{X}, \vec{O})^{-1} \end{array} \right)^{-1} \quad (100)$$

Gradient Shaping

We will now address the second obstacle as previously discussed. The need for an analytical representation of a BD constraint, or its approximation, that promotes efficient operation of an analytical optimizer on a BDCA problem.

To illustrate why some analytical shape functions can prevent an analytical optimizer from operating efficiently, consider, for example, an analytical BD constraint function produced using Equations (37), (39), and (56). Specifically, there are three sets of exponents, $\mathfrak{A}$, $\mathfrak{R}$, and $\mathfrak{Z}$, associated with this constraint function: the set $\mathfrak{A}$ contains all intersection exponents from the use of Equation (37); the set $\mathfrak{R}$ contains all union exponents from the use of Equation (39); and the set $\mathfrak{Z}$ contains all the PHS exponents from the use of Equation (56). Further, by selecting the values of the exponents in each of $\mathfrak{A}$, $\mathfrak{R}$, and $\mathfrak{Z}$, large enough we can get a constraint that comes arbitrarily close to the required BD constraint. However, while this gives the necessary analytical BD constraint function, the form of this function makes it difficult to use in an analytical optimization method. This is due to the fact that the most common analytical optimization methods are based on the use of local quadratic approximation of the functions describing the optimization problem. For problems that can be well approximated over large neighborhoods using quadratic equations, these methods will operate efficiently. For problems with one or more functions that are not well approximated over large neighborhoods by quadratic equations, these methods can become very inefficient.

For cases where the accuracy of this analytical BD constraints is dependent on selecting large values for the exponents, we can see that an accurate analytical BD constraint cannot be well approximated by a quadratic equation over large neighborhoods.

To illustrate the issue consider the case where we have an analytical BD constraint based on the UEBSCA between two unit squares, A and B, with each having its origin at the center of the square. A shape function for EB=A⊙B is $$EB(\vec{X}, \vec{O}) = \lim_{Z\to\infty} (|x_1 - o_1|^Z + |x_2 - o_2|^Z) \quad (101)$$

Figure 10A:
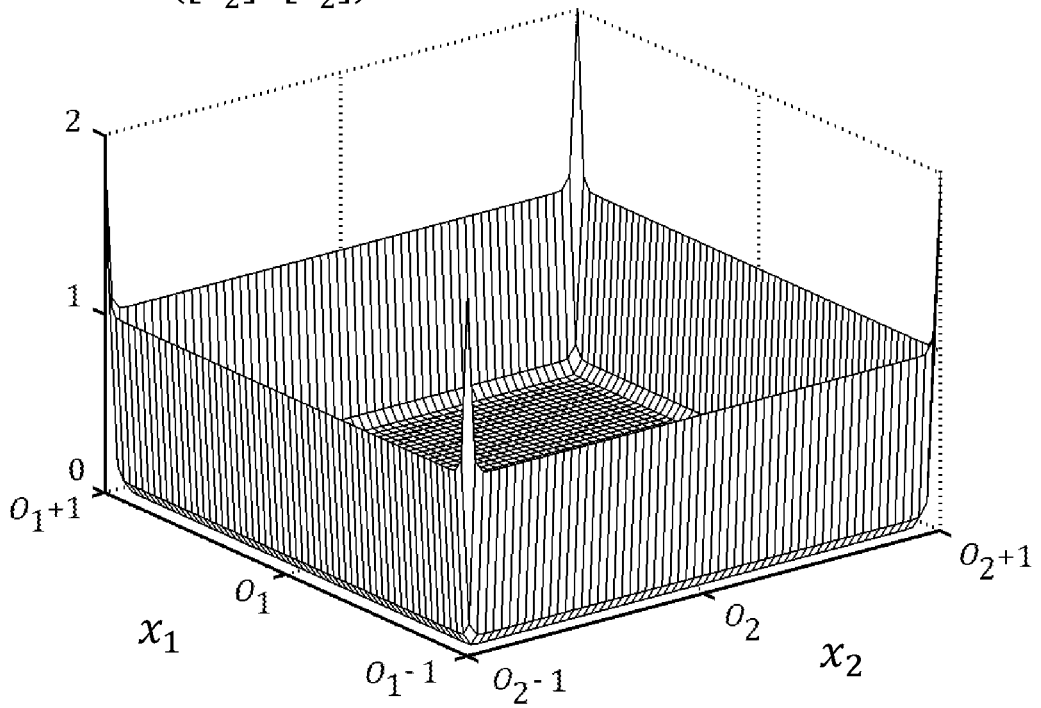
FIG. 10A-10B illustrate the effects of exponent gradient shaping.

Plotting $(|x_1-o_1|^Z+|x_2-o_2|^Z)$ for Z=75 in FIG. 10A we can see that we get the desired rectangular shape for the boundary values of $(|x_1-o_1|^Z+|x_2-o_2|^Z)=1$, however, we also get several other undesirable characteristics as well. In particular, $(|x_1-o_1|^Z+|x_2-o_2|^Z)$ become "box" shaped as Z→∞. That is, its surfaces are either close to horizontal, with gradient magnitudes very close to zero, or vertical, with gradient magnitudes approaching infinity. Further aggravating the situation is the fact that there is a very sharp transition between these two extremes. To eliminate these undesirable characteristics while retaining the desirable ones we will use "gradient shaping".

Definition 17:

A gradient shaping transformation, or for brevity gradient shaping, transforms a shape function, $\mathbb{S}(\vec{x}, \vec{o})$, of a shape, S, into another shape function, $S_{gs}(\vec{X}, \vec{O})$, for the shape S.

We define "trivial" or "affine" gradient shaping as $$S_{gs}(\vec{X}, \vec{O}) = kS_{gs}(\vec{X}, \vec{O}) + k_1 \quad (102)$$

where k and $k_1$ are constants such that Equation (102) satisfies Definition 17. Further, we define "nontrivial" gradient shaping as all forms of gradient shaping which are not trivial gradient shaping.

We define "exponent" gradient shaping as $$S_{gs}(\vec{X}, \vec{O}) = kS_{gs}(\vec{X}, \vec{O})^{k_1} + k_2 \quad (103)$$

where k, $k_1$, and $k_2$ are constants such that Equation (103) satisfies Definition 17 and $k_1 \neq 1$. As an example of how to use exponent gradient shaping to eliminate undesirable characteristics in a shape function consider again Equation (101). By selecting k=1, $$k_1 = \frac{2}{Z},$$

and $k_2=0$ we have $$\mathbb{EB}_{gs}(\vec{X}, \vec{O}) = (\mathbb{EB}(\vec{X}, \vec{O}))^{\frac{2}{Z}} = \lim_{Z\to\infty} \left( (|x_1 - o_1|^Z + |x_2 - o_2|^Z)^{\frac{2}{Z}} \right) \quad (104)$$

Figure 10B:
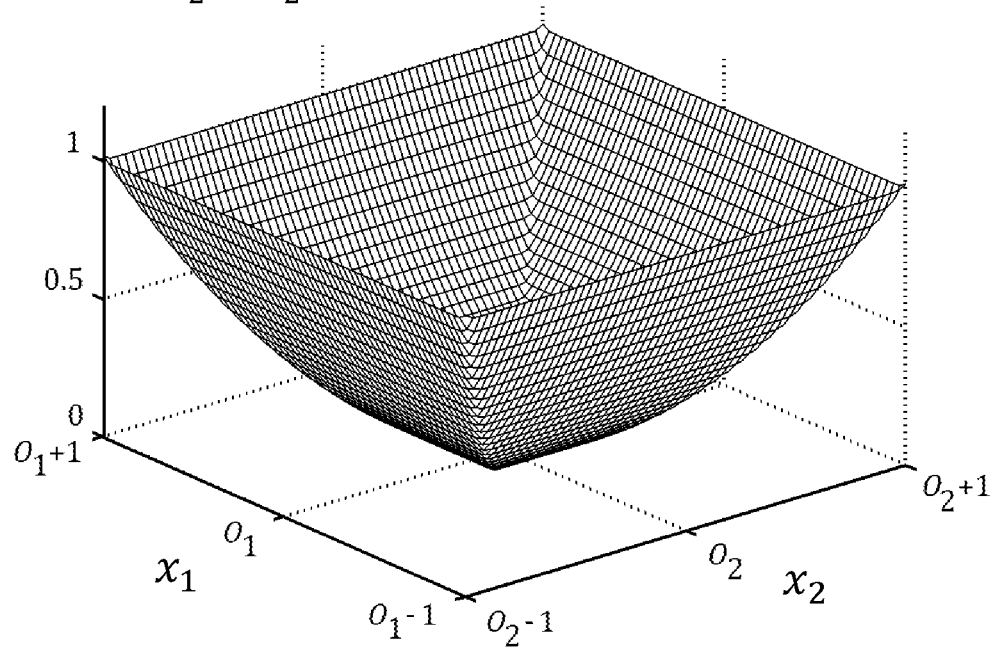

The plot in FIG. 10B illustrates the effect of this gradient shaping when Z=75. It can be seen that the undesirable gradient characteristics have been eliminated while retaining the desired rectangular shape for boundary values of $$(|x_1 - o_1|^Z + |x_2 - o_2|^Z)^{\frac{2}{Z}} = 1.$$

As a result, the form of Equation (104) is better suited for use in an analytical optimization environment.

We define "logarithmic" gradient shaping as $$S_{gs}(\vec{X}, \vec{O}) = k \log (S_{gs}(\vec{X}, \vec{O})) + k_1 \quad (105)$$

where k and $k_1$ are constants such that Equation (105) satisfies Definition 17. As an example of how to use logarithmic gradient shaping to eliminate undesirable characteristics in shape functions consider again Equation (101). By selecting $$k = \frac{1}{Z}$$

and $k_1=0$ we have $$\mathbb{EB}_{gs}(\vec{X}, \vec{O}) = \frac{\log(\mathbb{EB}(\vec{X}, \vec{O}))}{Z} = \lim_{Z\to\infty} \left( \frac{\log(|x_1 - o_1|^Z + |x_2 - o_2|^Z)}{Z} \right) \quad (106)$$

where $\mathbb{EB}_{gs}(\vec{X}, \vec{O})$ is now defined in terms of the mapping in Equations (34), (35) and (36).

Finally, for the sake of brevity and convenience we will, when needed, indicate the values of the constants associated with a given type of gradient shaping as a list which precedes its name. For example, exponent gradient shaping where k=1, $$k_1 = \frac{2}{z},$$

and $k_2=0$ would be referred to as $$\text{``}\{1, \frac{2}{z}, 0\}$$

exponent gradient shaping".

Solution Quality

We will now address the third obstacle as previously discussed. The need for a method which can both improve the probability of an analytical optimizer finding an arrangement that satisfies the BD constraints and, when the BDCA problem contains an objective to be optimized, improving the probability of finding a high quality solution.

Definition 18:

The results produced by an analytical optimizer which solves an instance of a BDCA problem are referred to as a solution to the BDCA problem. If the results satisfy all BD constraints of the BDCA problem and the results also satisfy all non-BD constraints, if any, of the BDCA problem, then this solution is referred to as a successful solution. If the analytical optimizer is unable to satisfy one or more constraints then the solution is referred to as a failed solution or an unsuccessful solution.

One potential cause of failed solutions and poor quality successful solutions can be attributed to certain shape characteristics such as, for example, flat sides. Another potential cause of failed solutions or poor quality successful solutions can be attributed to shape functions, $s(\vec{x}, \vec{o})$, which are nonconvex functions of $\vec{x}$. Either of these circumstances can lead to BD constraints that can cause an analytical optimizer to become trapped at either a failed solution, or a poor quality successful solution. When these or other "traps" are present we can use an iterative optimization approach to try and "search around" the traps and either increase the probability of arriving at a successful solution or increase the probability of getting a high quality successful solution.

One way to do this is to have each iteration consist of using an analytical optimizer to solve an approximation of the BDCA problem. Each iteration uses the results of the previous iterations and a set of initial values to generate a set of values that the optimizer can use to determine an initial estimate, or starting point, for the solution to the current approximation of the BDCA problem. The approximation of the BDCA problem for each iteration is determined by replacing one or more of the BD constraints with an approximation of those constraints. In particular, we want to approximate those BD constraints that poses the characteristics which tend to cause the optimizer to become trapped at a failed solution or a poor quality successful solution. More specifically, for the iterations near the beginning of the process, we want to use approximations that minimize or eliminate the problematic characteristics and then, as the iterative process progresses, gradually reintroduce the problematic characteristic into each BD constraint approximation such that the final iteration consists of an acceptably accurate approximation of the original BDCA problem.

As an example of how this type of approach might work, consider a BDCA problem with a nonoverlap orthotopic BD constraint between two AA orthotopes. Using Equation (86) or (88) and exponent gradient shaping we can determine the necessary analytical constraint function to enforce this nonoverlap constraint, however, if we then try to enforce this BD constraint in a single iteration using large values for the exponents, $Z_i$, the resulting solution to the BDCA problem is likely to be of poor quality due to the interaction of the flat sides of the orthotopes. To improve the probability of getting a high quality solution to the BDCA problem we could start by attempting to solve the BDCA problem using small values for the exponents, say a value of three. We then use a successful solution, if there is one, as the starting point for solving the same BDCA problem using larger values for the exponents, say ten times their previous values. This process would continue until we either successfully solve the BDCA problem with sufficiently large values for the exponents, say a value that equals or exceeds 3000, such that we have successfully solved the BDCA problem with a acceptably accurate approximation of the BD constraint or we determine that we cannot find a successful solution due to an iteration producing a failed solution.

Figure 11A:
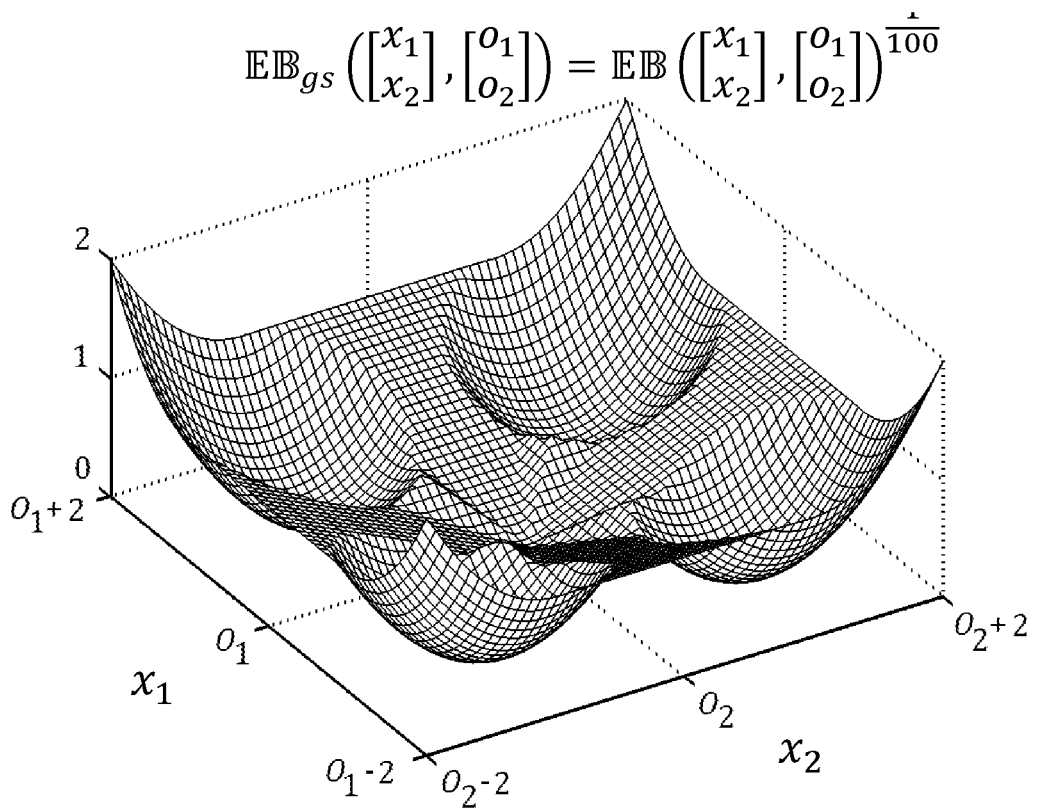
FIG. 11A-11B illustrate a nonconvex shape function and a convex approximation of that shape function.
Figure 11B:
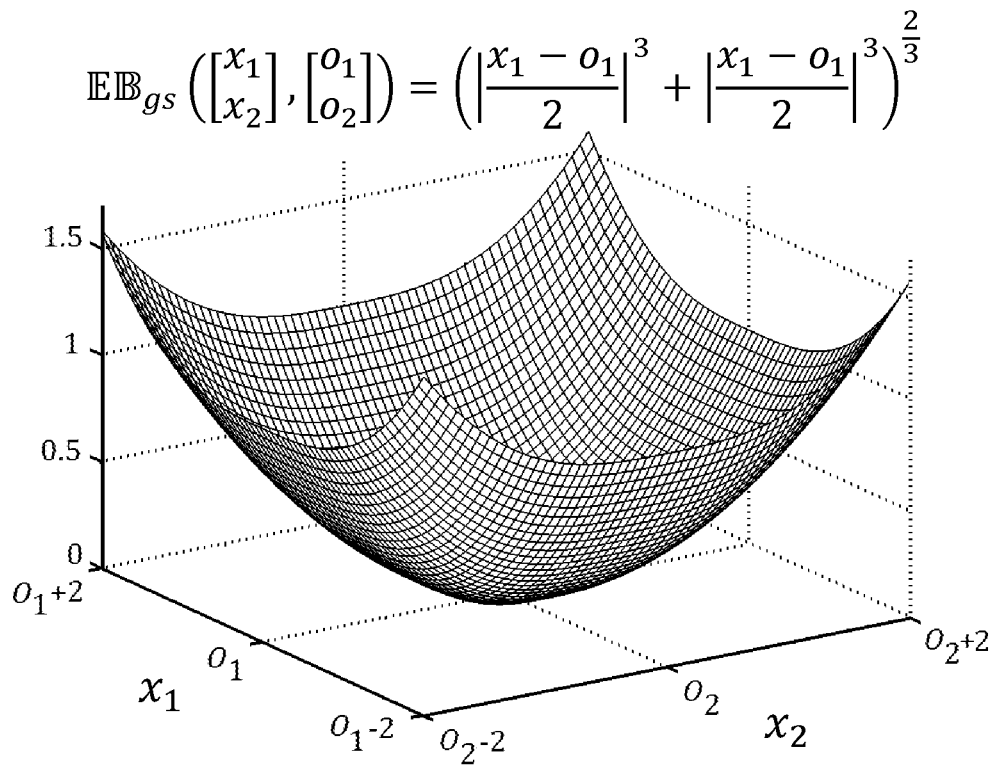

As a second example of how this type of approach might work, consider a BDCA problem with a nonoverlap BD constraint between a square, shape A, and a circle, shape B, where the square is two units wide by two units tall with its origin at its center and the circle has radius one with its origin at its center, as illustrated in FIG. 9A. Using geometric construction and analytical union we can construct a shape function for this BD constraint in the form of Equation (100). Selecting R=Z=100 and applying $$\{1, \frac{1}{100}, 0\}$$

exponent gradient shaping produces a gradient shaped shape function which is illustrated in FIG. 11A. From this figure it is not hard to see that this shape function is nonconvex in $\vec{x}$ and, in particular, has four local maxima in the Interior (EB) located at $$\begin{bmatrix} o_1 + 0.5 \\ o_2 + 0.5 \end{bmatrix}, \begin{bmatrix} o_1 - 0.5 \\ o_2 + 0.5 \end{bmatrix}, \begin{bmatrix} o_1 + 0.5 \\ o_2 - 0.5 \end{bmatrix}, \text{ and } \begin{bmatrix} o_1 - 0.5 \\ o_2 - 0.5 \end{bmatrix}$$

respectively. These local maxima can lead to a failed solution to the BDCA problem when the problem is solved using a single iteration based on this shape function. Additionally, any successful solution to this BDCA problem may be of poor quality due to the flat sides of shape A. One way to overcome these issues and improve the probability of a high quality successful solution is to solve the BDCA problem using a sequence of two iterations. In the first iteration shape B can be approximated as an AA square of height and width two with its origin at its center. Using Equation (86) with each exponent, $Z_i$, set to three and $$\{1, \frac{2}{3}, 0\}$$

exponent gradient shaping we can generate a shape function, illustrated in FIG. 11B, which approximates the shape function of FIG. 11A while eliminating its undesirable characteristics. After solving the BDCA problem using the approximate shape function of FIG. 11B we can then use a successful solution, if there is one, as the starting point for the second iteration in the sequence which solves the BDCA problem using the shape function of FIG. 11A.

Methods

Generalizing the ideas presented in the preceding sections, a method for solving a BDCA problem is comprised of an iterative process which uses analytical optimization to solve a sequence of one or more exact or approximate analytical representations of the BDCA problem where all the information used by or generated in each iteration of the sequence is available for use in any subsequent iteration in the sequence. One or more boundary distance constraints for each exact or approximate analytical representation of the BDCA problem are represented as functions which are exact or approximate analytical representations of those constraints constructed using zero or more gradient shaping transformations and one or more of the following: (1) one or more external boundary surface of closest approach where each external boundary surface of closest approach is formed from two shapes and, optionally, additional boundary distance constraints between the shapes and is determined using the addition of two or three functions where one of the three functions represents the first shape and another function represents the second shape and, optionally, a third function represents the additional boundary distance constraints between the shapes; (2) one or more analytical compositions; or (3) one or more superellipsoid shape function approximations for the interior or exterior boundary surface of closest approach between a pair of axis aligned orthotopes with axis-aligned orthotopic boundary distance constraints. For each iteration in the sequence, the analytical optimizer may be provided with an initial estimate of one or more optimization variables. These estimates are derived from the results of one or more of the previous iterations and optionally a set of one or more values that may be encoded into or provided to the method. A successful solution can be generated by the method when an iteration generates a successful solution to an acceptably accurate analytical representation to the BDCA problem.

Figure 12:
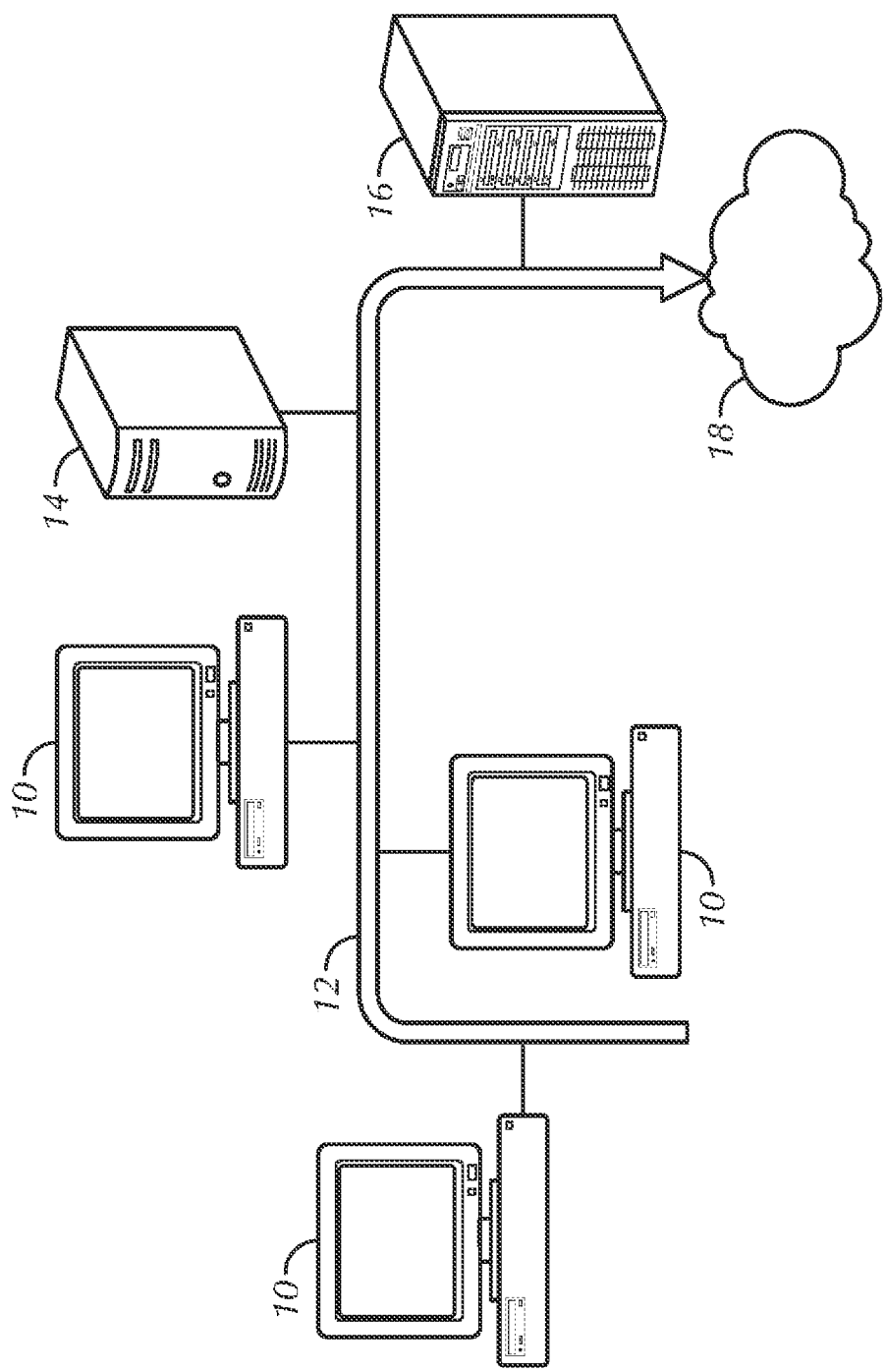
FIG. 12 illustrates a typical networked computer environment in which the invention would operate.

FIG. 12 illustrates the use of the present invention in a typical networked environment. The claimed invention is a software program that runs on one or more workstations 10 that may be in a networked environment. The various workstations 10 couple to a network 12 where they may communicate with each other. Additionally, the networked environment may include a shared storage device 14 and a network server 16. And, the networked environment may couple to the Internet 18. In addition to being able to operate on one or more workstations 10, the invention may use the resources of the shared storage device 14 and the network server 16. The invention may also use resources available through the Internet 18. One embodiment of the invention uses a LINUX based standalone workstation 10 and uses the FORTRAN programming language. One skilled in the arts will appreciate the invention can be implemented using other programming languages and that it may be hosted on other operating systems.

FIG. 13A illustrates a first embodiment of a method to search for arrangements of shapes with boundary distance constraints among those shapes. This embodiment includes constructing 110, for one or more boundary distance constraints, functions which are exact or approximate analytical representations of those constraints using zero or more gradient shaping transformations and one or more of the following: (1) one or more external boundary surface of closest approach where each external boundary surface of closest approach is formed from two shapes and, optionally, additional boundary distance constraints between the shapes and is determined using the addition of two or three functions where one of the three functions represents the first shape and another function represents the second shape and, optionally, a third function represents the additional boundary distance constraints between the shapes; (2) one or more analytical compositions; or (3) one or more superellipsoid shape function approximations for the interior or exterior boundary surface of closest approach between a pair of axis aligned orthotopes with axis-aligned orthotopic boundary distance constraints. In addition this embodiment includes constructing 120 an analytical optimization problem which incorporates the constraint functions of 110 and which is an exact or approximate representation of a boundary distance constrained arrangement problem. Additionally, this embodiment includes selecting 130 the initial values of one or more optimization variables. Further, this embodiment includes solving 140 the optimization problem constructed in 120 using one or more analytical optimization methods and one or more of the initial values of 130. Further, this embodiment includes a sequencing structure 150 that, when used, causes the enclosed elements to be executed two or more times where the multiple executions of the enclosed steps can be accomplished using enumerated sequences or iterative looping structures, or any combination of both where each execution of 110 through 140 may use any information generated in or used by previous executions of 110 through 140.

FIG. 13B illustrates a second embodiment of a method to search for arrangements of shapes with boundary distance constraints among those shapes. This embodiment includes constructing 210, for one or more boundary distance constraints, functions which are exact or approximate analytical representations of those constraints using zero or more gradient shaping transformations and one or more of the following: (1) one or more external boundary surface of closest approach where each external boundary surface of closest approach is formed from two shapes and, optionally, additional boundary distance constraints between the shapes and is determined using the addition of two or three functions where one of the three functions represents the first shape and another function represents the second shape and, optionally, a third function represents the additional boundary distance constraints between the shapes; (2) one or more analytical compositions; or (3) one or more superellipsoid shape function approximations for the interior or exterior boundary surface of closest approach between a pair of axis aligned orthotopes with axis-aligned orthotopic boundary distance constraints. Further, this embodiment includes constructing 215 one or more constraint functions which relate one or more boundary distance constraint parameters and/or optimization variables in terms of other parameters, optimization variables and/or constants. In addition this embodiment includes constructing 220 an analytical optimization problem which incorporates the constraint functions of 210 and 215 which is an exact or approximate representation of a boundary distance constrained arrangement problem. Additionally, this embodiment includes selecting 230 the initial values of one or more optimization variables. Further, this embodiment includes solving 240 the optimization problem constructed in 220 using one or more analytical optimization methods and one or more of the initial values of 230. Further, this embodiment includes a sequencing structure 250 that, when used, causes the enclosed elements to be executed two or more times where the multiple executions of the enclosed steps can be accomplished using enumerated sequences or iterative looping structures, or any combination of both where each execution of 210 through 240 may use any information generated in or used by previous executions of 210 through 240.

EXAMPLES

To illustrate the use of these methods we will, without loss of generality, consider four examples. The first three will demonstrate their use on shapes represented using DR shape spectrums and the fourth will demonstrate their use on shapes represented using shape spectrums.

Example 1

Figure 14:
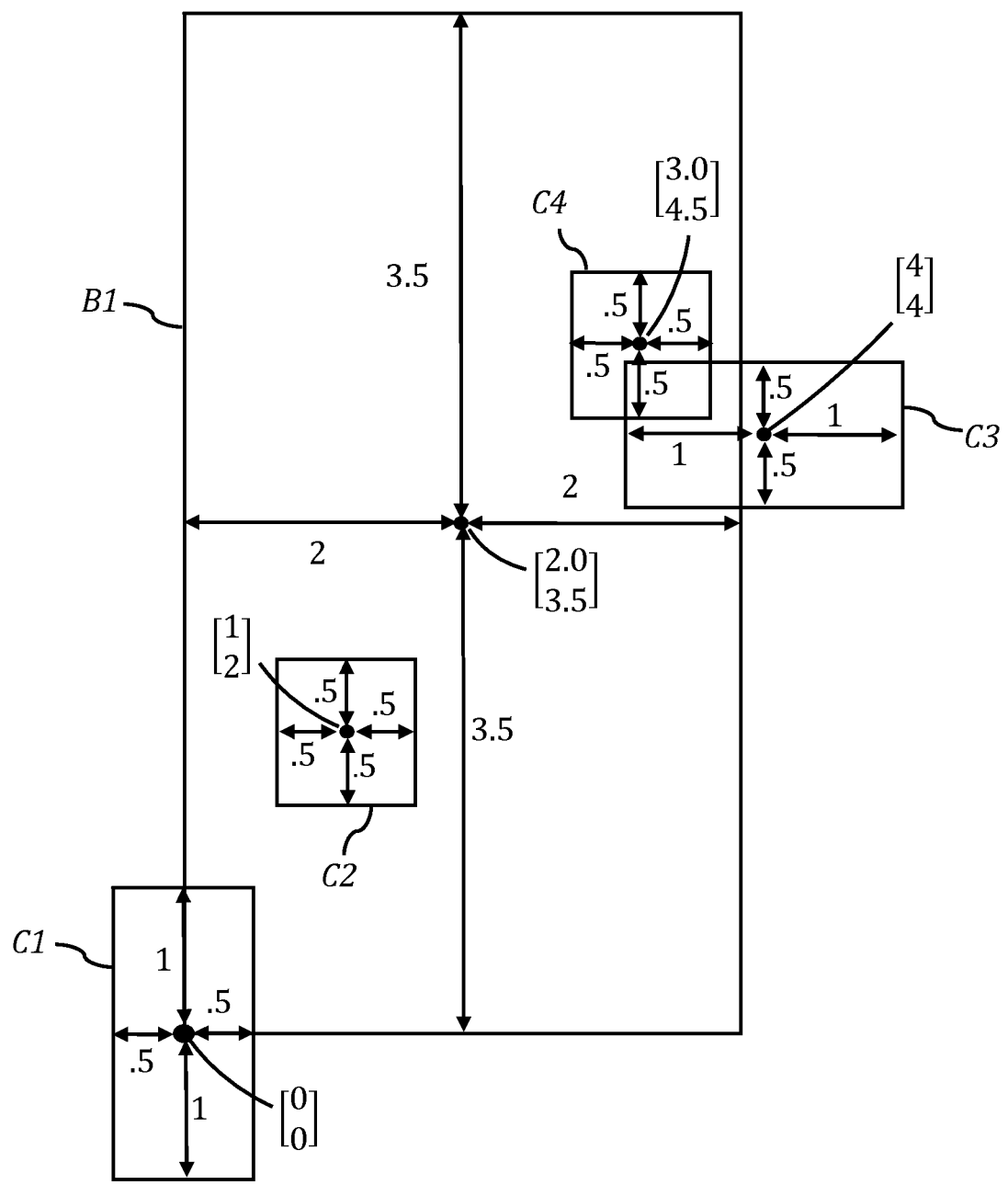
FIG. 14 illustrates the location and size of four circuit blocks relative to the size and location of a placement boundary.

This example will illustrate the use of the method outlined in the flow chart of FIG. 13A. It is an arrangement problem used in the manufacture of VLSI circuits and is based on the example illustrated in FIG. 14. In this example, as shown in FIG. 14, we have four circuit blocks, labeled C1, C2, C3, and C4, and a fixed boundary, labeled B1, along with their DR shape spectrums and origins. We want all four circuit blocks to be entirely contained in boundary B1 such that there is a minimum spacing of one tenth (0.1) of a unit between the adjacent sides of any adjacent circuit blocks. From FIG. 14 we have that:

C1 is one unit wide and two units tall with its origin initially located at $$\begin{bmatrix} 0 \\ 0 \end{bmatrix}$$

and a DR shape spectrum:

$$\mathcal{C}1(\theta) = \begin{cases} 0.5 & \theta = 0° \\ 1.0 & \theta = 90° \\ 0.5 & \theta = 180° \\ 1.0 & \theta = 270° \end{cases} \quad (107)$$

C2 is one unit wide and one unit tall with its origin initially located at $$\begin{bmatrix} 1 \\ 2 \end{bmatrix}$$

and a DR shape spectrum:

$$\mathcal{C}2(\theta) = \begin{cases} 0.5 & \theta = 0° \\ 0.5 & \theta = 90° \\ 0.5 & \theta = 180° \\ 0.5 & \theta = 270° \end{cases} \quad (108)$$

C3 is two units wide and one unit tall with its origin initially located at $$\begin{bmatrix} 4 \\ 4 \end{bmatrix}$$

and a DR shape spectrum:

$$\mathcal{C}3(\theta) = \begin{cases} 1.0 & \theta = 0° \\ 0.5 & \theta = 90° \\ 1.0 & \theta = 180° \\ 0.5 & \theta = 270° \end{cases} \quad (109)$$

C4 is one unit wide and one unit tall with its origin initially located at $$\begin{bmatrix} 3.0 \\ 4.5 \end{bmatrix}$$

and a DR shape spectrum:

$$\mathcal{C}4(\theta) = \begin{cases} 0.5 & \theta = 0° \\ 0.5 & \theta = 90° \\ 0.5 & \theta = 180° \\ 0.5 & \theta = 270° \end{cases} \quad (110)$$

B1 is four units wide and seven units tall with its origin fixed at $$\begin{bmatrix} 2.0 \\ 3.5 \end{bmatrix}$$

and a DR shape spectrum:

$$\mathcal{B}1(\theta) = \begin{cases} 2.0 & \theta = 0° \\ 3.5 & \theta = 90° \\ 2.0 & \theta = 180° \\ 3.5 & \theta = 270° \end{cases} \quad (111)$$

For ease of understanding and without loss of generality, we will assume that this arrangement problem has no other objectives or constraints. This means that the objective function will be a constant and the optimization variables will be the location of the origin of each circuit block, $$\begin{bmatrix} x_1 \\ y_1 \end{bmatrix}, \begin{bmatrix} x_2 \\ y_2 \end{bmatrix}, \begin{bmatrix} x_3 \\ y_3 \end{bmatrix} \text{ and } \begin{bmatrix} x_4 \\ y_4 \end{bmatrix}.$$

From the geometry of each circuit block and the minimum spacing requirement, one set of implicit distance spectrums that captures the minimum spacing requirements between the circuit blocks is $$\mathcal{D}_{C1}(\theta) = \mathcal{D}_{C2}(\theta) = \mathcal{D}_{C3}(\theta) = \mathcal{D}_{C4}(\theta) = \begin{cases} 0.05 & \theta = 0° \\ 0.05 & \theta = 90° \\ 0.05 & \theta = 180° \\ 0.05 & \theta = 270° \end{cases} \quad (112)$$

Based on the flow chart of FIG. 13A, step 110 will generate ten constraints, six to enforce the distance constraints between the four circuit blocks, and four to enforce the requirement that all the circuit blocks must be entirely contained within boundary B1.

The first of the six constraints between the four circuit blocks is generated as follows:

We begin by applying the distance spectrums to the shape spectrums for C1 and C2 as:

$$\mathcal{C}_{1D}(\theta) = \oplus 1(\theta) \oplus \mathcal{D}_{C1}(\theta) \quad (113)$$

$$\mathcal{C}_{2D}(\theta) = \oplus 2(\theta) \oplus \mathcal{D}_{C2}(\theta) \quad (114)$$

We can then determine the DR shape spectrum for the EBSCA for C1 and C2, accounting for distance spectrums $\mathcal{D}_{C1}(\theta)$ and $\mathcal{D}_{C2}(\theta)$, as:

$$\mathcal{EB}(\theta) = \mathcal{C}_{1D}(\theta) + \mathcal{C}_{2D}(\theta) = \begin{cases} 1.1 & \theta = 0° \\ 1.6 & \theta = 90° \\ 1.1 & \theta = 180° \\ 1.6 & \theta = 270° \end{cases} \quad (115)$$

We can then generate affine functions for the DR shape spectrum of Equation (115). Since the spectrum is symmetric we only need to generate two affine functions whose coefficients are:

$$\vec{K}_{0°} = \frac{2}{\mathcal{EB}(0°+180°)+\mathcal{EB}(0°)}\begin{bmatrix}\cos(0°)\\\sin(0°)\end{bmatrix} = \frac{2}{2.2}\begin{bmatrix}1\\0\end{bmatrix} \quad (116)$$

$$K_{0°} = -\vec{K}_{0°}^T\begin{bmatrix}x_1\\y_1\end{bmatrix} + \frac{\mathcal{EB}(0°+180°)-\mathcal{EB}(0°)}{\mathcal{EB}(0°+180°)+\mathcal{EB}(0°)} = -\frac{2}{2.2}x_1$$

$$\vec{K}_{90°} = \frac{2}{\mathcal{EB}(90°+180°)+\mathcal{EB}(90°)}\begin{bmatrix}\cos(90°)\\\sin(90°)\end{bmatrix} = \frac{2}{3.2}\begin{bmatrix}0\\1\end{bmatrix} \quad (117)$$

$$K_{90°} = -\vec{K}_{90°}^T\begin{bmatrix}x_1\\y_1\end{bmatrix} + \frac{\mathcal{EB}(90°+180°)-\mathcal{EB}(90°)}{\mathcal{EB}(90°+180°)+\mathcal{EB}(90°)} = -\frac{2}{3.2}y_1$$

We can then generate shape functions for these affine functions as $$\mathcal{Q}_{0°}\left(\begin{bmatrix}x\\y\end{bmatrix},\begin{bmatrix}x_1\\y_1\end{bmatrix}\right) = \left|\vec{K}_{0°}^T\begin{bmatrix}x\\y\end{bmatrix}+K_{0°}\right| = \left|\frac{2(x-x_1)}{2.2}\right| \quad (118)$$

$$\mathcal{Q}_{90°}\left(\begin{bmatrix}x\\y\end{bmatrix},\begin{bmatrix}x_1\\y_1\end{bmatrix}\right) = \left|\vec{K}_{90°}^T\begin{bmatrix}x\\y\end{bmatrix}+K_{90°}\right| = \left|\frac{2(y-y_1)}{3.2}\right| \quad (119)$$

followed by an analytical intersection to form the shape function $$\mathcal{S}\left(\begin{bmatrix}x_2\\y_2\end{bmatrix},\begin{bmatrix}x_1\\y_1\end{bmatrix}\right) = \lim_{Z\to\infty}\left(\mathcal{Q}_{0°}\left(\begin{bmatrix}x_2\\y_2\end{bmatrix},\begin{bmatrix}x_1\\y_1\end{bmatrix}\right)^Z + \mathcal{Q}_{90°}\left(\begin{bmatrix}x_2\\y_2\end{bmatrix},\begin{bmatrix}x_1\\y_1\end{bmatrix}\right)^Z\right) \quad (120)$$

$$= \lim_{Z\to\infty}\left(\left|\frac{2(x_2-x_1)}{2.2}\right|^Z + \left|\frac{2(y_2-y_1)}{3.2}\right|^Z\right)$$

We can then apply $$\left\{1, \frac{2}{Z}, 0\right\}$$

exponent gradient shaping to Equation (120).

$$\mathcal{S}_{gs}\left(\begin{bmatrix}x_2\\y_2\end{bmatrix},\begin{bmatrix}x_1\\y_1\end{bmatrix}\right) = \lim_{Z\to\infty}\left(\left(\left|\frac{2(x_2-x_1)}{2.2}\right|^Z + \left|\frac{2(y_2-y_1)}{3.2}\right|^Z\right)^{\frac{2}{Z}}\right) \quad (121)$$

Based on Equation (121), and using a value of Z=3 for the first iteration of the sequence, we can then generate an analytical approximation of the non-overlap constraint function between C1 and C2 as $$\left(\left|\frac{2(x_2-x_1)}{2.2}\right|^3 + \left|\frac{2(y_2-y_1)}{3.2}\right|^3\right)^{\frac{2}{3}} > 1 \quad (122)$$

Repeating this process five more times on the remaining pairs of circuit blocks gives the following six analytical approximations of the nonoverlap constraint functions for the first iteration of the sequence:

$$\left(\left|\frac{2(x_2-x_1)}{2.2}\right|^3 + \left|\frac{2(y_2-y_1)}{3.2}\right|^3\right)^{\frac{2}{3}} > 1 \quad (123)$$

$$\left(\left|\frac{2(x_3-x_1)}{3.2}\right|^3 + \left|\frac{2(y_3-y_1)}{3.2}\right|^3\right)^{\frac{2}{3}} > 1 \quad (124)$$

$$\left(\left|\frac{2(x_4-x_1)}{2.2}\right|^3 + \left|\frac{2(y_4-y_1)}{3.2}\right|^3\right)^{\frac{2}{3}} > 1 \quad (125)$$

$$\left(\left|\frac{2(x_3-x_2)}{3.2}\right|^3 + \left|\frac{2(y_3-y_2)}{2.2}\right|^3\right)^{\frac{2}{3}} > 1 \quad (126)$$

$$\left(\left|\frac{2(x_4-x_2)}{2.2}\right|^3 + \left|\frac{2(y_4-y_2)}{2.2}\right|^3\right)^{\frac{2}{3}} > 1 \quad (127)$$

$$\left(\left|\frac{2(x_4-x_3)}{3.2}\right|^3 + \left|\frac{2(y_4-y_3)}{2.2}\right|^3\right)^{\frac{2}{3}} > 1 \quad (128)$$

To determine the containment constraints between each of the four circuit blocks and the fixed boundary, we will explore two approaches. The first approach will be to enforce a set of overlap constraints between B1 and each of the circuit blocks C1, C2, C3, and C4. The second approach would be to enforce a set of non-overlap constraints between $\overline{B}_1$ and each of the circuit blocks C1, C2, C3, and C4.

We first illustrate the generation of a set of overlap constraints to enforce the requirement that all the circuit blocks must be entirely contained within boundary B1.

One set of implicit distance spectrums that ensures C1, C2, C3, and C4 are completely overlapped by B1 is $$\mathcal{D}_{B1C1}(\theta) = \begin{cases} -\mathcal{C}1(0°)-\mathcal{C}1(180°) & \theta = 0° \\ -\mathcal{C}1(90°)-\mathcal{C}1(270°) & \theta = 90° \\ -\mathcal{C}1(0°)-\mathcal{C}1(180°) & \theta = 180° \\ -\mathcal{C}1(90°)-\mathcal{C}1(270°) & \theta = 270° \end{cases} \quad (129)$$

$$\mathcal{D}_{B1C2}(\theta) = \begin{cases} -\mathcal{C}2(0°)-\mathcal{C}2(180°) & \theta = 0° \\ -\mathcal{C}2(90°)-\mathcal{C}2(270°) & \theta = 90° \\ -\mathcal{C}2(0°)-\mathcal{C}2(180°) & \theta = 180° \\ -\mathcal{C}2(90°)-\mathcal{C}2(270°) & \theta = 270° \end{cases} \quad (130)$$

$$\mathcal{D}_{B1C3}(\theta) = \begin{cases} -\mathcal{C}3(0°) - \mathcal{C}3(180°) & \theta = 0° \\ -\mathcal{C}3(90°) - \mathcal{C}3(270°) & \theta = 90° \\ -\mathcal{C}3(0°) - \mathcal{C}3(180°) & \theta = 180° \\ -\mathcal{C}3(90°) - \mathcal{C}3(270°) & \theta = 270° \end{cases} \quad (131)$$

$$\mathcal{D}_{B1C4}(\theta) = \begin{cases} -\mathcal{C}4(0°) - \mathcal{C}4(180°) & \theta = 0° \\ -\mathcal{C}4(90°) - \mathcal{C}4(270°) & \theta = 90° \\ -\mathcal{C}4(0°) - \mathcal{C}4(180°) & \theta = 180° \\ -\mathcal{C}4(90°) - \mathcal{C}4(270°) & \theta = 270° \end{cases} \quad (132)$$

The first of the four constraints between B1 and the four circuit blocks is generated as follows:
We begin by applying the distance spectrum to the shape spectrum for B1:

$$\mathcal{B}1_D(\theta) = \mathcal{B}1(\theta) \oplus \mathcal{D}_{B1C1}(\theta) \quad (133)$$

We can then determine the DR shape spectrum for the EBSCA for B1 and C1 accounting for distance spectrum $\mathcal{D}_{B1C1}(\theta)$ as:

$$\mathcal{EB}(\theta) = \mathcal{B}1_D(\theta) + \mathcal{C}1(\theta + 180°) = \begin{cases} 1.5 & \theta = 0° \\ 2.5 & \theta = 90° \\ 1.5 & \theta = 180° \\ 2.5 & \theta = 270° \end{cases} \quad (134)$$

We then generate affine functions for the DR shape spectrum generated in Equation (134). Since the spectrum is symmetric we only need to generate two affine functions whose coefficients are:

$$\vec{K}_{0°} = \frac{2}{\mathcal{EB}(0°+180°) + \mathcal{EB}(0°)} \begin{bmatrix} \cos(0°) \\ \sin(0°) \end{bmatrix} = \frac{2}{3} \begin{bmatrix} 1 \\ 0 \end{bmatrix} \quad (135)$$

$$K_{0°} = -\vec{K}_{0°}^T \begin{bmatrix} x_5 \\ y_5 \end{bmatrix} + \frac{\mathcal{EB}(0°+180°) - \mathcal{EB}(0°)}{\mathcal{EB}(0°+180°) + \mathcal{EB}(0°)} = -\frac{2}{3} x_5$$

$$\vec{K}_{90°} = \frac{2}{\mathcal{EB}(90°+180°) + \mathcal{EB}(90°)} \begin{bmatrix} \cos(90°) \\ \sin(90°) \end{bmatrix} = \frac{2}{5} \begin{bmatrix} 0 \\ 1 \end{bmatrix} \quad (136)$$

$$K_{90°} = -\vec{K}_{90°}^T \begin{bmatrix} x_5 \\ y_5 \end{bmatrix} + \frac{\mathcal{EB}(90°+180°) - \mathcal{EB}(90°)}{\mathcal{EB}(90°+180°) + \mathcal{EB}(90°)} = -\frac{2}{5} y_5$$

where $$\begin{bmatrix} x_5 \\ y_5 \end{bmatrix}$$

represents the location of the origin of B1. We can then generate shape functions for these affine functions as $$\mathcal{Q}_{0°}\left(\begin{bmatrix} x \\ y \end{bmatrix}, \begin{bmatrix} x_5 \\ y_5 \end{bmatrix}\right) = \left|\vec{K}_{0°}^T \begin{bmatrix} x \\ y \end{bmatrix} + K_{0°}\right| = \left|\frac{2(x-x_5)}{3}\right| \quad (137)$$

$$\mathcal{Q}_{90°}\left(\begin{bmatrix} x \\ y \end{bmatrix}, \begin{bmatrix} x_5 \\ y_5 \end{bmatrix}\right) = \left|\vec{K}_{90°}^T \begin{bmatrix} x \\ y \end{bmatrix} + K_{90°}\right| = \left|\frac{2(y-y_5)}{5}\right| \quad (138)$$

followed by analytical composition to form the shape function $$\mathcal{S}\left(\begin{bmatrix} x_1 \\ y_1 \end{bmatrix}, \begin{bmatrix} 2 \\ 3.5 \end{bmatrix}\right) = \lim_{Z \to \infty}\left(\mathcal{Q}_{0°}\left(\begin{bmatrix} x_1 \\ y_1 \end{bmatrix}, \begin{bmatrix} 2 \\ 3.5 \end{bmatrix}\right)^Z + \mathcal{Q}_{90°}\left(\begin{bmatrix} x_1 \\ y_1 \end{bmatrix}, \begin{bmatrix} 2 \\ 3.5 \end{bmatrix}\right)^Z\right) \quad (139)$$

$$= \lim_{Z \to \infty}\left(\left|\frac{2(x_1-2)}{3}\right|^Z + \left|\frac{2(y_1-3.5)}{5}\right|^Z\right)$$

We can then apply $$\left\{1, \frac{2}{Z}, 0\right\}$$

exponent gradient shaping to Equation (139) to form $$\mathcal{S}_{gs}\left(\begin{bmatrix} x_1 \\ y_1 \end{bmatrix}, \begin{bmatrix} 2 \\ 3.5 \end{bmatrix}\right) = \lim_{Z \to \infty}\left(\left(\left|\frac{2(x_1-2)}{3}\right|^Z + \left|\frac{2(y_1-3.5)}{5}\right|^Z\right)^{\frac{2}{Z}}\right) \quad (140)$$

Based on Equation (140), and using a value of Z=3000 for all iterations of the sequence, we can then generate an analytical approximation for the overlap constraint function as $$\left(\left|\frac{2(x_1-2)}{3}\right|^{3000} + \left|\frac{2(y_1-3.5)}{5}\right|^{3000}\right)^{\frac{2}{3000}} < 1 \quad (141)$$

Repeating this process three more times on the remaining circuit blocks gives the following four analytical approximations of the constraint functions to enforce the requirement that all the circuit blocks must be entirely contained within boundary B1 for the first iteration of the sequence:

$$\left(\left|\frac{2(x_1-2)}{3}\right|^{3000} + \left|\frac{2(y_1-3.5)}{5}\right|^{3000}\right)^{\frac{2}{3000}} < 1 \quad (142)$$

$$\left(\left|\frac{2(x_2-2)}{3}\right|^{3000} + \left|\frac{2(y_2-3.5)}{6}\right|^{3000}\right)^{\frac{2}{3000}} < 1 \quad (143)$$

$$\left(\left|\frac{2(x_3-2)}{2}\right|^{3000} + \left|\frac{2(y_3-3.5)}{6}\right|^{3000}\right)^{\frac{2}{3000}} < 1 \quad (144)$$

$$\left(\left|\frac{2(x_4-2)}{3}\right|^{3000} + \left|\frac{2(y_4-3.5)}{6}\right|^{3000}\right)^{\frac{2}{3000}} < 1 \quad (145)$$

We will now illustrate the generation of a set of non-overlap constraints to enforce the requirement that all the circuit blocks must be entirely contained within boundary B1. We begin by inverting B1 as $$\overline{B1} = \mathcal{T}^{-1}(\mathcal{B}1(\theta), \text{Origin}(B1)) \quad (146)$$

$$= B1_{0°} \cup B1_{90°} \cup B1_{180°} \cup B1_{270°}$$

where $B1_{0°}$, $B1_{90°}$, $B1_{180°}$, and $B1_{270°}$ are the four PHSs $$B1_{0°} = \mathcal{T}^{-1}\left(\mathcal{B}1_{0°}(\theta), \begin{bmatrix} x_5 \\ y_5 \end{bmatrix}\right) \quad (147)$$

-continued $$B1_{90°} = \mathcal{J}^{-1}\left(\mathcal{B}1_{90°}(\theta), \begin{bmatrix} x_5 \\ y_5 \end{bmatrix}\right) \quad (148)$$

$$B1_{180°} = \mathcal{J}^{-1}\left(\mathcal{B}1_{180°}(\theta), \begin{bmatrix} x_5 \\ y_5 \end{bmatrix}\right) \quad (149)$$

$$B1_{270°} = \mathcal{J}^{-1}\left(\mathcal{B}1_{270°}(\theta), \begin{bmatrix} x_5 \\ y_5 \end{bmatrix}\right) \quad (150)$$

with DR shape spectrums $$\mathcal{B}1_{0°}(\theta) = \{-\mathcal{B}1(0°) \; \theta = 0° \quad (151)$$
$$= \{-2 \; \theta = 0°$$

$$\mathcal{B}1_{90°}(\theta) = \{-\mathcal{B}1(90°) \; \theta = 90° \quad (152)$$
$$= \{-3.5 \; \theta = 90°$$

$$\mathcal{B}1_{180°}(\theta) = \{-\mathcal{B}1(180°) \; \theta = 180° \quad (153)$$
$$= \{-2 \; \theta = 180°$$

$$\mathcal{B}1_{270°}(\theta) = \{-\mathcal{B}1(270°) \; \theta = 270° \quad (154)$$
$$= \{-3.5 \; \theta = 270°$$

We can then determine a DR shape spectrum for the EBSCA for each of $B1_{0°}$ and $C1$, $B1_{90°}$ and $C1$, $B1_{180°}$ and $C1$, as well as $B1_{270°}$ and $C1$ as $$\mathcal{EB}_{0°}(\theta) = \{\mathcal{B}1_{0°}(0°) + \mathcal{C}1(180°) \; \theta = 0° \quad (155)$$
$$= \{-1.5 \; \theta = 0°$$

$$\mathcal{EB}_{90°}(\theta) = \{\mathcal{B}1_{90°}(90°) + \mathcal{C}1(270°) \; \theta = 90° \quad (156)$$
$$= \{-2.5 \; \theta = 90°$$

$$\mathcal{EB}_{180°}(\theta) = \{\mathcal{B}1_{180°}(180°) + \mathcal{C}1(0°) \; \theta = 180° \quad (157)$$
$$= \{-1.5 \; \theta = 180°$$

$$\mathcal{EB}_{270°}(\theta) = \{\mathcal{B}1_{70°}(270°) + \mathcal{C}1(90°) \; \theta = 270° \quad (158)$$
$$= \{-2.5 \; \theta = 270°$$

We can then generate affine functions for the asymmetric shape spectrums of Equations (155) through (158). The coefficients of these functions are:

$$\vec{K}_{0°} = \begin{bmatrix} \cos(0°) \\ \sin(0°) \end{bmatrix} = \begin{bmatrix} 1 \\ 0 \end{bmatrix} \quad (159)$$

$$K_{0°} = -\vec{K}_{0°}^T \begin{bmatrix} x_5 \\ y_5 \end{bmatrix} - \mathcal{EB}_{0°}(0°) + 1 = -x_5 + 2.5$$

$$\vec{K}_{90°} = \begin{bmatrix} \cos(90°) \\ \sin(90°) \end{bmatrix} = \begin{bmatrix} 0 \\ 1 \end{bmatrix} \quad (160)$$

$$K_{90°} = -\vec{K}_{90°}^T \begin{bmatrix} x_5 \\ y_5 \end{bmatrix} - \mathcal{EB}_{90°}(90°) + 1 = -y_5 + 3.5$$

$$\vec{K}_{180°} = \begin{bmatrix} \cos(180°) \\ \sin(180°) \end{bmatrix} = \begin{bmatrix} -1 \\ 0 \end{bmatrix} \quad (161)$$

$$K_{180°} = -\vec{K}_{180°}^T \begin{bmatrix} x_5 \\ y_5 \end{bmatrix} - \mathcal{EB}_{180°}(180°) + 1 = x_5 + 2.5$$

$$\vec{K}_{270°} = \begin{bmatrix} \cos(270°) \\ \sin(270°) \end{bmatrix} = \begin{bmatrix} 0 \\ -1 \end{bmatrix} \quad (162)$$

$$K_{270°} = -\vec{K}_{270°}^T \begin{bmatrix} x_5 \\ y_5 \end{bmatrix} - \mathcal{EB}_{270°}(270°) + 1 = y_5 + 3.5$$

We can then generates shape functions for Equations (155) through (158) as $$\mathrm{EB}_{0°}\left(\begin{bmatrix} x \\ y \end{bmatrix}, \begin{bmatrix} x_5 \\ y_5 \end{bmatrix}\right) = \max\left\{0, \vec{K}_{0°}^T \begin{bmatrix} x \\ y \end{bmatrix} + K_{0°}\right\} \quad (163)$$
$$= \max\{0, x - x_5 + 2.5\}$$

$$\mathrm{EB}_{90°}\left(\begin{bmatrix} x \\ y \end{bmatrix}, \begin{bmatrix} x_5 \\ y_5 \end{bmatrix}\right) = \max\left\{0, \vec{K}_{90°}^T \begin{bmatrix} x \\ y \end{bmatrix} + K_{90°}\right\} \quad (164)$$
$$= \max\{0, y - y_5 + 3.5\}$$

$$\mathrm{EB}_{180°}\left(\begin{bmatrix} x \\ y \end{bmatrix}, \begin{bmatrix} x_5 \\ y_5 \end{bmatrix}\right) = \max\left\{0, \vec{K}_{180°}^T \begin{bmatrix} x \\ y \end{bmatrix} + K_{180°}\right\} \quad (165)$$
$$= \max\{0, -x + x_5 + 2.5\}$$

$$\mathrm{EB}_{270°}\left(\begin{bmatrix} x \\ y \end{bmatrix}, \begin{bmatrix} x_5 \\ y_5 \end{bmatrix}\right) = \max\left\{0, \vec{K}_{270°}^T \begin{bmatrix} x \\ y \end{bmatrix} + K_{270°}\right\} \quad (166)$$
$$= \max\{0, -y + y_5 + 3.5\}$$

We can then use an analytic union to form Equations (163) through (166) into a shape function for the EBSCA between $\overline{B1}$ and $C1$ (or the IBSCA between $B1$ and $C1$)

$$\mathrm{EB}\left(\begin{bmatrix} x_1 \\ y_1 \end{bmatrix}, \begin{bmatrix} 2 \\ 3.5 \end{bmatrix}\right) = \lim_{Z \to \infty} \left(\mathrm{EB}_{0°}\left(\begin{bmatrix} x_1 \\ y_1 \end{bmatrix}, \begin{bmatrix} 2 \\ 3.5 \end{bmatrix}\right)^{-Z} + \mathrm{EB}_{90°}\left(\begin{bmatrix} x_1 \\ y_1 \end{bmatrix}, \begin{bmatrix} 2 \\ 3.5 \end{bmatrix}\right)^{-Z} + \right. \quad (167)$$
$$\left. \mathrm{EB}_{180°}\left(\begin{bmatrix} x_1 \\ y_1 \end{bmatrix}, \begin{bmatrix} 2 \\ 3.5 \end{bmatrix}\right)^{-Z} + \mathrm{EB}_{270°}\left(\begin{bmatrix} x_1 \\ y_1 \end{bmatrix}, \begin{bmatrix} 2 \\ 3.5 \end{bmatrix}\right)^{-Z}\right)^{-1}$$
$$= \lim_{Z \to \infty} (\max\{0, x_1 + .5\}^{-Z} + \max\{0, y_1\}^{-Z} + \max\{0, -x_1 + 4.5\}^{-Z} + \max\{0, -y_1 + 7\}^{-Z})^{-1}$$

We can then apply $$\left\{1, \frac{2}{Z}, 0\right\}$$

exponent gradient shaping to Equation (167)

$$LB_{gs}\left(\begin{bmatrix} x_1 \\ y_1 \end{bmatrix}, \begin{bmatrix} 2 \\ 3.5 \end{bmatrix}\right) = \lim_{Z \to \infty} \left((\max\{0, x_1 + .5\}^{-Z} + \max\{0, y_1\}^{-Z} + \max\{0, -x_1 + 4.5\}^{-Z} + \max\{0, -y_1 + 7\}^{-Z})^{-\frac{2}{Z}}\right) \quad (168)$$

Based on Equation (168) and using a value of Z=3000 for all iterations of the sequence, we can generate an analytical approximation for the containment of C1 in B1 as $$(\max\{0, x_1 + .5\}^{-3000} + \max\{0, y_1\}^{-3000} + \max\{0, -x_1 + 4.5\}^{-3000} + \max\{0, -y_1 + 7\}^{-3000})^{-\frac{2}{3000}} > 1 \quad (169)$$

Repeating this process three more times on the remaining circuit blocks gives the following four analytical approximation for the constraints to enforce the requirement that all the circuit blocks must be entirely contained within boundary B1 for the first iteration of the sequence:

$$(\max\{0, x_1 + .5\}^{-3000} + \max\{0, y_1\}^{-3000} + \max\{0, -x_1 + 4.5\}^{-3000} + \max\{0, -y_1 + 7\}^{-3000})^{-\frac{2}{3000}} > 1 \quad (170)$$

$$(\max\{0, x_2 + .5\}^{-3000} + \max\{0, y_2 + .5\}^{-3000} + \max\{0, -x_2 + 4.5\}^{-3000} + \max\{0, -y_2 + 7.5\}^{-3000})^{-\frac{2}{3000}} > 1 \quad (171)$$

$$(\max\{0, x_3\}^{-3000} + \max\{0, y_3 + .5\}^{-3000} + \max\{0, -x_3 + 4\}^{-3000} + \max\{0, -y_3 + 7.5\}^{-3000})^{-\frac{2}{3000}} > 1 \quad (172)$$

$$(\max\{0, x_4 + .5\}^{-3000} + \max\{0, y_4 + .5\}^{-3000} + \max\{0, -x_4 + 4.5\}^{-3000} + \max\{0, -y_4 + 7.5\}^{-3000})^{-\frac{2}{3000}} > 1 \quad (173)$$

In step 120, assuming that the constraints between the circuit blocks and boundary B1 are enforced with Equations (142) through (145), the following optimization problem would be formed:

$$\min_{x_1, \ldots, x_4, y_1, \ldots, y_4} (1) \quad (174)$$

Subject to Equations (123) through (128) and Equations (142) through (145)

In step 130 the initial values for optimization variables $x_1$ though $x_4$ and $y_1$ though $y_4$ are selected to be the locations of the origin of each circuit shown in FIG. 14:

$$\begin{bmatrix} x_1 \\ y_1 \end{bmatrix} = \begin{bmatrix} 0 \\ 0 \end{bmatrix}, \begin{bmatrix} x_2 \\ y_2 \end{bmatrix} = \begin{bmatrix} 1 \\ 2 \end{bmatrix}, \begin{bmatrix} x_3 \\ y_3 \end{bmatrix} = \begin{bmatrix} 4 \\ 4 \end{bmatrix}, \begin{bmatrix} x_4 \\ y_4 \end{bmatrix} = \begin{bmatrix} 3.0 \\ 4.5 \end{bmatrix} \quad (175)$$

Using the initial values of the optimization variables $x_1$ though $x_4$ and $y_1$ though $y_4$ selected in step 130 as a starting point, Step 140 could solve the optimization problem of Equation (174) using, for example, the LANCELOT optimization software package. One skilled in the art will appreciate that there are many other analytical optimization methods that could be used to solve the optimization problem of Equation (174). These include general purpose analytical optimization software packages as well as dedicated analytical optimization software which may be designed specifically to solve Equation (174).

Steps 110 through 140 would then be executed three more times, making a total of four iterations in the sequence. In each of these three iterations the value of Z used in the construction of the first six constraint functions produced by step 110 would be ten times the value of Z used by the previous iteration. Additionally, since the form of each of the first six constraint functions does not change from one iteration to the next, and only the value of Z changes, the work done in each of the second through fourth iterations of step 110 could be significantly reduced by reusing the forms of the first six functions produced by the first iteration of step 110. Further, since the last four constraints functions do not change from one iteration to the next, the second through fourth iterations of step 110 can simply reuse the last four constraint functions produced by the first iteration of step 110 instead of regenerating them in each subsequent iteration. In step 130 the set of initial values for the optimization variables $x_1$ though $x_4$ and $y_1$ though $y_4$ to be used in the next execution of step 140 would be set to the values of $x_1$ though $x_4$ and $y_1$ though $y_4$ computed by the previous execution of step 140. After completing the final iteration we consider the values of the optimization variables, $x_1$ though $x_4$ and $y_1$ though $y_4$ produced by step 140 to be an arrangement of shapes B1, C1, C2, C3, and C4 which satisfy a sufficiently accurate approximation of the boundary distance constraints among those shapes for the purposes of this example.

Example 2

In this example, we will again look at the problem outlined in Example 1. In this case however we will take advantage of the fact that shapes B1, C1, C2, C3, and C4 are axis aligned rectangles subject to orthotopic boundary distance constraints. As such, we can use superellipsoid shape function approximations to generate the necessary analytical approximation functions for the BD constraints. To illustrate this approach, we will demonstrate how to generate an analytical approximation of the non-overlap constraint function between C1 and C2 as well as an analytical approximation of the containment constraint between B1 and C1.

From FIG. 14 we can see that the dimension vectors associated with shapes B1, C1, and C2 are $$\overrightarrow{B1D} = [4,7]^T \quad (176)$$

$$\overrightarrow{C1D} = [1,2]^T \quad (177)$$

$$\overrightarrow{C2D} = [1,1]^T \quad (178)$$

Additionally we know that the upper and lower separation distance vectors between C1 and C2 are $$\overrightarrow{C1C2U} = [0.1, 0.1]^T \quad (179)$$

$$\overrightarrow{C1C2L} = [0.1, 0.1]^T \quad (180)$$

With this information and using Equation (88) we can generate the shape function for the EBSCA between C1 and C2 as $$EB\left(\begin{bmatrix}x_2\\y_2\end{bmatrix},\begin{bmatrix}x_1\\y_2\end{bmatrix}\right)= \quad (181)$$

$$\lim_{Z\to\infty}\left(\left|2\frac{x_2-\left(x_1+\frac{0.1-0.1}{2}\right)}{1+0.1+0.1+1}\right|^Z+\left|2\frac{y_2-\left(y_1+\frac{0.1-0.1}{2}\right)}{2+0.1+0.1+1}\right|^Z\right)=$$

$$\lim_{Z\to\infty}\left(\left|2\frac{x_2-x_1}{2.2}\right|^Z+\left|2\frac{y_2-y_1}{3.2}\right|^Z\right)$$

We can then apply $$\left\{1,\frac{2}{Z},0\right\}$$

exponent gradient shaping to Equation (181)

$$EB_{gs}\left(\begin{bmatrix}x_2\\y_2\end{bmatrix},\begin{bmatrix}x_1\\y_1\end{bmatrix}\right)=\lim_{Z\to\infty}\left(\left|\frac{2(x_2-x_1)}{2.2}\right|^Z+\left|\frac{2(y_2-y_1)}{3.2}\right|^Z\right)^{\frac{2}{Z}} \quad (182)$$

Based on Equation (182), and using a value of Z=3 for the first iteration of the sequence, we can then generate an analytical approximation of the non-overlap constraint function between C1 and C2 as $$\left(\left|\frac{2(x_2-x_1)}{2.2}\right|^3+\left|\frac{2(y_2-y_1)}{3.2}\right|^3\right)^{\frac{2}{3}}>1 \quad (183)$$

which is identical to Equation (122) generated in Example 1.

In a similar fashion, using Equation (91) we can generate the shape function for the IBSCA between B1 and C1 as $$IB\left(\begin{bmatrix}x_1\\y_1\end{bmatrix},\begin{bmatrix}2\\3.5\end{bmatrix}\right)=\lim_{Z\to\infty}\left(\left|2\frac{x_1-2}{4-1}\right|^Z+\left|2\frac{y_1-3.5}{7-2}\right|^Z\right) \quad (184)$$

$$=\lim_{Z\to\infty}\left(\left|2\frac{x_1-2}{3}\right|^Z+\left|2\frac{y_1-3.5}{5}\right|^Z\right)$$

We can then apply $$\left\{1,\frac{2}{Z},0\right\}$$

exponent gradient shaping to Equation (184)

$$IB_{gs}\left(\begin{bmatrix}x_1\\y_1\end{bmatrix},\begin{bmatrix}2\\3.5\end{bmatrix}\right)=\lim_{Z\to\infty}\left(\left|\frac{2(x_1-2)}{3}\right|^Z+\left|\frac{2(y_1-3.5)}{5}\right|^Z\right)^{\frac{2}{Z}} \quad (185)$$

Based on Equation (185), and using a value of Z=3000 for all iterations of the sequence, we can then generate an analytical approximation of the containment constraint function between B1 and C1 as $$\left(\left|\frac{2(x_1-2)}{3}\right|^{3000}+\left|\frac{2(y_1-3.5)}{5}\right|^{3000}\right)^{\frac{2}{3000}}<1 \quad (186)$$

which is identical to Equation (141) generated in Example 1.

Example 3

This example will illustrate the use of the method outlined in the flow chart of FIG. 13B. As with the first two examples, this example is also based on the illustration in FIG. 14. However, unlike our first and second examples, which had a fixed boundary for B1, we will allow the size of boundary B1 to vary such that its perimeter is minimized and all of the circuit blocks are contained within. Additionally, unlike our first two examples, which had a fixed aspect ratio for circuit block C1, we will instead allow its aspect ratio to be selected between 0.5 and 2 while maintaining a fixed area of 2. These variable aspect ratios give us parameterized DR shape spectrums for C1 and B1:

$$C1(\theta)=\begin{cases}0.5w_{C1} & \theta=0°\\0.5h_{C1} & \theta=90°\\0.5w_{C1} & \theta=180°\\0.5h_{C1} & \theta=270°\end{cases} \quad (187)$$

$$B1(\theta)=\begin{cases}0.5w_{B1} & \theta=0°\\0.5h_{B1} & \theta=90°\\0.5w_{B1} & \theta=180°\\0.5h_{B1} & \theta=270°\end{cases} \quad (188)$$

where $w_{c1}$ and $h_{c1}$ are two new optimization variables which represent the width and height of circuit block C1, and $w_{B1}$ and $h_{b1}$ are two new optimization variables which represent the width and height of boundary B1.

Again, for ease of understanding and without loss of generality, we will assume that there are no non-BD constraints. Based on this, step 210 generates the following analytical approximations for the constraint functions between circuits for the first iteration of the sequence when the value of Z=3:

$$\left(\left|\frac{2(x_2-x_1)}{w_{C1}+1.2}\right|^3+\left|\frac{2(y_2-y_1)}{h_{C1}+1.2}\right|^3\right)^{\frac{2}{3}}>1 \quad (189)$$

$$\left(\left|\frac{2(x_3-x_1)}{w_{C1}+2.2}\right|^3+\left|\frac{2(y_3-y_1)}{h_{C1}+1.2}\right|^3\right)^{\frac{2}{3}}>1 \quad (190)$$

$$\left(\left|\frac{2(x_4-x_1)}{w_{C1}+1.2}\right|^3+\left|\frac{2(y_4-y_1)}{h_{C1}+1.2}\right|^3\right)^{\frac{2}{3}}>1 \quad (191)$$

$$\left(\left|\frac{2(x_3-x_2)}{3.2}\right|^3+\left|\frac{2(y_3-y_2)}{2.2}\right|^3\right)^{\frac{2}{3}}>1 \quad (192)$$

$$\left(\left|\frac{2(x_4-x_2)}{2.2}\right|^3+\left|\frac{2(y_4-y_2)}{2.2}\right|^3\right)^{\frac{2}{3}}>1 \quad (193)$$

$$\left(\left|\frac{2(x_4-x_3)}{3.2}\right|^3+\left|\frac{2(y_4-y_3)}{2.2}\right|^3\right)^{\frac{2}{3}}>1 \quad (194)$$

Additionally, the constraint functions between the circuit blocks and boundary B1, generated in step 210, are as follows for all iterations of the sequence:

$$\left(\left|\frac{2(x_1 - 2)}{w_{B1} - w_{C1}}\right|^{3000} + \left|\frac{2(y_1 - 3.5)}{h_{B1} - h_{C1}}\right|^{3000}\right)^{\frac{2}{3000}} < 1 \quad (195)$$

$$\left(\left|\frac{2(x_2 - 2)}{w_{B1} - 1}\right|^{3000} + \left|\frac{2(y_2 - 3.5)}{h_{B1} - 1}\right|^{3000}\right)^{\frac{2}{3000}} < 1 \quad (196)$$

$$\left(\left|\frac{2(x_3 - 2)}{w_{B1} - 2}\right|^{3000} + \left|\frac{2(y_3 - 3.5)}{h_{B1} - 1}\right|^{3000}\right)^{\frac{2}{3000}} < 1 \quad (197)$$

$$\left(\left|\frac{2(x_4 - 2)}{w_{B1} - 1}\right|^{3000} + \left|\frac{2(y_4 - 3.5)}{h_{B1} - 1}\right|^{3000}\right)^{\frac{2}{3000}} < 1 \quad (198)$$

In order to accommodate the fixed area and variable aspect ratio of circuit block C1, it suffices for step 215 to generate the following additional constraints:

$$w_{C1} h_{C1} = 2 \quad (199)$$

$$h_{C1} > 1 \quad (200)$$

$$h_{C1} < 2 \quad (201)$$

Due to the form of the objective to be generated in step 220, step 215 also generates the following constraints to prevent any of the denominators in Equation (195) through (198) from going to zero:

$$w_{B1} - w_{C1} > 0 \quad (202)$$

$$h_{B1} - h_{C1} > 0 \quad (203)$$

$$w_{B1} > 2 \quad (204)$$

$$h_{B1} > 1 \quad (205)$$

The optimization problem generated in steps 220 will now be $$\min_{x_1,\ldots,x_4,y_1,\ldots,y_4,w_{C1},w_{B1},h_{C1},h_{B1}} (w_{B1} + h_{B1}) \quad (206)$$

Subject to Equations (189) through (205)

In step 230 the initial values for optimization variables are selected to be the locations and dimensions of each of the blocks shown in FIG. 14:

$$\begin{bmatrix}x_1\\y_1\end{bmatrix} = \begin{bmatrix}0\\0\end{bmatrix}, \begin{bmatrix}x_2\\y_2\end{bmatrix} = \begin{bmatrix}1\\2\end{bmatrix}, \begin{bmatrix}x_3\\y_3\end{bmatrix} = \begin{bmatrix}4\\4\end{bmatrix}, \begin{bmatrix}x_4\\y_4\end{bmatrix} = \begin{bmatrix}3.0\\4.5\end{bmatrix} \quad (207)$$

$$w_{C1} = 1, w_{B1} = 4, h_{C1} = 2, h_{B1} = 7 \quad (208)$$

Using the initial values of the optimization variables selected in step 230 as a starting point, Step 240 could solve the optimization problem of Equation (206) using, for example, the LANCELOT optimization software package. One skilled in the art will appreciate that there are many other analytical optimization methods that could be used to solve the optimization problem of Equation (206). These include general purpose analytical optimization software packages as well as dedicated analytical optimization software which may be designed specifically to solve Equation (206).

Steps 210 through 240 would then be executed three more times, making a total of four iterations in the sequence. In each of these three iterations the value of Z used in the construction of the constraint functions produced by step 210 would be ten times the value of Z used by the previous iteration. Additionally, since the form of each of the first six constraint functions does not change from one iteration to the next, and only the value of Z changes, the work done in each of the second through fourth iterations of step 210 could be significantly reduced by reusing the forms of the first six functions produced by the first iteration of step 210. Further, since the last four constraints functions do not change from one iteration to the next, the second through fourth iterations of step 210 can simply reuse the last four constraint functions produced by the first iteration of step 210 instead of regenerating them in each subsequent iteration. Using similar reasoning, since the constraint functions produced by step 215 do not change from one iteration to the next, the second through fourth iterations of step 215 can simply reuse the functions produced by the first iteration of step 215. In step 230 the set of initial values for the optimization variables to be used in the next execution of step 240 would be set to the values for those variables computed by the previous execution of step 240. After completing the final iteration we consider the values of the optimization variables produced by step 240 to be an arrangement of shapes B1, C1, C2, C3, and C4 which satisfy a sufficiently accurate approximation of the boundary distance constraints among those shapes for the purposes of this example.

Example 4

Figure 15:
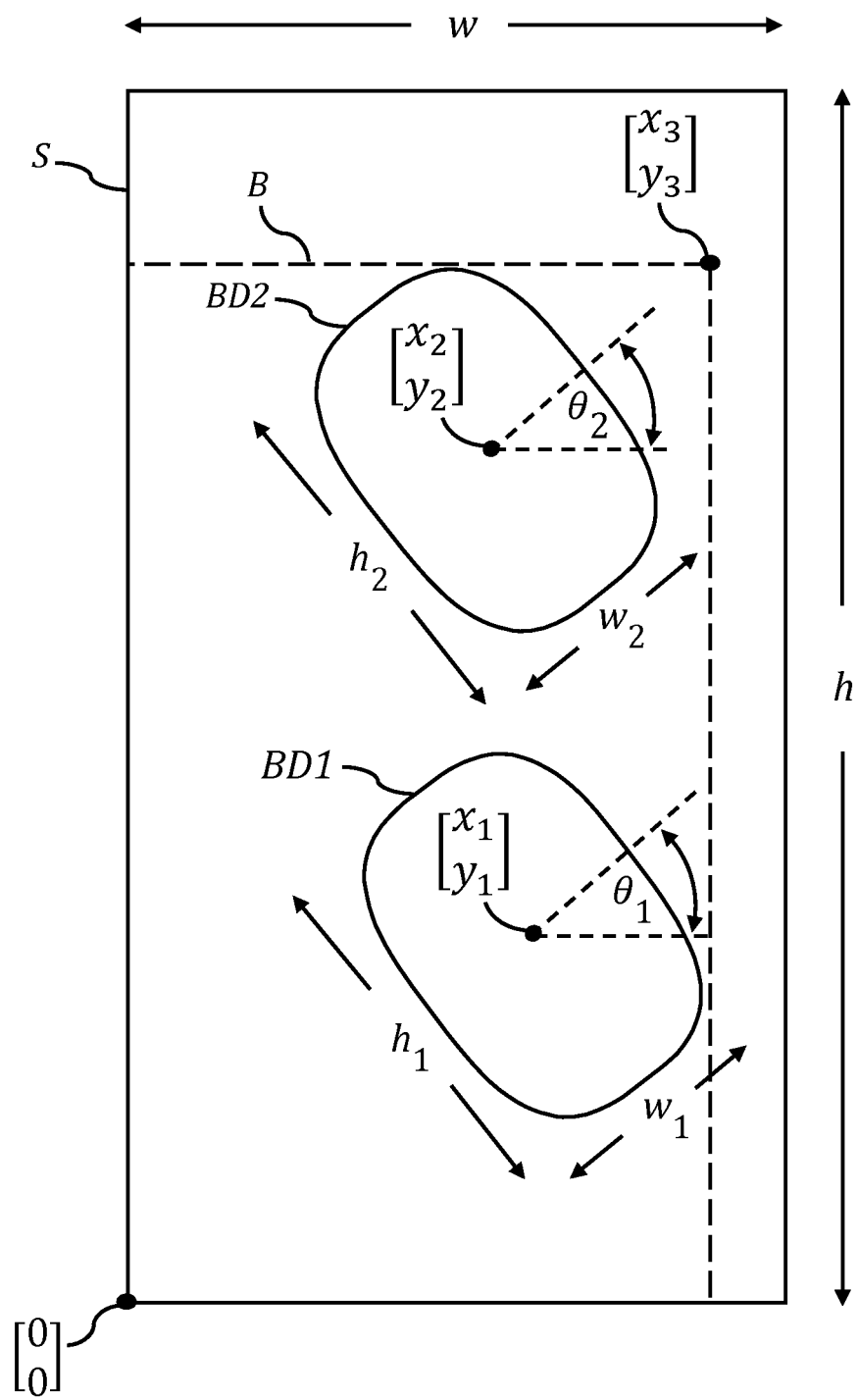
FIG. 15 illustrates the arrangement of two components to be cut from a sheet of material.

The fourth example illustrates the use of the method outlined in the flow chart of FIG. 13A and is an arrangement problem used in the manufacture of plate steel parts for one or two ships. In this example, as Illustrated in FIG. 15, we would like to determine the position and orientation of components for a pair of bulk head doors, BD1 and BD2, on a sheet of steel, S, from which they are to be cut. We would like to position the components such that the bounding box, B, defined by the lower left corner of S and the point $[x_3, y_3]^T$ has minimum perimeter. The shape of BD1 and BD2 are cubic superellipses with height and width $h_1$, $w_1$ and $h_2$, $w_2$ respectively. To accommodate the kerf of the cutting tool that will be used to cut components BD1 and BD2 from sheet S, a minimum distance d is to be maintained between the boundaries of BD1 and BD2. The height and width of sheet S are h and w respectively. The lower left corner of S is fixed at $[0,0]^T$. From this we see that the optimization variables for this arrangement problem are the position and rotation angle, $[x_1, y_1, \theta_1]^T$, of BD1, the position and rotation angle, $[x_2, y_2, \theta_2]^T$, of BD2 and the upper right corner, $[x_3, y_3]^T$, of the bounding box enclosing BD1 and BD2.

One skilled in the art can show that the shape spectrum for a two-dimensional superellipsoid having origin $[o_x, o_y]^T$, semidiameters $r_x$ and $r_y$, and exponent n, as defined by the equation $$\left|\frac{x - o_x}{r_x}\right|^n + \left|\frac{y - o_y}{r_y}\right|^n = 1,$$

has the following shape spectrum:

$$S\mathcal{E}(\theta) = \left(|r_x\sin(\theta)|^{\frac{n}{n-1}} + |r_y\cos(\theta)|^{\frac{n}{n-1}}\right)^{\frac{n-1}{n}} \quad (209)$$

From this we see that the parameterized shape spectrums for BD1 and BD2 are $$\mathcal{BD}1(\theta, \theta_1) = \left(\left|\frac{w_1}{2}\sin(\theta-\theta_1)\right|^{\frac{3}{2}} + \left|\frac{h_1}{2}\cos(\theta-\theta_1)\right|^{\frac{3}{2}}\right)^{\frac{2}{3}} \quad (210)$$

$$\mathcal{BD}2(\theta, \theta_2) = \left(\left|\frac{w_2}{2}\sin(\theta-\theta_2)\right|^{\frac{3}{2}} + \left|\frac{h_2}{2}\cos(\theta-\theta_2)\right|^{\frac{3}{2}}\right)^{\frac{2}{3}} \quad (211)$$

To enforce the minimum distance, d, between BD1 and BD2 we define the following explicit distance spectrums for BD1 and BD2

$$\mathcal{D}_{\mathcal{BD}_1}(\theta) = \mathcal{D}_{\mathcal{BD}_2}(\theta) = \frac{d}{2} \quad (212)$$

Based on the flow chart of FIG. 13A, one set of constraints that can be generated by step 110 consists of: one to enforce the distance constraints between BD1 and BD2; four to enforce the requirement that BD1 be entirely contained within boundary S; four to enforce the requirement that BD2 be entirely contained within boundary S; two to enforce the requirement that BD1 be contained in the bounding box B; and two to enforce the requirement that BD2 be contained in the bounding box B.

To determine an analytical representation of the nonoverlap constraint between BD1 and BD2 we use Equations (210), (211), and (212) to determine the parameterized shape spectrum for the EBSCA of shapes BD1 and BD2 with separation distance d as $$\mathcal{EB}(\theta, \theta_1, \theta_2) = \mathcal{BD}1(\theta, \theta_1) + \mathcal{D}_{\mathcal{BD}_1}(\theta) + \quad (213)$$
$$\mathcal{BD}2(\theta+180°, \theta_2) + \mathcal{D}_{\mathcal{BD}_2}(\theta+180°)$$
$$= \mathcal{BD}1(\theta, \theta_1) + \mathcal{BD}2(\theta, \theta_2) + d$$
$$= \left(\left|\frac{w_1}{2}\sin(\theta-\theta_1)\right|^{\frac{3}{2}} + \left|\frac{h_1}{2}\cos(\theta-\theta_1)\right|^{\frac{3}{2}}\right)^{\frac{2}{3}} +$$
$$\left(\left|\frac{w_2}{2}\sin(\theta-\theta_2)\right|^{\frac{3}{2}} + \left|\frac{h_2}{2}\cos(\theta-\theta_2)\right|^{\frac{3}{2}}\right)^{\frac{2}{3}} + d$$

Based on Equations (65) through (68) the value of the shape function $$\mathbb{EB}\left(\begin{bmatrix}x_2\\y_2\\\theta_2\end{bmatrix}, \begin{bmatrix}x_1\\y_1\\\theta_1\end{bmatrix}\right)$$

can be computed as follows:

Procedure 3:

1. Compute $\varphi = \tan^{-1}\left(\frac{y_2 - y_1}{x_2 - x_1}\right)$

2. Solve $\theta = \varphi - \tan^{-1}\left(\frac{\frac{\partial \mathcal{EB}(\theta, \theta_1, \theta_2)}{\partial \theta}}{\mathcal{EB}(\theta, \theta_1, \theta_2)}\right)$ for $\theta$ 3. Compute $x_p = \mathcal{EB}(\theta, \theta_1, \theta_2)\cos(\theta) - \sin(\theta)\frac{\partial \mathcal{EB}(\theta, \theta_1, \theta_2)}{\partial \theta} + x_1$ 4. Compute $y_p = \mathcal{EB}(\theta, \theta_1, \theta_2)\sin(\theta) + \cos(\theta)\frac{\partial \mathcal{EB}(\theta, \theta_1, \theta_2)}{\partial \theta} + y_1$ 5. Compute $\mathbb{EB}\left(\begin{bmatrix}x_2\\y_2\\\theta_2\end{bmatrix}, \begin{bmatrix}x_1\\y_1\\\theta_1\end{bmatrix}\right) = \sqrt{\frac{(x_2-x_1)^2 + (y_2-y_1)^2}{(x_p-x_1)^2 + (y_p-y_1)^2}}$ From this we can define the analytical representation of the nonoverlap constraint between BD1 and BD2 as $$\mathbb{EB}\left(\begin{bmatrix}x_2\\y_2\\\theta_2\end{bmatrix}, \begin{bmatrix}x_1\\y_1\\\theta_1\end{bmatrix}\right) > 1 \quad (214)$$

Note that due to the form of the differential equation in step 2 of Procedure 3 it may be necessary to solve it using a numerical method such as, for example, a half interval search, where the initial interval is $0° \leq \theta < 360°$.

To determine an analytical representation of the constraints to contain BD1 and BD2 inside of S we will break S into a set of four overlapping planar half spaces. One vertical half space, $S_1$, passing through $[0,0]^T$, one horizontal half space, $S_2$, passing through $[0,0]^T$, one vertical half space, $S_3$, passing through $[w,0]^T$, and one horizontal half space, $S_4$, passing through $[w,h]^T$. Assuming that the origins of $S_1$, $S_2$, $S_3$, and $S_4$ are $[0,0]^T$, $[0,0]^T$, $[w,0]^T$, and $[w,h]^T$ respectively then their DR shape spectrums are $$\mathcal{S}_1(\theta) = \{0\theta = 0°\} \quad (215)$$
$$\mathcal{S}_1(\theta) = \{0\theta = 90°\} \quad (216)$$
$$\mathcal{S}_3(\theta) = \{0\theta = 180°\} \quad (217)$$
$$\mathcal{S}_4(\theta) = \{0\theta = 270°\} \quad (218)$$

The DR shape spectrums of the EBSCA between these four planar half spaces and BD1 are $$\mathcal{EB}_1(\theta, \theta_1) = \{\mathcal{S}_1(0°) + \mathcal{BD}1(0° + 180°, \theta_1) \; \theta = 0° \quad (219)$$
$$= \left\{\left(\left|\frac{w_1}{2}\sin(180°-\theta_1)\right|^{\frac{3}{2}} + \left|\frac{h_1}{2}\cos(180°-\theta_1)\right|^{\frac{3}{2}}\right)^{\frac{2}{3}} \; \theta = 0°\right.$$

$$\mathcal{EB}_2(\theta, \theta_1) = \{\mathcal{S}_2(90°) + \mathcal{BD}1(90° + 180°, \theta_1) \; \theta = 90° \quad (220)$$
$$= \left\{\left(\left|\frac{w_1}{2}\sin(270°-\theta_1)\right|^{\frac{3}{2}} + \left|\frac{h_1}{2}\cos(270°-\theta_1)\right|^{\frac{3}{2}}\right)^{\frac{2}{3}} \; \theta = 90°\right.$$

$$\mathcal{EB}_3(\theta, \theta_1) = \{\mathcal{S}_3(180°) + \mathcal{BD}1(180° + 180°, \theta_1) \; \theta = 180° \quad (221)$$
$$= \left\{\left(\left|\frac{w_1}{2}\sin(0°-\theta_1)\right|^{\frac{3}{2}} + \left|\frac{h_1}{2}\cos(0°-\theta_1)\right|^{\frac{3}{2}}\right)^{\frac{2}{3}} \; \theta = 180°\right.$$

$$\mathcal{EB}_4(\theta, \theta_1) = \{\mathcal{S}_4(270°) + \mathcal{BD}1(270° + 180°, \theta_1) \; \theta = 270° \quad (222)$$

-continued $$= \left\{ \left( \left| \frac{w_1}{2} \sin(90° - \theta_1) \right|^{\frac{3}{2}} + \left| \frac{h_1}{2} \cos(90° - \theta_1) \right|^{\frac{3}{3}} \right)^{\frac{2}{3}} \theta = 270° \right.$$

Assuming the shape function mapping of Equations (34), (35), and (36) we can use Equations (219) through (222) to construct the following shape functions $$\mathbb{EB}_1 \left( \begin{bmatrix} x_1 \\ y_1 \\ \theta_1 \end{bmatrix}, \begin{bmatrix} 0 \\ 0 \end{bmatrix} \right) = \tag{223}$$

$$x_1 - \left( \left| \frac{w_1}{2} \sin(180° - \theta_1) \right|^{\frac{3}{2}} + \left| \frac{h_1}{2} \cos(180° - \theta_1) \right|^{\frac{3}{3}} \right)^{\frac{2}{3}}$$

$$\mathbb{EB}_2 \left( \begin{bmatrix} x_1 \\ y_1 \\ \theta_1 \end{bmatrix}, \begin{bmatrix} 0 \\ 0 \end{bmatrix} \right) = \tag{224}$$

$$y_1 - \left( \left| \frac{w_1}{2} \sin(270° - \theta_1) \right|^{\frac{3}{2}} + \left| \frac{h_1}{2} \cos(270° - \theta_1) \right|^{\frac{3}{3}} \right)^{\frac{2}{3}}$$

$$\mathbb{EB}_3 \left( \begin{bmatrix} x_1 \\ y_1 \\ \theta_1 \end{bmatrix}, \begin{bmatrix} w \\ 0 \end{bmatrix} \right) = \tag{225}$$

$$w - x_1 - \left( \left| \frac{w_1}{2} \sin(0° - \theta_1) \right|^{\frac{3}{2}} + \left| \frac{h_1}{2} \cos(0° - \theta_1) \right|^{\frac{3}{3}} \right)^{\frac{2}{3}}$$

$$\mathbb{EB}_4 \left( \begin{bmatrix} x_1 \\ y_1 \\ \theta_1 \end{bmatrix}, \begin{bmatrix} w \\ h \end{bmatrix} \right) = \tag{226}$$

$$h - y_1 - \left( \left| \frac{w_1}{2} \sin(90° - \theta_1) \right|^{\frac{3}{2}} + \left| \frac{h_1}{2} \cos(90° - \theta_1) \right|^{\frac{3}{3}} \right)^{\frac{2}{3}}$$

and from them the following four analytical constraint functions to enforce the containment of BD1 inside of S $$x_1 - \left( \left| \frac{w_1}{2} \sin(180° - \theta_1) \right|^{\frac{3}{2}} + \left| \frac{h_1}{2} \cos(180° - \theta_1) \right|^{\frac{3}{3}} \right)^{\frac{2}{3}} > 0 \tag{227}$$

$$y_1 - \left( \left| \frac{w_1}{2} \sin(270° - \theta_1) \right|^{\frac{3}{2}} + \left| \frac{h_1}{2} \cos(270° - \theta_1) \right|^{\frac{3}{3}} \right)^{\frac{2}{3}} > 0 \tag{228}$$

$$w - x_1 - \left( \left| \frac{w_1}{2} \sin(0° - \theta_1) \right|^{\frac{3}{2}} + \left| \frac{h_1}{2} \cos(0° - \theta_1) \right|^{\frac{3}{3}} \right)^{\frac{2}{3}} > 0 \tag{229}$$

$$h - y_1 - \left( \left| \frac{w_1}{2} \sin(90° - \theta_1) \right|^{\frac{3}{2}} + \left| \frac{h_1}{2} \cos(90° - \theta_1) \right|^{\frac{3}{3}} \right)^{\frac{2}{3}} > 0 \tag{230}$$

In a similar fashion the following four analytical constraint functions can be constructed to enforce the containment of BD2 inside of S $$x_2 - \left( \left| \frac{w_2}{2} \sin(180° - \theta_2) \right|^{\frac{3}{2}} + \left| \frac{h_2}{2} \cos(180° - \theta_2) \right|^{\frac{3}{3}} \right)^{\frac{2}{3}} > 0 \tag{231}$$

$$y_2 - \left( \left| \frac{w_2}{2} \sin(270° - \theta_2) \right|^{\frac{3}{2}} + \left| \frac{h_2}{2} \cos(270° - \theta_2) \right|^{\frac{3}{3}} \right)^{\frac{2}{3}} > 0 \tag{232}$$

$$w - x_2 - \left( \left| \frac{w_2}{2} \sin(0° - \theta_2) \right|^{\frac{3}{2}} + \left| \frac{h_2}{2} \cos(0° - \theta_2) \right|^{\frac{3}{3}} \right)^{\frac{2}{3}} > 0 \tag{233}$$

$$h - y_2 - \left( \left| \frac{w_2}{2} \sin(90° - \theta_2) \right|^{\frac{3}{2}} + \left| \frac{h_2}{2} \cos(90° - \theta_2) \right|^{\frac{3}{3}} \right)^{\frac{2}{3}} > 0 \tag{234}$$

To determine an analytical representation of the constraints to contain BD1 and BD2 inside of B we could break B into four overlapping planar half spaces. However, since B and S share a common lower left corner two of these half spaces would duplicate the half spaces $S_1$ and $S_2$ and thus we only need generate the remaining two. One is a vertical half space, $B_3$, and the other a horizontal half space, $B_4$. The origin of $B_3$ is $[x_3, 0]^T$ and the origin of $B_4$ is $[0, y_3]^T$. Using the same approach that was used to construct the constraint functions of Equations (229) and (230) we can construct a pair of constraint functions which enforce the requirement that BD1 be to the left of $B_3$ and below $B_4$ $$x_3 - x_1 - \left( \left| \frac{w_1}{2} \sin(0° - \theta_1) \right|^{\frac{3}{2}} + \left| \frac{h_1}{2} \cos(0° - \theta_1) \right|^{\frac{3}{3}} \right)^{\frac{2}{3}} > 0 \tag{235}$$

$$y_3 - y_1 - \left( \left| \frac{w_1}{2} \sin(90° - \theta_1) \right|^{\frac{3}{2}} + \left| \frac{h_1}{2} \cos(90° - \theta_1) \right|^{\frac{3}{3}} \right)^{\frac{2}{3}} > 0 \tag{236}$$

Similarly, using the same approach that was used to construct the constraint functions of Equations (233) and (234) we can construct a pair of constraint functions which enforce the requirement that BD2 be to the left of $B_3$ and below $B_4$ $$x_3 - x_2 - \left( \left| \frac{w_2}{2} \sin(0° - \theta_2) \right|^{\frac{3}{2}} + \left| \frac{h_2}{2} \cos(0° - \theta_2) \right|^{\frac{3}{3}} \right)^{\frac{2}{3}} > 0 \tag{237}$$

$$y_3 - y_2 - \left( \left| \frac{w_2}{2} \sin(90° - \theta_2) \right|^{\frac{3}{2}} + \left| \frac{h_2}{2} \cos(90° - \theta_2) \right|^{\frac{3}{3}} \right)^{\frac{2}{3}} > 0 \tag{238}$$

In step 120, the following optimization problem would be formed:

$$\min_{x_1, x_2, x_3, y_1, y_2, y_3, \theta_1, \theta_2} (x_3 + y_3) \tag{239}$$

Subject to Equations (227) through (238) where the constraint function of Equation (214) is computed using Procedure 3.

In step 130 the initial values for optimization variables can be selected as:

$$\begin{bmatrix} x_1 \\ y_1 \\ \theta_1 \end{bmatrix} = \begin{bmatrix} 0 \\ 0 \\ 0 \end{bmatrix}, \begin{bmatrix} x_1 \\ y_1 \\ \theta_1 \end{bmatrix} = \begin{bmatrix} w \\ h \\ 0 \end{bmatrix}, \begin{bmatrix} x_3 \\ y_3 \end{bmatrix} = \begin{bmatrix} w \\ h \end{bmatrix} \tag{240}$$

Using these initial values of the optimization variables as a starting point, Step 140 could solve the optimization problem of Equations (239) using, for example, the LANCELOT optimization software package. One skilled in the art will appreciate that there are many other analytical optimization methods that could be used to solve the optimization problem of Equation (239). These include general purpose analytical optimization software packages as well as dedicated analytical optimization software which may be designed specifically to solve Equation (239).

Other embodiments of the present invention will be apparent to those skilled in the art after considering this disclosure or practicing the disclosed invention. The specification and examples above are exemplary only, with the true scope of the present invention being determined by the following claims.

I claim the following invention:

1. A method to manufacture one or more articles of manufacture that searches for an arrangement of shapes that satisfy exact or approximate analytical representations of boundary distance constraints using the execution of the following steps comprising:
    (a) constructing functions for one or more boundary distance constraints where said functions are exact or approximate analytical representations of said constraints using one or more gradient shaping transformations and the following:
        (1) alone or more external boundary surface of closest approach functions where at least one of the external boundary surfaces of closest approach is a non-n-sphere and each external boundary surface of closest approach is formed from two shapes and, optionally, additional boundary distance constraints between the shapes and is determined using the addition of two or three functions where one of the three functions represents the first shape and another function represents the second shape and, optionally, a third function represents the additional boundary distance constraints between the shapes,
        (2) one or more analytical compositions, and
        (3) one or more superellipsoid shape function approximations for the interior or exterior boundary surface of closest approach between a pair of axis aligned orthotopes with axis-aligned orthotopic boundary distance constraints;
    (b) constructing an analytical optimization problem which incorporates said constraint functions of step (a) and which is an exact or approximate representation of a boundary distance constrained arrangement problem;
    (c) selecting the initial values of one or more optimization variables;
    (d) solving the optimization problem constructed in step (b) using one or more analytical optimization methods and one or more of the initial values of step (c).

2. The claim according to claim 1 wherein said steps are executed two or more times where said steps (a), (b), (c) and (d) may use any information generated in or used by previous said executions of said steps (a) through (d).

3. The claim according to claim 2 wherein for one or more of said executions of said step (b) constructs different said optimization problems for at least two of said executions.

4. A non-transitory program storage device readable by a computing device that tangibly embodies a program of instructions executable by the computing device to perform a method to manufacture one or more articles of manufacture that searches for an arrangement of shapes that satisfy exact or approximate analytical representations of boundary distance constraints using the execution of the following steps comprising:
    (a) constructing functions for one or more boundary distance constraints where said functions are exact or approximate analytical representations of said constraints using one or more gradient shaping transformations and the following:
        (1) one or more external boundary surface of closest approach functions where at least one of the external boundary surfaces of closest approach is a non-n-sphere and each external boundary surface of closest approach is formed from two shapes and, optionally, additional boundary distance constraints between the shapes and is determined using the addition of two or three functions where one of the three functions represents the first shape and another function represents the second shape and, optionally, a third function represents the additional boundary distance constraints between the shapes,
        (2) one or more analytical compositions, and
        (3) one or more superellipsoid shape function approximations for the interior or exterior boundary surface of closest approach between a pair of axis aligned orthotopes with axis-aligned orthotopic boundary distance constraints;
    (b) constructing an analytical optimization problem which incorporates said constraint functions of step (a) and which is an exact or approximate representation of a boundary distance constrained arrangement problem;
    (c) selecting the initial values of one or more optimization variables;
    (d) solving the optimization problem constructed in step (b) using one or more analytical optimization methods and one or more of the initial values of step (c).

5. The claim according to claim 4 wherein said steps are executed two or more times where said steps (a), (b), (c) and (d) may use any information generated in or used by previous said executions of said steps (a) through (d).

6. The claim according to claim 5 wherein for one or more of said executions of said step (b) constructs different said optimization problems for at least two of said executions.

* * * * *

UNITED STATES PATENT AND TRADEMARK OFFICE
CERTIFICATE OF CORRECTION

| | |
|---|---|
| PATENT NO. | : 8,521,486 B2 |
| APPLICATION NO. | : 12/844585 |
| DATED | : August 27, 2013 |
| INVENTOR(S) | : Paul B. Morton |

It is certified that error appears in the above-identified patent and that said Letters Patent is hereby corrected as shown below:

In the Specifications

In column 5, line 50, delete "FIG." and insert -- FIGS. --, therefor.

In column 5, line 61, delete "FIG." and insert -- FIGS. --, therefor.

In column 6, line 1, delete "FIG." and insert -- FIGS. --, therefor.

In column 6, line 4, delete "FIG." and insert -- FIGS. --, therefor.

In column 6, line 7, delete "FIG." and insert -- FIGS. --, therefor.

In column 6, line 11, delete "FIG." and insert -- FIGS. --, therefor.

In column 6, line 13, delete "FIG." and insert -- FIGS. --, therefor.

In column 6, line 17, delete "FIG." and insert -- FIGS. --, therefor.

In column 9, line 37, delete "$\vec{\Theta} = [\Theta_1]^T \cdot$" and insert -- $\vec{\theta} = [\theta_1]^T \cdot$ --, therefor.

In column 9, line 44, delete "$\vec{P} \cdot$" and insert -- $\vec{P} \cdot$ --, therefor.

In column 9, line 45, delete "$S(\Theta)$" and insert -- $S(\theta)$ --, therefor.

In column 9, line 46, delete "$S(\Theta)$" and insert -- $S(\theta)$ --, therefor.

Signed and Sealed this
Thirteenth Day of May, 2014

Michelle K. Lee
*Deputy Director of the United States Patent and Trademark Office*

CERTIFICATE OF CORRECTION (continued)
U.S. Pat. No. 8,521,486 B2

In column 9, line 52, delete "$S(\Theta)=1.$" and insert --$S(\Theta) = 1.$--, therefor.

In column 10, line 3, delete "$\mathcal{T}^{-1}(\mathcal{T}(S(\vec{\theta})),Origin(S)) \to S$" and insert --$\mathcal{T}^{-1}\left(\mathcal{T}(S(\vec{\theta})), Origin(S)\right) \to S$--, therefor.

In column 10, line 14, delete "$\mathcal{T}(S,\alpha) \to S(\vec{\theta}+\vec{\alpha})$" and insert --$\mathcal{T}(S,\alpha) \to S(\vec{\theta}+\vec{\alpha})$--, therefor.

In column 19, lines 54-55, delete "$Q_{\vec{\theta}}(\vec{X},\vec{0})=\vec{K}_{\vec{\theta}}{}^T\vec{X}+K\vec{K}_{\vec{\theta}}{}^T\vec{X}=1 \forall \vec{X} \in Exterior(PHS1)$" and insert --$Q_{\vec{\theta}}(\vec{X},\vec{0})=\vec{K}_{\vec{\theta}}{}^T\vec{X}+K_{\vec{\theta}} > 1 \forall \vec{X} \in Exterior(PHS1)$--, therefor.

In column 19, lines 57-58, delete "$Q_{\vec{\theta}}(\vec{X},\vec{0})=\vec{K}_{\vec{\theta}}{}^T\vec{X}+K\vec{K}_{\vec{\theta}}{}^T\vec{X}=-1 \forall \vec{X} \in Boundary(PHS2)$" and insert --$Q_{\vec{\theta}}(\vec{X},\vec{0})=\vec{K}_{\vec{\theta}}{}^T\vec{X}+K_{\vec{\theta}} = -1 \forall \vec{X} \in Boundary(PHS2)$--, therefor.

In column 19, lines 60-61, delete "$Q_{\vec{\theta}}(\vec{X},\vec{0})=\vec{K}_{\vec{\theta}}{}^T\vec{X}+K\vec{K}_{\vec{\theta}}{}^T\vec{X}<-1 \forall \vec{X} \in Exterior(PHS2)$" and insert --$Q_{\vec{\theta}}(\vec{X},\vec{0})=\vec{K}_{\vec{\theta}}{}^T\vec{X}+K_{\vec{\theta}} < -1 \forall \vec{X} \in Exterior(PHS2)$--, therefor.

In column 19, lines 62-63, delete "$-1 < Q_{\vec{\theta}}(\vec{X},\vec{0})=\vec{K}_{\vec{\theta}}{}^T\vec{X}+\vec{K}_{\vec{\theta}}{}^T\vec{X}<1 \forall \vec{X} \in (Interior(PHS1) \cap Interior(PHS2))$" and insert --$-1 < Q_{\vec{\theta}}(\vec{X},\vec{0})=\vec{K}_{\vec{\theta}}{}^T\vec{X}+K_{\vec{\theta}}<1$ $\forall \vec{X} \in (Interior(PHS1) \cap Interior(PHS2))$--, therefor.

In column 20, line 19, delete "PHS2θ" and insert -- PHS2; θ --, therefor.

In column 23, line 32, delete "⊙" and insert -- ø --, therefor.

In column 24, line 13, delete "⊕" and insert -- ⊖ --, therefor.

In column 24, line 30, delete "$\in(\vec{\theta})$," and insert --$\mathcal{EB}(\vec{\theta})$--, therefor.

CERTIFICATE OF CORRECTION (continued)
U.S. Pat. No. 8,521,486 B2

In column 24, line 32, delete "$\epsilon(\vec{\theta})$" and insert -- $\mathcal{EB}(\vec{\theta})$ --, therefor.

In column 25, line 50, delete "$S(\theta)=1$," and insert -- $\mathcal{S}(\theta) = 1$, --, therefor.

In column 30, line 7, delete "$\mathbb{S}_{gs}(\vec{X}, \vec{O}) = k \mathbb{S}_{gs}(\vec{X}, \vec{O}) + k_1$" and insert -- $\mathbb{S}_{gs}(\vec{X},\vec{O}) = k\mathbb{S}(\vec{X},\vec{O}) + k_1$ --, therefor.

In column 30, line 15, delete "$\mathbb{S}_{gs}(\vec{X}, \vec{O}) = k \mathbb{S}_{gs}(\vec{X}, \vec{O})^{k_1} + k_2$" and insert -- $\mathbb{S}_{gs}(\vec{X},\vec{O}) = k\mathbb{S}(\vec{X},\vec{O})^{k_1} + k_2$ --, therefor.

In column 30, line 46, delete "$\mathbb{S}_{gs}(\vec{X}, \vec{O}) = k \log(\mathbb{S}_{gs}(\vec{X}, \vec{O})) + k_1$" and insert -- $\mathbb{S}_{gs}(\vec{X},\vec{O}) = k\log\left(\mathbb{S}(\vec{X},\vec{O})\right) + k_1$ --, therefor.

In column 37, line 6, delete "$C1_D(\theta) = \oplus 1(\theta) \oplus \mathcal{D}_{C1}(\theta)$" and insert -- $C1_D(\theta) = C1(\theta) \oplus \mathcal{D}_{C1}(\theta)$ --, therefor.

In column 37, line 8, delete "$C2_D(\theta) = \oplus 2(\theta) \oplus \mathcal{D}_{C2}(\theta)$" and insert -- $C2_D(\theta) = C2(\theta) \oplus \mathcal{D}_{C2}(\theta)$ --, therefor.

In column 40, lines 1-5, delete "
$$\mathbb{S}\left(\begin{bmatrix}x_1\\y_1\end{bmatrix}, \begin{bmatrix}2\\3.5\end{bmatrix}\right) = \lim_{Z\to\infty}\left(Q_{0^\circ}\left(\begin{bmatrix}x_1\\y_1\end{bmatrix}, \begin{bmatrix}2\\3.5\end{bmatrix}\right)^Z + Q_{90^\circ}\left(\begin{bmatrix}x_1\\y_1\end{bmatrix}, \begin{bmatrix}2\\3.5\end{bmatrix}\right)^Z\right)^{(139)}$$

$$\lim_{Z\to\infty}\left(\left|\frac{2(x_1-2)}{3}\right|^Z + \left|\frac{2(y_1-3.5)}{5}\right|^Z\right)$$
" and insert --
$$\mathbb{S}\left(\begin{bmatrix}x_1\\y_1\end{bmatrix}, \begin{bmatrix}2\\3.5\end{bmatrix}\right) = \lim_{Z\to\infty}\left(Q_{0^\circ}\left(\begin{bmatrix}x_1\\y_1\end{bmatrix}, \begin{bmatrix}2\\3.5\end{bmatrix}\right)^Z + Q_{90^\circ}\left(\begin{bmatrix}x_1\\y_1\end{bmatrix}, \begin{bmatrix}2\\3.5\end{bmatrix}\right)^Z\right)$$

$$= \lim_{Z\to\infty}\left(\left|\frac{2(x_1-2)}{3}\right|^Z + \left|\frac{2(y_1-3.5)}{5}\right|^Z\right)$$
--, therefor.

In the Claims

In column 53, line 25, in claim 1, delete "$C2_D(\theta) = \oplus 2(\theta) \oplus D_{C2}(\theta)$" and insert --$C2_D(\theta) = C2(\theta) \oplus D_{C2}(\theta)$--, therefor.